US010911065B2

(12) United States Patent
Karaca

(10) Patent No.: US 10,911,065 B2
(45) Date of Patent: Feb. 2, 2021

(54) COMPUTER SYSTEM AND METHOD INCLUDING SELECTIVELY COMPRESSING DATA FILES AND DIRECTORIES BASED ON AN OPERATOR INDICATION AND REPRESENTING THE AMOUNT OF AVAILABLE FREE SPACE

(71) Applicant: Sinan Karaca, Honolulu, HI (US)

(72) Inventor: Sinan Karaca, Honolulu, HI (US)

( * ) Notice: Subject to any disclaimer, the term of this patent is extended or adjusted under 35 U.S.C. 154(b) by 147 days.

(21) Appl. No.: 15/270,182

(22) Filed: Sep. 20, 2016

(65) Prior Publication Data

US 2017/0109057 A1    Apr. 20, 2017

Related U.S. Application Data

(60) Provisional application No. 62/243,764, filed on Oct. 20, 2015.

(51) Int. Cl.
*G06F 3/06*    (2006.01)
*G06F 12/02*   (2006.01)
(Continued)

(52) U.S. Cl.
CPC ........ *H03M 7/6017* (2013.01); *G06F 3/0608* (2013.01); *G06F 3/0631* (2013.01);
(Continued)

(58) Field of Classification Search
CPC .... G06F 3/0608; G06F 3/0613; G06F 3/0631; G06F 3/0641; G06F 3/068; G06F 9/4401;
(Continued)

(56) References Cited

U.S. PATENT DOCUMENTS 4,558,302 A  *  12/1985  Welch ................ H03M 7/3088
                                                            341/51
6,879,988 B2 *  4/2005  Basin ................ G06F 17/30153
(Continued)

*Primary Examiner* — Tuan V Thai
(74) *Attorney, Agent, or Firm* — Ohlandt, Greeley, Ruggiero & Perle, L.L.P.

(57) ABSTRACT

A method of compressing data in a mass storage medium of a computer system running an operating system (OS), such as Windows®, is disclosed. The computer system comprises a central processing unit (CPU), random access memory (RAM), and a non-transitory mass storage medium. The method includes accepting an operator indication of a desired degree of data compression, selecting a predefined compression method corresponding to the operator indication and the version of the operating system in use, and designating a selected predefined set of files and directories stored on the mass storage medium as uncompressible. The method further includes applying the selected compression method to all files and directories on the mass storage medium that were not designated as uncompressible, and representing the remaining free space on the mass storage medium, which may be displayed to the operator, by projecting or estimating the effects of the selected compression method on further storage of data on the mass storage medium. Files and directories required for booting the system remain uncompressed after compression of data on the mass storage medium. The method may also include temporarily taking ownership of and processing files that cannot be opened successfully due to missing privileges.

26 Claims, 7 Drawing Sheets

(51) Int. Cl.
*H03M 7/30* (2006.01)
*G06F 16/174* (2019.01)
*G06F 16/17* (2019.01)
*G06F 9/4401* (2018.01)

(52) U.S. Cl.
CPC .......... *G06F 3/0641* (2013.01); *G06F 12/023* (2013.01); *G06F 16/1727* (2019.01); *G06F 16/1744* (2019.01); *H03M 7/3091* (2013.01); *G06F 9/4401* (2013.01)

(58) Field of Classification Search
CPC ............... G06F 12/023; G06F 16/1744; G06F 16/1727; H03M 7/6017; H03M 7/3091
See application file for complete search history.

(56) References Cited

U.S. PATENT DOCUMENTS

| | | | |
|---|---|---|---|
| 8,321,386 B1* | 11/2012 | Jobanputra | H03M 7/6058 |
| | | | 707/693 |
| 9,843,802 B1* | 12/2017 | Wallace | H04N 19/10 |
| 2005/0210054 A1* | 9/2005 | Harris | G06F 17/30067 |
| 2007/0208893 A1* | 9/2007 | Azzarello | G06F 16/1744 |
| | | | 710/68 |
| 2011/0167173 A1* | 7/2011 | Bansal | H03M 7/30 |
| | | | 709/247 |
| 2013/0275396 A1* | 10/2013 | Condict | H03M 7/30 |
| | | | 707/693 |

* cited by examiner

COMPUTER SYSTEM AND METHOD INCLUDING SELECTIVELY COMPRESSING DATA FILES AND DIRECTORIES BASED ON AN OPERATOR INDICATION AND REPRESENTING THE AMOUNT OF AVAILABLE FREE SPACE

This application claims priority from U.S. Provisional Application 62/243,764, filed Oct. 20, 2015.

SUMMARY OF THE INVENTION

LZSDC, the system and method of the present invention, builds on top of core Microsoft® Windows® operating system compression services. As used herein, the term "Windows®" refers to the several versions of the Microsoft® Windows® computer operating system, beginning with the XP version, and including all versions released since the XP version, unless otherwise specifically stated.) These core operating system compression services have severe limitations so severe that they are virtually unusable without the use of comprehensive third party tools. These inherent limitations are transcended by the present invention. Additionally, LZSDC layers multiple compression services to maximize available disk space under most usage scenarios, which is again not possible with default Microsoft® implementations. LZSDC also supplies its own disk capacity and disk free space projection driver, which is completely lacking in Windows®. This driver guarantees that files that would ordinarily not fit on disk without compression indeed can fit on disk with compression, which is normally not possible even despite compression because of insufficient free disk space reporting which does not take into account the benefits of transparent disk compression. Finally, LZSDC also accelerates disk read speeds, particularly on slower mechanical (spinning platter) hard disk drives, as well as faster flash memory based solid state disk (SSD) drives, including Serial Advanced Technology Attachment (SATA) 1, SATA 2, SATA 3, and Non-Volatile Memory Express (NVMe) connected drives.

LZSDC supports all modern 32 bit and 64 bit Windows® operating systems, beginning with Windows® XP through Windows® Server 2016.

BACKGROUND OF THE INVENTION

I. Windows® Algorithms and Limitations

Microsoft® Windows® provides compression utilities that implement the Lempel-Ziv-Welch (LZW) compression techniques described in U.S. Pat. No. 4,558,302, with some additional variations. The compression techniques offered by native Microsoft® Windows® operating systems are LZNT1, WIMBoot, and XPRESS-LZX compression. Each compression method has drawbacks that are addressed by the present invention, and these are described below.

i. The LZNT1 Algorithm and Limitations

LZNT1 has been present since Windows® NT 3.51. LZNT1 transparently compresses files as they are read from disk and written back to disk. LZNT1 is a per-file compressor; meaning that each file is separately compressed on-disk. Additionally, LZNT1 can be applied to folders; wherein a folder marked with LZNT1 compression will automatically enable LZNT1 compression on any new folders and files created inside it.

LZNT1's most significant drawback is the weakness of its compression algorithm. Of all of Windows® compression algorithms, LZNT1 offers the least compression. LZNT1's compression is even far inferior to the compression savings afforded by ancient 16-bit Windows® and MS-DOS compression solutions from two decades ago, despite exponential advances in processing power since then.

LZNT1 is additionally unable to compress files above approximately 32 gigabyte (GB) in size. While LZNT1 is able to compress files for read-only access below 32 GB size, for in-place compression during writes to files, the upper limit is approximately 16 GB. The exact GB limit depends on the NTFS volume structure, with the number of file fragments and their allocation on disk potentially decreasing these limits.

The most severe limitation with LZNT1 compression, introduced since the new security model in Windows® Vista, is that neither Windows® command line compact.exe tool, nor Windows® GUI explorer.exe tool is able to compress a majority of the disk. This is due to new security settings applied to a majority of files present on disk preventing file compression, despite such compression being entirely safe.

An additional LZNT1 limitation is that while the NTFS file system is capable of handling simultaneous reads and writes to LZNT1 compressed files, as with the remainder of the file system, Windows® built-in tools do not expose this behavior. Despite modern SSD storage being able to handle an ever increasing amount of simultaneous read and write requests, LZNT1 remains single threaded.

A further limitation in LZNT1 is that an effort to compress a file already compressed by the WIMBoot algorithm (described below) will result in a net loss of disk space. This is explained below in the WIMBoot section as the "space bleed" problem.

One last notable limitation is that Windows® supplied command line or graphical user interface (GUI) tools do not have the ability to filter out certain types of files which are unsafe to be compressed (such as Structured Query Language (SQL) Server databases) from compression.

ii. The WIMBoot Algorithm and Limitations

WIMBoot was been introduced with Windows® 8.1 Update 1 and is also supported (although officially deprecated) in Windows® 10. WIMBoot dramatically improves the compression strength compared to LZNT1, bringing it up to par to the compression that was afforded by ancient 16-bit Windows® and MS-DOS tools.

WIMBoot is also more similar to ancient era (pre-Windows® XP) compression tools in that it creates a single WIM file, an image of the operating system; which is then "mounted" to provide access to all of the files and folders on the system. In other words, the compression is not on a per-file or per-folder basis, but on a per-image basis. All of the compressed files and folders are stored inside this WIM file.

Unlike ancient era compression tools, and unlike LZNT1, a file that is updated inside a WIMBoot image is not automatically recompressed. Instead, it is extracted in uncompressed form back to disk, and then stored as a regular uncompressed file. Similarly, a file that is deleted on disk does not recover any disk space at all, because the deleted file still takes up space in the WIM image file which is not recovered.

This introduces us to the most severe of WIMBoot's limitations, its space bleed problem. A WIMBoot volume requires regular maintenance, or it will "bleed" space very frequently as files are updated and deleted on volume. Soon becoming a cure worse than the disease, WIMBoot's compression gains are rapidly offset by uncompressed copies of files on disk, and the additional space wasted in their old, compressed copies still present in the WIM file.

In fact, this space bleed problem is so severe, that decades-old LZNT1 can even outperform WIMBoot space savings when properly applied to all files and folders on a system: During a test on a 16 GB embedded Multi-Media Card (eMMC) Windows® tablet running Windows® 8.1.1, after installing updates and the free Office 365, the empty space on the tablet is only 2 GB. In contrast, fully uncompressing this original disk and fully recompressing it with LZNT1 compression produces 4 GB free space (when the LZNT1 compression has been applied to all files and folders present on the tablet, and not just a very limited fraction as is normally available with Windows®).

There are many additional significant WIMBoot limitations:

WIMBoot cannot compress files larger than 4 GB, even if LZNT1 could compress them; however these files will still take up space in the Windows® Imaging Format (WIM) image.

WIMBoot is not supported by Microsoft® on non-SSD, 32-bit, and Basic Input/Output System (BIOS) systems.

WIMBoot cannot be used as part of a live Windows® operating system. In fact, WIMBoot can only be used as part of a first-time Windows® installation; substantially exacerbating its space bleed problem.

An existing WIMBoot system cannot be uncompressed.

An existing WIMBoot system cannot be recompressed.

There is only one level of compression available with WIMBoot.

A 3 GB Windows® Assessment and Deployment Kit (ADK) download is necessary to obtain the necessary Microsoft® tools to prepare a WIMBoot image and apply it to a Personal Computer (PC). Additionally, an external Universal Serial Bus (USB) boot disk must be created using Windows® Preinstallation Environment (PE). If the target PC has any custom disk access drivers such as Redundant Array of Independent Disks (RAID) or Serial Advanced Technology Attachment (SATA) controllers, these must also be manually injected into both Windows® PE and the target WIMBoot system.

It is also not possible to exclude any folders from processing, to keep them out from the WIM image, for any reason.

WIMBoot is not supported on Windows® 7.

iii. The XPRESS-LZX Algorithms and Limitations

Windows® 10 introduces several new algorithms—XPRESS4 KB, XPRESS8 KB, XPRESS16 KB, and LZX (in order of increasing compression), to compress files with space savings almost as efficiently as WIMBoot. Similar to LZNT1, and unlike WIMBoot, these algorithms are applied on a per-file basis.

Unlike LZNT1, files that are modified are immediately decompressed, similar to WIMBoot. However, this does not cause a very significant space bleed problem, because there is no storage waste induced from such files inside a WIM image file or similar—even though the benefit of compression is still lost.

Unlike LZNT1, compression cannot be applied to folders. Compression is on a per-file basis only. Even if a folder is completely Windows® 10 compressed, any new files and folders created inside of it will need to be manually recompressed.

Similar to LZNT1, any compression through the compact.exe command line tool (no GUI tooling is provided by Microsoft®) is single-threaded, which is unreasonably inefficient on SSD or other fast storage media.

It is not possible to downgrade the compression grade applied to a file without explicitly decompressing that file.

Similar to LZNT1, an effort to compress a WIMBoot compressed file will again result in the WIMBoot space bleed problem.

Similar to LZNT1, file types which are not safe to compress cannot be excluded from processing.

Unlike LZNT1, because files that are modified during a disk access process are written back to disk in uncompressed form, disk space is lost. There is no method provided with the operating system to automatically recompress such files in the background, while the PC is idle, to regain disk space.

iv. The Data Deduplication Algorithm and Limitations

Windows® Server 2012 introduces data deduplication for data disks. Data deduplication is applied on a per-disk basis.

Data deduplication requires periodic cleanup runs, because data that is deleted, if included in a past compression operation, is not automatically recovered similar to how WIMBoot works. If a data deduplicated disk has less than 1 GB free space, no data deduplication operation succeeds on disk.

Data deduplication is only supported for data disks. It is not supported for operating system boot disks.

A GUI interface is not available to handle data deduplication operations.

SUMMARY OF THE INVENTION

The present invention is a collection of methods for compressing information stored on a mass storage medium in a computer system comprising at least a CPU, RAM, and at least one non-transitory mass storage medium, and running a Windows® operating system (OS). There are four variants of the invention, denominated as LZS80, LZS85, LZS90, and LZS100. The present invention overcomes the limitations of the compression offered in Windows®, and permits larger amounts of data to be stored on mass storage media in a manner that is faster, more convenient, and more efficient than is able to be achieved in the prior art.

DETAILED DESCRIPTION OF THE INVENTION

II. LZSDC: The Present Invention

Figure 1:
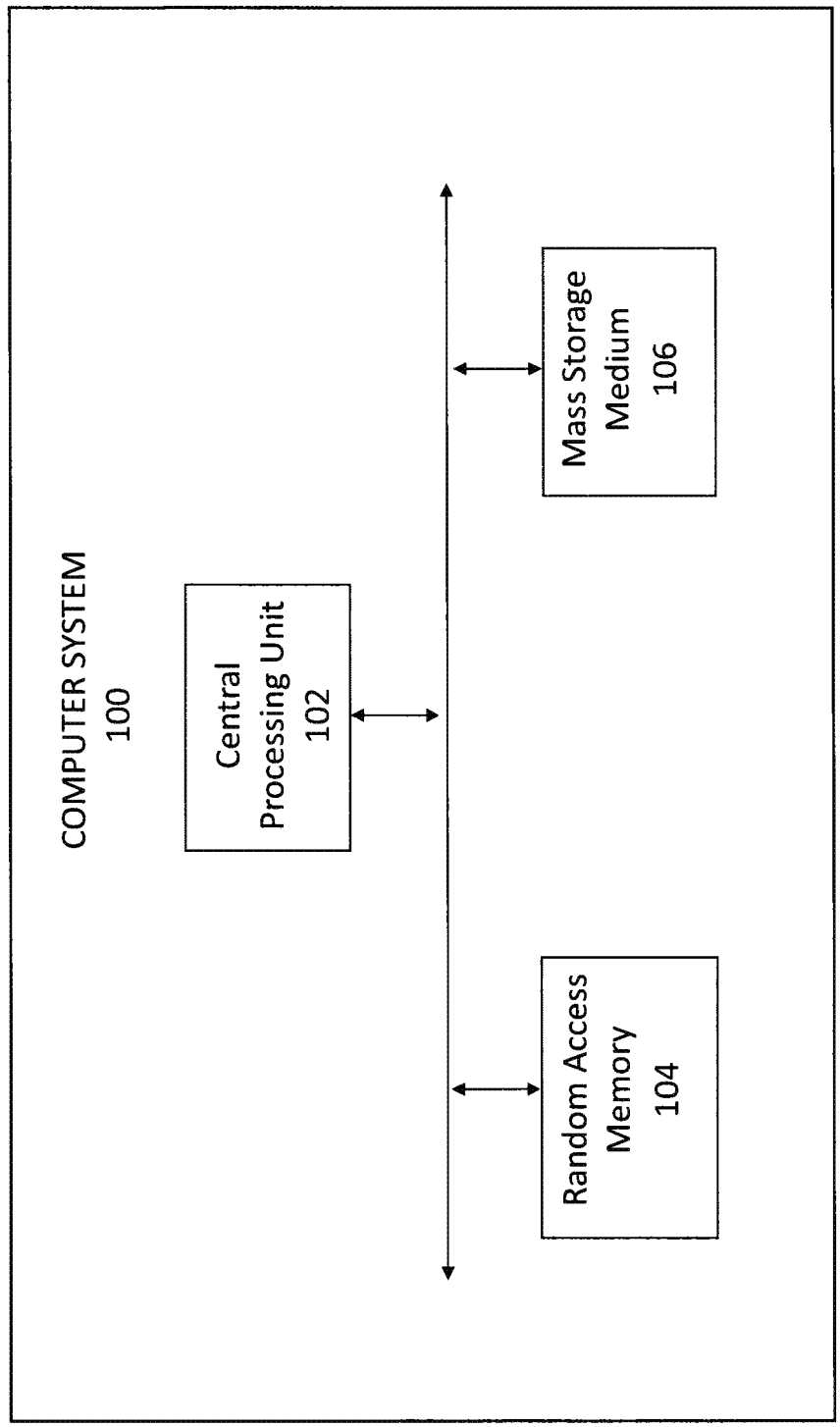
FIG. 1 illustrates a block diagram of an exemplary distributed computer system and networked environment for implementation of the system and method disclosed herein.

The compression techniques offered by LZSDC are LZS80, LZS85, LZS90, and LZS100. FIG. 1 illustrates an exemplary embodiment of a computer system 100, wherein the systems and methods disclosed herein may be implemented using one or more computer systems. As shown, the computer system 100 can include a central processing unit 102, which can control the operation of the computer system 100. The central processing unit 102 may include any type of microprocessor or central processing unit (CPU)), including programmable general-purpose or special-purpose microprocessors and/or any one of a variety of proprietary or commercially available single or multi-purpose systems. The computer system 100 may also include random access memory 104, which can provide temporary storage for code to be executed by the processor(s) 102 or for data acquired from one or more users, storage devices, and/or databases. The random access memory 104 can include one or more varieties of random access memory
(RAM) (e.g., static RAM (SRAM), dynamic RAM (DRAM), or synchronous DRAM (SDRAM)), and/or a combination of random access memory technologies. Additionally, the computer system 100 may possess at least one non-transitory mass storage medium mass storage medium 106. In one embodiment, the computer system 100 runs a Windows® operating system.

Figure 2:
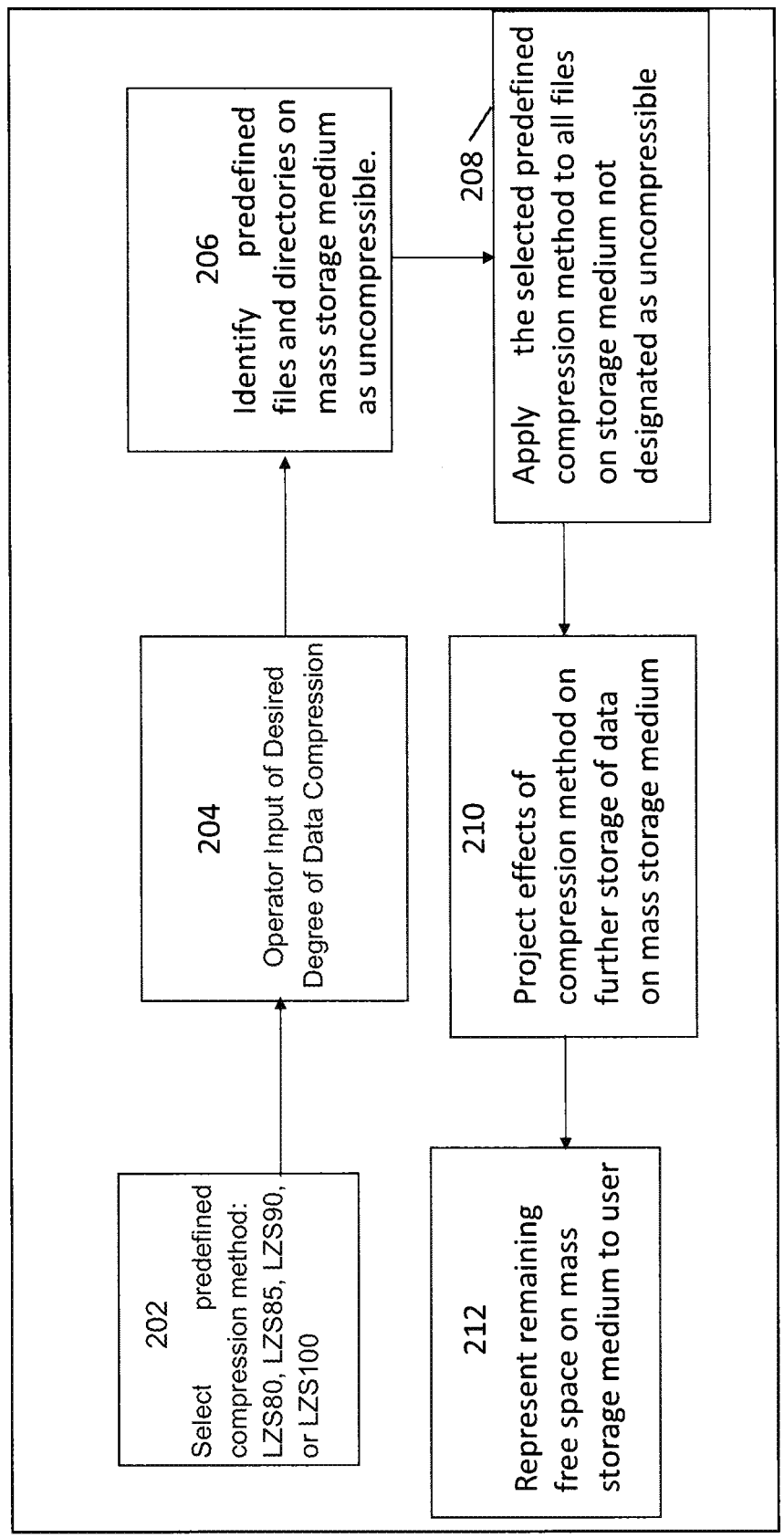
FIG. 2 illustrates a flow diagram of data compression performed by the system disclosed herein.

FIG. 2 illustrates a flow diagram of the method of data compression performed by the computer system 100. Initially at step 202, the computer system 100 selects a predefined compression method selected from the group consisting of: LZS80 300, LZS85 400, LZS90 500 and LZS100 600 (see FIGS. 3-7 respectively). The computer system 100 receives an operator input of the desired degree of data compression at step 204. At step 206, the computer system 100 identifies a list of predefined files and directories on the mass storage medium 106 that are uncompressible. At step 208, the computer system 100 applies the selected predefined compression method to all files on the storage medium 106 that have not been designated as uncompressible. Following application of the specific compression method at step 208, then at step 210, the computer system 100 projects or estimates the effects the compression method will have on the storage of additional data on the mass storage medium 106. Finally, at step 212, the computer system 100 represents a remaining free space on the mass storage medium 106 to the operator of the computer system 100.

i. The LZS80 Algorithm and how it Extends LZNT1

LZS80 runs on Windows® XP through Windows® Server 2016.

Figure 3:
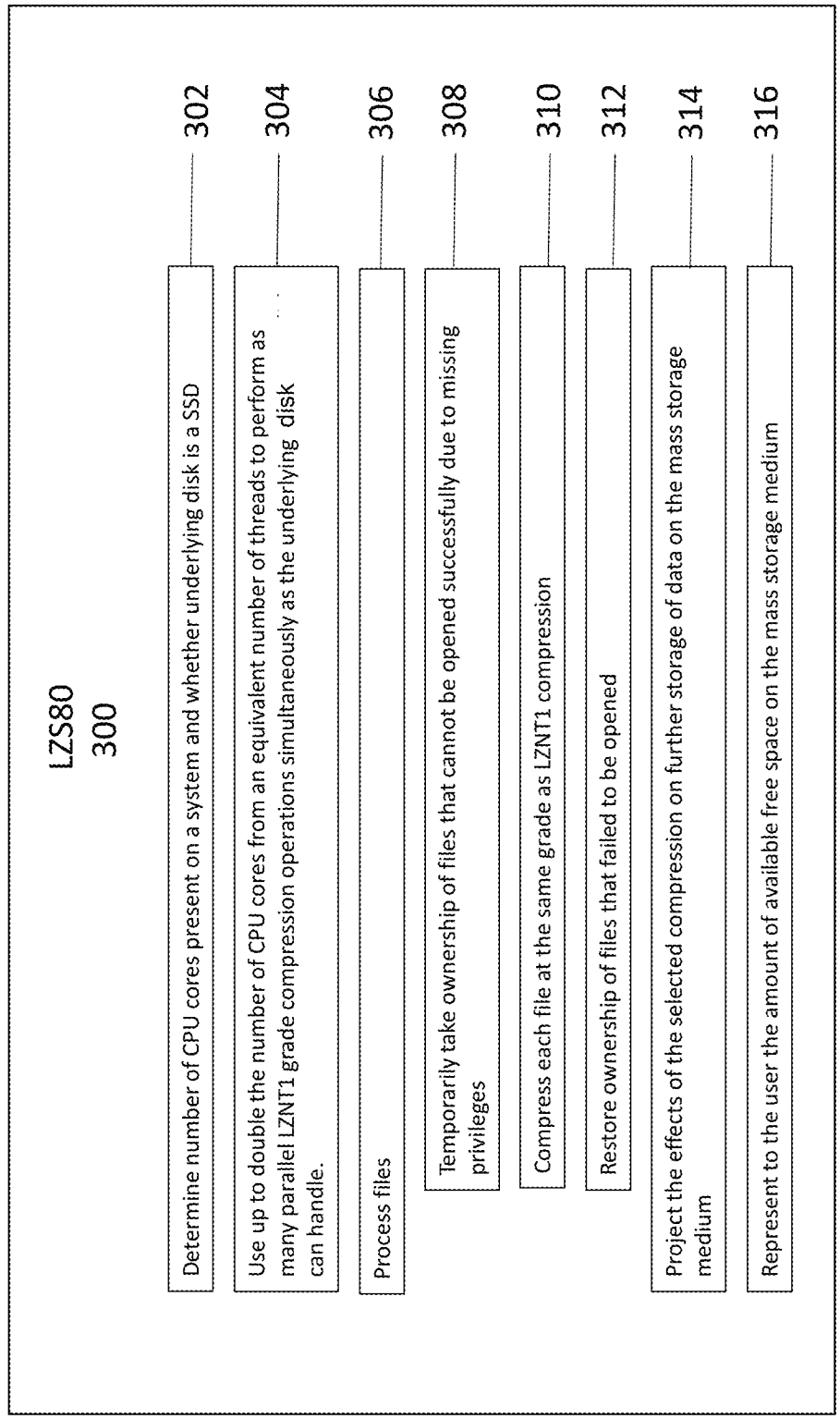
FIG. 3 illustrates a flow diagram of one embodiment of data compression performed by the system disclosed herein when utilizing an operating system from Windows® XP through Windows® Server 2016.

FIG. 3 illustrates a flow diagram of one embodiment of the data compression (LZS80 300) performed by the computer system 100 when utilizing an operating system from Windows® XP through Windows® Server 2016. In one embodiment, the LZS80 300 data compression method determines the number of CPU cores present on a computer system 100 and whether the underlying disk is an SSD. Initially, at step 304, LZS80 300 uses up to double the number of CPU cores from an equivalent number of threads to perform as many parallel LZNT1 grade compression operations simultaneously as the underlying disk can handle. In step 306, LZS80 300 begins processing files, which further comprises the steps of 308, 310, and 312. Step 308 further comprises LZS80 300 temporarily taking ownership of files that cannot be opened successfully due to missing privileges. Step 310 further comprises LZS80 300 compressing each file at the same grade as LZNT1 compression. Step 312 further comprises LZS80 300 restoring ownership of files that failed to be opened in step 308.

LZS80 first reads the number of CPU cores present on a system and whether the underlying disk is an SSD (solid state disk). It then uses up to double the number of CPU cores from as many number of threads to perform as many parallel LZNT1 grade compression operations simultaneously as the underlying SSD can handle.

LZS80 does not compress WIMBoot compressed files. Re-compressing WIMBoot compressed files first extracts them from the WIM image while not recovering space consumed by the extracted files, also compressing substantially worse than WIMBoot compression—wasting double the space on any given file.

LZS80 excludes file patterns from compression, guaranteeing the integrity of, by default, Microsoft® SQL Server database files; as well as any other operator customizable file extension.

LZS80 safely processes files that Windows® cannot by using the following approach:
   LZS80 temporarily takes ownership of files which cannot be opened successfully due to missing privileges.
   LZS80 compresses the file at the same grade as LZNT1 compression.
   LZS80 restores ownership of files that had failed to be opened, preventing the creation of a security loophole.
   LZS80 compresses files up to 32 GB in size.

LZS80 compression is fully reversible, provided sufficient free disk space is available on the target disk to contain all uncompressed data.

LZS80 may optionally skip compressing files not having an archive attribute. LZS80 may optionally clear the archive attribute on files which do not create any free space when compressed. This process shortens the overall disk compression processing time by skipping files that are pre-compressed outside of LZS80. For similar performance acceleration reasons, LZS80 may optionally skip recompressing files when they are already in a compressed state.

In order to ensure that the target operating system remains fully operational after compression, including the processing of critical boot time tasks which may not support LZS80 compression at startup time, as well as the ability to boot into Windows® Recovery Environment successfully after compression, and also including the ability to retain the processing of non-critical tasks such as search indexing (the database files of which must remain uncompressed to ensure data integrity), LZS85 does not compress the following files and folders on BIOS/UEFI based Windows® installations:
   \BOOTNXT
   \NTDETECT.COM
   \NTLDR
   \BOOT.INI
   \BOOTMGR
   \BOOT\*
   \RECOVERY\*
   \PROGRAMDATA\MICROSOFT® \SEARCH\*
   WINLOAD.EXE (may be located at any path, but excluded on BIOS systems only)

ii. The LZS85 Algorithm and how it Extends XPRESS-LZX

Figure 4:
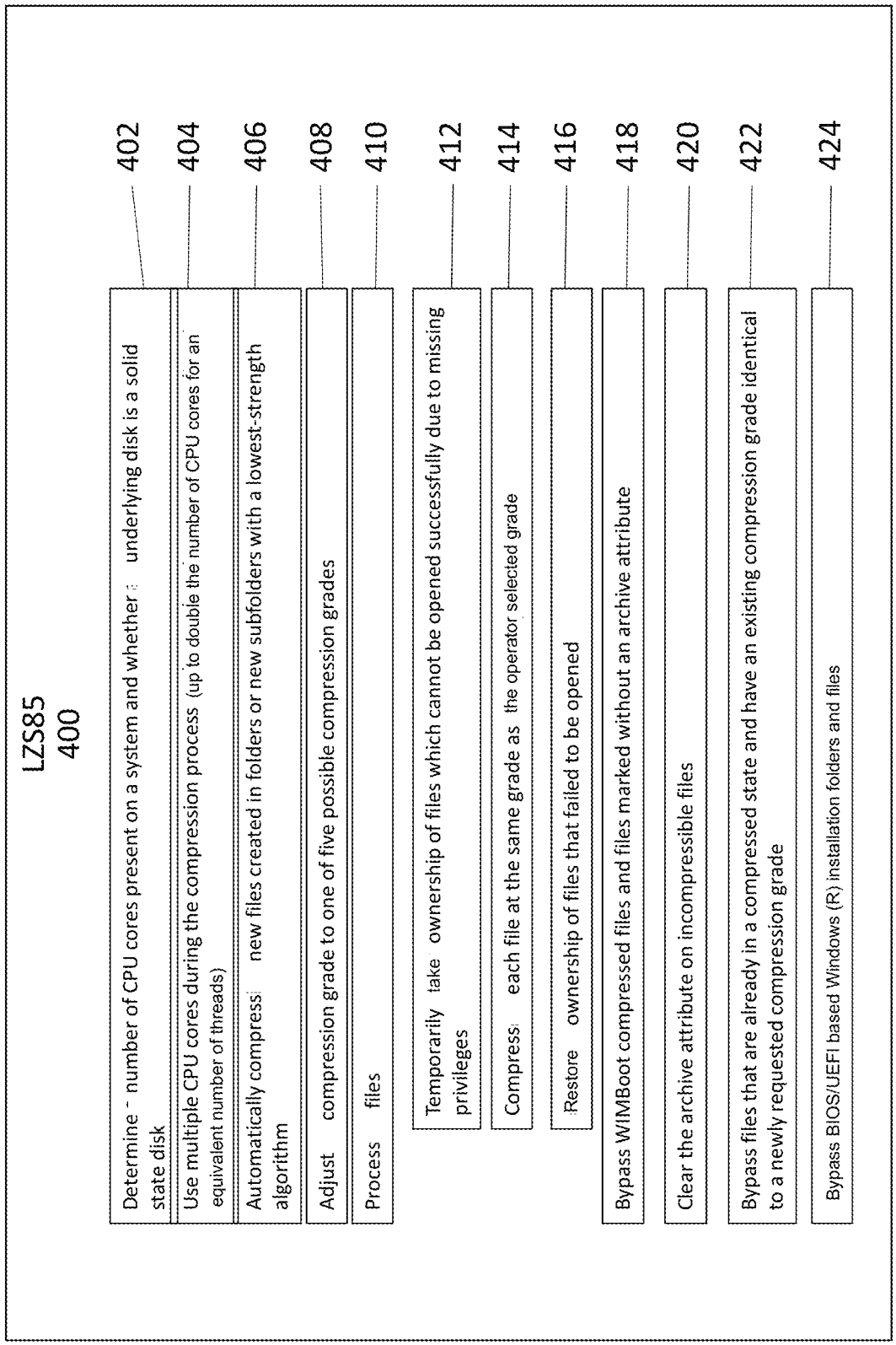
FIG. 4 illustrates a flow diagram of another embodiment of data compression performed by the system disclosed herein when utilizing an operating system from Windows® 7, as well as Windows® 10 through Windows® Server 2016.

LZS85 runs on Windows® 7, as well as Windows® 10 through Windows® Server 2016. FIG. 4 illustrates a flow diagram of another embodiment of the data compression method (LZS85 algorithm 400) performed by the computer system 100. This embodiment may utilized when running an operating system from Windows® 7, as well as Windows® 10 through Windows® Server 2016. In step 402, the LZS85 400 determines a number of CPU cores present on a system and whether an underlying disk is a solid-state disk. In step 404, LZS85 400 uses multiple CPU cores during the compression process (up to double the number of CPU cores for an equivalent number of threads) to detect that the storage medium 106 is a SSD. In step 406, LZS85 400 automatically compresses new files created in folders or new subfolders with a lowest-strength algorithm. In step 408, LZS85 400 adjusts a compression grade to one of five possible compression grades. In step 410, LZS85 400 begins processing files, which further comprises the steps of 412, 414, 416. Step 412 further comprises temporarily taking ownership of files that cannot be opened successfully due to missing privileges. Step 414 further comprises compressing each file at the same grade as the operator selected grade. In step 418, LZS85 bypasses WIMBoot compressed files and files not having an archive attribute. In step 420, LZS85 clears the archive attribute on incompressible files. In step 422, LZS85 bypasses files that are already in a compressed state and have an existing compression grade identical to a newly requested compression grade. In step 424, LZS85 bypasses BIOS/UEFI based Windows® installation folders and files.

LZS85 implements compression equivalent to that of LZNT1, XPRESS4 KB, XPRESS8K, XPRESS16 KB and LZX in space savings. Like LZS80, it uses multiple CPU cores during the compression process when it detects that the mass storage medium is an SSD. For LZNT1-like compression, threads numbering [[in the]] double the numbers of available CPU cores are used. For an XPRESS-like compression, all CPU cores are used uniformly by each thread. For LZX-like compression, the XPRESS factor is further multiplied by two thirds to determine the optimal core usage count.

LZS85 ensures that new files created in folders or new subfolders are automatically compressed using its lowest strength algorithm.

LZS85 supports five compression grades and can move in any direction among those grades, and is thus capable of increasing and decreasing the compression grade of any particular file.

LZS85 excludes file patterns from compression, guaranteeing the integrity of, by default, Microsoft® SQL Server database files; as well as any other operator customizable file extension.

LZS85 compression is fully reversible, provided sufficient free disk space is available on the target disk to contain all uncompressed data.

LZS85 safely processes files that Windows® cannot by using the following approach:
  LZS85 temporarily takes ownership of files which cannot be opened successfully due to missing privileges.
  LZS85 compresses the file at the same grade as LZNT1 compression.
  LZS85 restores ownership of files that had failed to be opened, preventing the creation of a security loophole.
  LZS85 does not compress WIMBoot compressed files. Re-compressing WIMBoot compressed files first extracts them from the WIM image while not recovering space consumed by the extracted files, also compressing substantially worse than WIMBoot compression—wasting double the space on any given file.

LZS85 may optionally skip compressing files not having an archive attribute. LZS85 may optionally clear the archive attribute on uncompressible files. This process ensures that while processing a disk, files that could not be previously compressed (due to lack of redundancy) would not be attempted for re-compression; shortening the overall disk compression processing time. For similar performance acceleration reasons, LZS85 may optionally skip recompressing files when they are already in a compressed state, and their existing compression grade is identical to (not greater than or less than) the newly requested compression grade.

LZS85 offers a background agent which detects modifications made to files by the system, applications, and users. While the lowest of the five compression grades supported by LZS85 automatically re-compresses files as they are modified on disk, the higher four compression grades write files back to disk in uncompressed form any time a file modification has been made. The LZS85 background agent detects when the PC is idle, as well as detecting which files within the category of the four higher compression grades have been modified, and thus reverted to an uncompressed state. The LZS85 background agent then recompresses these files when the PC is idle, to minimize interruption to the operator's ongoing work on the PC. It is also possible, at the operator's choosing, to schedule automatic recompression to happen immediately upon file modifications (instant recompression upon decompression), as well as scheduling automatic recompression to happen not when the PC is idle, but only when a pre-set number of days have elapsed since the files have last been modified.

Windows® 7 support for LZS85 is enabled automatically after a Windows® 7 operating system has been first compressed using LZS90 compression.

In order to ensure that the target operating system remains fully operational after compression, including the processing of critical boot time tasks which may not support LZS85 compression at startup time, as well as the ability to boot into Windows® Recovery Environment successfully after compression, and also including the ability to retain the processing of non-critical tasks such as search indexing (the database files of which must remain uncompressed to ensure data integrity), LZS85 does not compress the following files and folders on BIOS/UEFI based Windows® installations:
  \BOOTNXT
  \NTDETECT.COM
  \NTLDR
  \BOOT.INI
  \BOOTMGR
  \BOOT\*
  \RECOVERY\*
  \PROGRAMDATA\MICROSOFT® \SEARCH\*
  WINLOAD.EXE (may be located at any path, but excluded on BIOS/UEFI systems only)
  For Windows® 7 operating systems, regardless of the (U)EFI/BIOS state of the host PC, the same file exclusion list for LZS90 compression (enumerated below) is applicable (in addition to the list of files above).
  iii. The LZS90 Algorithm and how it Extends WIMBoot
  LZS90 runs on a live Windows® operating system. This includes, at the present time, Versions Windows® 7, Windows® 8.1 with Update 1, Windows® 10, Windows® Server 2012 R2 with Update 1, and Windows® Server 2016.

Figure 5:
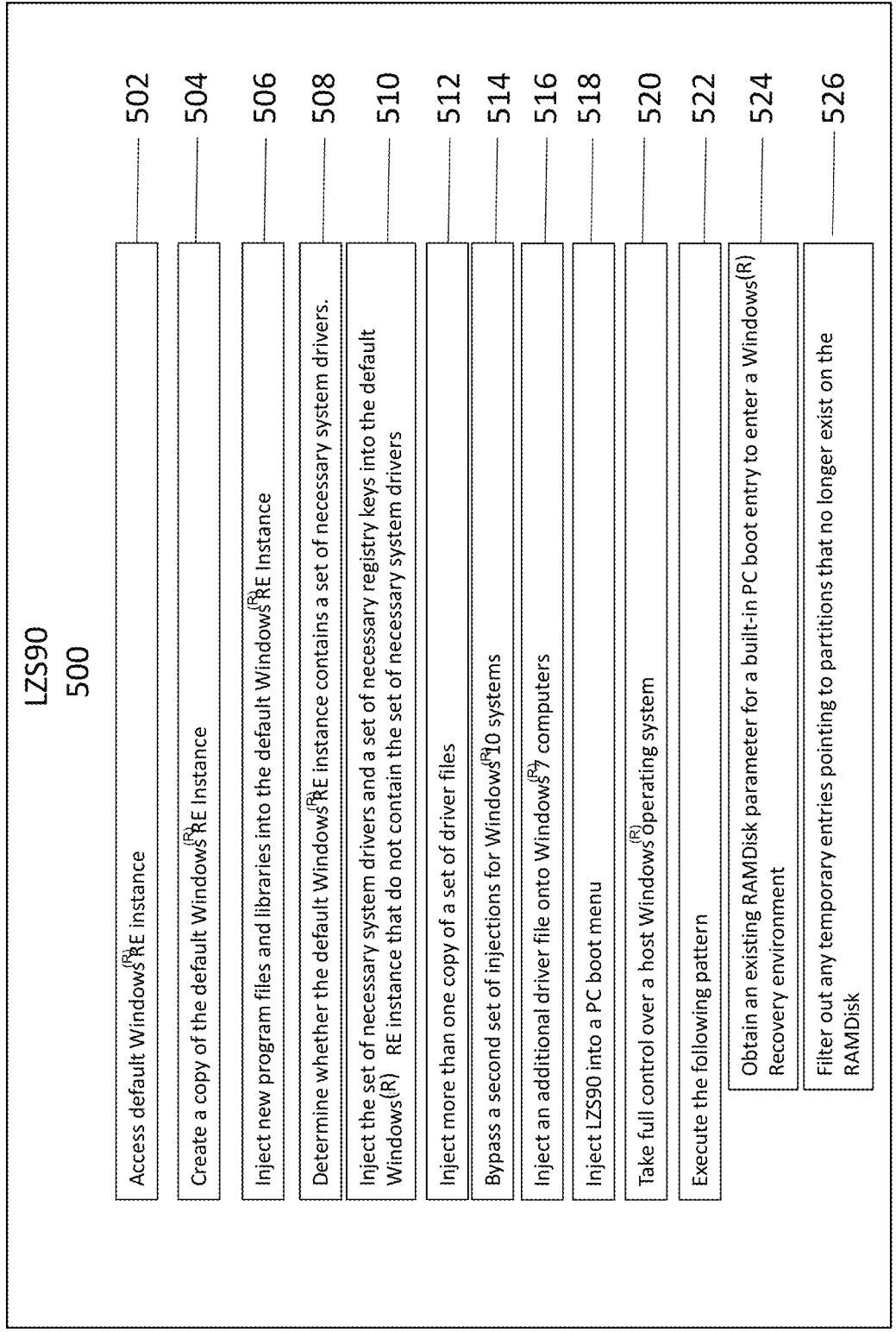
FIGS. 5-6 illustrates flow diagram of other embodiments of data compression performed by the system disclosed herein when utilizing a live Windows® operating system.
Figure 6:
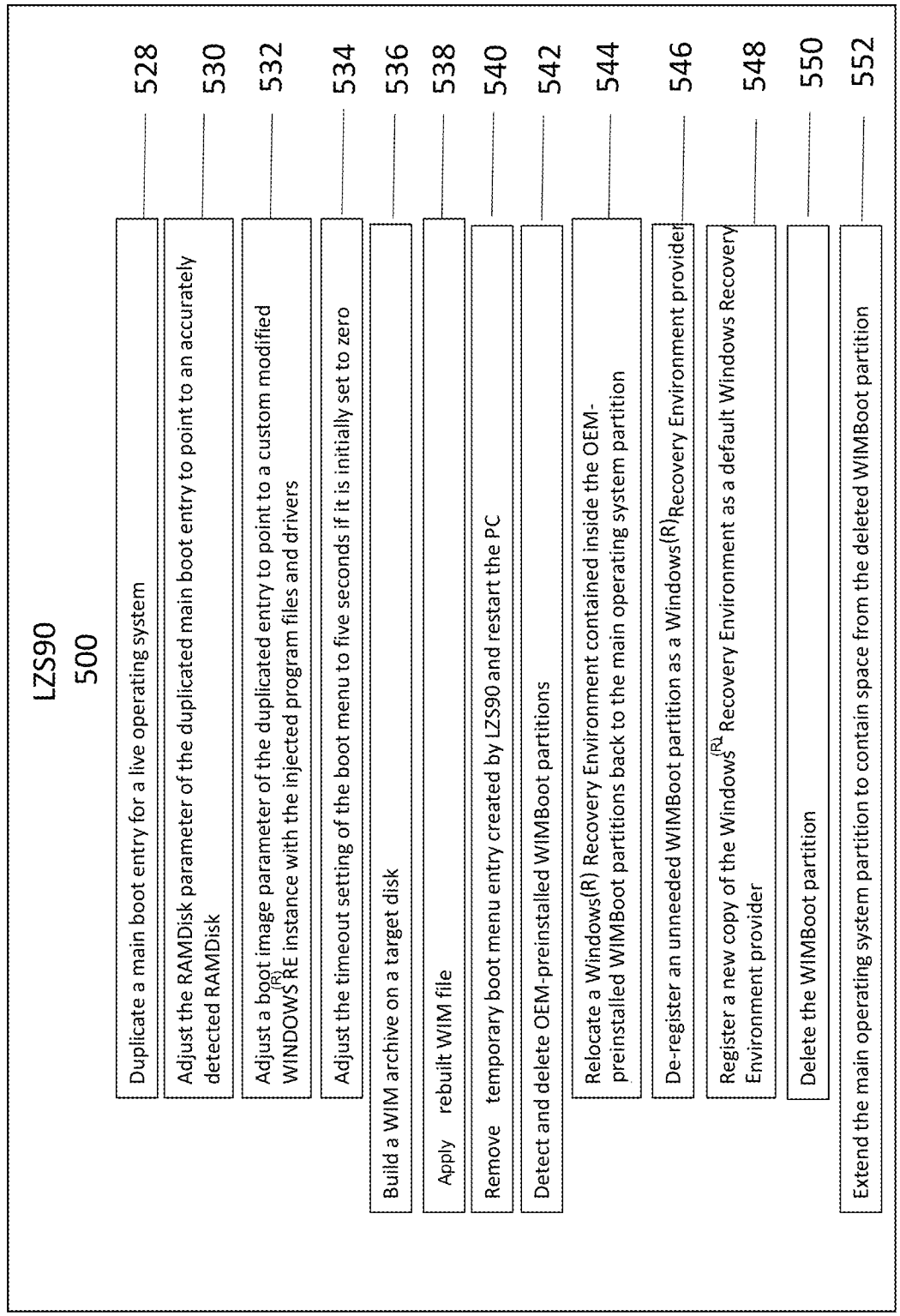

FIGS. 5-6 illustrates a flow diagram of another embodiment of the data compression method (LZS90 500) performed by the computer system 100 when utilizing a live Windows® operating system LZS90 500 embodiment gains access to the default Windows® RE instance and in step 502 and creates a copy of the default Windows® RE instance in 504 before injecting new program files and libraries into the default Windows® RE instance in step 506. In step 508, the LZS90 algorithm determines whether the default Windows® RE instance contains a set of necessary system drivers. In step 510, If the Windows® RE instance does not contain the set of necessary system drivers, LZS90 injects the set of necessary system drivers and a set of necessary registry keys into the default Windows® RE instance. In step 512, more than one copy of a set of driver files are injected, which replicate the exact folder structure of all matching files found in all subfolders of the live operating system. In step 514, LZS90 500 bypasses a second set of injections for Windows® 10 systems, and in step 516, LZS90 500 injects an additional driver file onto Windows® 7 computers. In step 520, LZS90 takes full control over a host Windows® operating system. In step 522, LZS90 500 executes a pattern further comprising steps 524, 526, 528, 530, and 532. Step 524 further comprises obtaining an existing RAMDisk parameter for a built-in PC boot entry to enter a Windows® Recovery environment. Step 526 further comprises filtering out any temporary entries pointing to partitions that no longer exist on the RAMdisk. Step 528 further comprises duplicating a main boot entry for a live operating system. In step 530, LZS90 500 adjusts the RAMDisk parameter of the duplicated main boot entry to point to an accurately detected RAMDisk. In step 532, LZS90 500 adjusts a boot image parameter of the duplicated entry to point to a custom modified Windows® RE instance with the injected program files and drivers. Step 534, further comprises adjusting the timeout setting of the boot menu to five seconds if it is initially set to zero. In step 536, LZS90 500 builds a WIM archive on a target disk and in step 538 a rebuilt WIM file is applied. In step 540, LZS90 detects and deletes original equipment manufacturer (OEM)-preinstalled WIMBoot partitions, which further comprises steps 544, 546, 548, and 550. Step 544 further comprises relocating a Windows® Recovery environment contained inside the OEM-preinstalled WIMBoot partitions back to the main operating system partition. Step 546 further comprises De-registering an unneeded WIMBoot partition as a Windows® recovery environment provider. Step 548 further comprises registering a new copy of the Windows® Recovery environment as a default Windows® Recovery environment provider. In step 550, LZS90 deletes the WIMBoot partition. In step 552, LZS90 50 extends the main operating system partition to contain the space from the newly deleted WIMBoot partition.

LZS90 does not depend on a 3 GB Windows® ADK download.

It does not require the creation of a Windows® PE bootable USB disk.

Instead, LZS90 recycles the Windows® RE instance already pre-installed on every Windows® computer. This Windows® RE instance has the following advantages over a manually created Windows® PE boot disk:

Any custom storage drivers, such as for Redundant Array of independent Disks (RAID), Advanced Host Controller Interface (AHCI), or SATA drivers are pre-installed by OEMs in the Windows® RE instance already present on PCs.

An external storage medium is not required to boot from this Windows® RE instance.

LZS90 first creates a copy of the default Windows® RE instance. Then, it injects its own program files and libraries into this Windows® RE instance. In cases where the Windows® RE instance does not already contain system drivers necessary to recognize WIMBoot mounted files (such as a Windows® 7 installation, or a Windows® 8.1 installation which was updated to Windows® 8.1 with Update 1 by an operator installing Windows® Updates, which causes the Windows® RE environment to remain non-updated), LZS90 also injects the necessary drivers and registry keys for the Windows® RE instance to recognize WIMBoot mounted files. The driver files that are injected are as follows:

\Windows\system32\wimbootcompress.ini
\Windows\system32\wimgapi.dll
\Windows\system32\wimserv.exe
\Windows\system32\drivers\wimmount.sys
\Windows\system32\drivers\wof.sys
\Windows\system32\woftasks.dll
\Windows\system32\wofutil.dll More than one copy of the following driver files are then injected, replicating the exact folder structure of all matching files found in all subfolders of the live operating system to compress:

\Windows\system32\wof.sys.mui
\Windows\system32\woftasks.dll.mui
\Windows\system32\wow.sys.mui
\Windows\system32\wimgapi.dll.mui The following files which are injected enable LZS90 to verify disk integrity before processing (but are not directly related to the WIMBoot driver files otherwise). These injections are skipped on Windows® 10, because they are both unnecessary and cause corruption of the processing environment being created under Windows® 10:

\Windows\system32\fmifs.dll
\Windows\system32\untfs.dll
\Windows\system32\ufat.dll
\Windows\system32\uexfat.dll
\Windows\system32\urefs.dll
\Windows\system32\ulib.dll
\Windows\system32\ifsutil.dll On Windows® 7 computers, the following additional file is injected:

\Windows\system32\drivers\wofadk.sys

LZS90 then injects itself into the PC boot menu, taking full control over the host Windows® operating system without requiring the PC to be manually booted from an external thumb drive or other dual booted operating system. To guarantee the most successful boot menu injection possible, LZS90 executes the following pattern:

It obtains the existing RAMDisk parameter for the built-in PC boot entry to enter the Windows® Recovery environment.

In doing so, it filters out any temporary entries which may point to partitions that may no longer exist on disk, or entries which are left-overs from Windows® operating system upgrade or installation entries.

It duplicates the main boot entry for the live operating system.

It adjusts the RAMDisk parameter of this duplicated entry to point to the accurately detected RAMDisk used for booting the Windows® Recovery environment.

It adjusts the boot image parameter of this duplicated entry to point to the custom modified Windows® RE instance with the injected program files and drivers as necessary.

If the timeout setting of the boot menu is zero, meaning that the PC operator would never get a chance to see the new entry thus created; this is adjusted to five seconds to ensure that the operator has the opportunity to boot properly into LZS90's exclusive disk processing mode.

Once booted from this custom boot menu entry, LZS90 has the same flexibility that would be afforded by booting from a Windows® PE instance created using a 3 GB ADK download, without requiring either the ADK download or an external bootable USB drive, or any operator interaction to enable external USB booting (such as the manual configuration of PC BIOS/Unified Extensible Firmware Interface (UEFI) boot settings). From the custom modified Windows® RE instance created as described above, LZS90 can process the entire Windows® operating system disk offline; having full and unrestricted access to all critical and non-critical system files as well as all other application files and data.

During compression, LZS90 starts building a WIM archive, at the default Windows® compression ratio, or using four higher levels of compression that are not provided by Microsoft® in the standard Windows® installation, while still remaining compatible with the Microsoft® WIMBoot driver.

If an external disk storage referred to as the "Undo Disk" is used, the WIM archive is created on this "Undo Disk", while leaving original applications and data intact on the target disk until the WIM archive has been successfully created. This helps the operation to have no fatal results for the target PC if it is interrupted due to any reason such as power loss. Then, after WIM archive creation, the target disk is cleaned up (with the exception of any excluded folders), and the WIM archive copied back to the target disk from the "Undo Disk". Even if power loss or another fatal error occurs at this point, the "Undo Disk" contains a full copy of the PC data inside the already-built WIM archive. After the WIM archive has been successfully transferred to the target PC from the "Undo Disk", the WIM archive is then applied to the target system in WIMBoot mode, completing processing.

If external disk storage (an "Undo Disk") is unavailable, then LZS90 starts building the WIM archive on the target disk directly, deleting each file that is added to the WIM archive from disk as soon as the compression is complete. Since LZS90 does not compress files which would take larger space than their uncompressed counterparts, this process ensures that even a full disk can be successfully processed without requiring any external storage—as each compressed file effectively frees up disk space due to compression savings. The drawback to this mode of processing is that if power loss or other interruption occurs, the Windows® operating system may be rendered in an unbootable state, and further data loss may occur based on the stage of the construction of the WIM archive.

Where a disk has been compressed before and external storage (an "Undo Disk") is unavailable, the same method can be used successfully to recompress a disk. However, in this scenario, files that are deleted from the host disk, or have been updated on the host disk (but still remain in the WIM archive per the "space bleed" problem in both of the cases of deletions and updates), are explicitly removed from the WIM archive being processed, before any new data is added. This explicit removal process is necessary to recover space in the WIM archive from these unneeded or stale copies of data. Where an "Undo Disk" is being used, this step is superfluous and unnecessary, as a brand-new WIM archive is built.

Where a previously compressed disk is to be decompressed, an "Undo Disk" is mandatory, as is sufficient free disk space on the target disk to contain all data uncompressed. This may require the operator to free up sufficient space before decompression to contain all data uncompressed. The process is repeated as with the other "Undo Disk" scenarios above; but the rebuilt WIM file is not copied to the target disk. Instead, it is extracted fully onto the target disk as in extracting any other regular archive; completing the decompression process. If the operator does not desire to decompress the latest copy of the disk, a previously created "Undo Disk" may be used, skipping the creation of a new WIM archive; thus accelerating processing times by preventing the recompression of the latest on-disk data.

It is also possible to enact a "System Refresh", effectively taking the target disk back to the exact state it was in when it was last compressed. This process skips an "Undo Disk" completely and uses the already-existing WIM archive on the target system: It first deletes all files on the target disk, and then simply re-applies the WIM archive to the target disk; having effectively refreshed the target disk to the exact state it was in when the WIM archive was last created.

Additional processing modes are also afforded for "Backup" and "Restore" operations. These operations are very similar to the above operations; where data is first copied onto a mandatory "Undo Disk" as part of a backup on a donor PC, and then restored from that "Undo Disk" on a recipient PC; having effectively enabled the cloning of the hard disk contents of the donor PC to the recipient PC. During the clone operation on the recipient PC, it is possible to apply data either in compressed (WIM archive with WIMBoot) or uncompressed (extracted WIM archive) modes.

After the desired processing is complete, the temporary boot menu entry created by LZS90 is removed, the PC restarted, and returned to normal operation with substantially increased free disk space.

LZS90 falls back to LZS85 when compressing files larger than 4 GB. This process ensures the entire disk is compressed successfully, regardless of the individual file sizes of files contained on disk.

Of the five grades of compression provided by LZS90, the first is analogous to the standard WIMBoot compression ratio, and the remaining four grades perform substantially better. Additional operator fine tuning of the compression ratio is available on a 100 point scale.

LZS90 automatically detects OEM-preinstalled WIMBoot partitions, and deletes them after safely relocating the data; liberating a substantial portion of storage back into the Windows® partition directly (guaranteed to be at least 5 GB). In order to safely process this deletion, LZS90 undertakes the following actions:

It relocates the Windows® Recovery environment contained inside the OEM-preinstalled WIMBoot partitions back to the main operating system partition (that is being compressed by LZS90).

It de-registers the unneeded WIMBoot partition as a Windows® Recovery environment provider.

It newly registers the new copy of the Windows® Recovery environment as the default Windows® Recovery environment provider.

It deletes the WIMBoot partition.

It extends the main operating system partition to contain the space from the newly deleted WIMBoot partition.

LZS90 compression is reversible at any time.

LZS90 supports BIOS, UEFI, 32 bit, 64 bit, and both solid state and rotating platter based disks.

LZS90 may be used on any boot partition.

LZS90 may exclude any number of folders from processing.

LZS90 excludes the following well-known frequently updated folders from processing by default:
\Recovery
\Users\<username>\AppData\Local\Microsoft® \Outlook
\Users\<username>\Documents\Outlook Files \ProgramData\Microsoft® \Search
\Users\<username>\AppData\Local\Microsoft®
\Windows®\INetCache LZS90 instead relegates the compression of these folders to the LZS80 compression provider because these locations are unsafe to compress (either preventing normal Windows® booting and/or recovery Windows® booting operations, due to compression being unsupported at the preliminary startup/Windows® recovery stages), or counterproductive to compress (containing frequently updated files, which would only aggravate the WIMBoot space problem should they be processed by the LZS90 algorithm directly).

On Windows® 7 operating systems which do not have native WIMBoot support, LZS90 includes an additional list of file and folder exclusions. When these operating systems are compressed without these exclusions, they will be rendered inoperable and fail to boot:

\Windows\winsxs\manifests\(entire folder and subfolders)
\Windows\system32\catroot2\(entire folder and subfolders)
\Windows\system32\config\(entire folder and subfolders)
\Windows\system32\drivers\(entire folder and subfolders)
Any file with the strings winload or winresume as part of its name
Any file found inside\Windows\system32\with a .DLL name extension, and where the name contains hal or ms-api-win or ext-ms-win or kbd or kd
\Windows\apppatch\drvmain. sdb
\Windows\bootstat.dat
\Windows\fonts\vgaoem.fon
\Windows\fonts\vgasys.fon
\Windows\inf\errata.inf
\Windows\system32\7b296fb0-376b-497e-b012-9c450e1b7327-5p-0.c7483456-a289-439d-8115-601632d005a0
\Windows\system32\7b296fb0-376b-497e-b012-9c450e1b7327-5p-1.c7483456-a289-439d-8115-601632d005a0
\Windows\system32\apisetschema.dll
\Windows\system32\ar-sa\comct132.dll.mui
\Windows\system32\autochk.exe
\Windows\system32\bg-bg\comct132.dll.mui
\Windows\system32\boot.sdi
\Windows\system32\boot\de-de\winload.efi.mui
\Windows\system32\boot\de-de\winload.exe.mui
\Windows\system32\boot\de-de\winresume.efi.mui
\Windows\system32\boot\de-de\winresume.exe.mui
\Windows\system32\boot\winload.efi
\Windows\system32\boot\winload.exe
\Windows\system32\boot\winresume.efi
\Windows\system32\boot\winresume.exe
\Windows\system32\bootcfg.exe
\Windows\system32\bootrec.exe
\Windows\system32\bootres.dll
\Windows\system32\bootsect.exe
\Windows\system32\bootstr.dll
\Windows\system32\bootvid.dll
\Windows\system32\bopomofo.uce
\Windows\system32\brcoinst.dll
\Windows\system32\brdgcfg.dll
\Windows\system32\browcli.dll
\Windows\system32\browseui.dll
\Windows\system32\bthci.dll
\Windows\system32\c_037.nls
\Windows\system32\c_10000.nls
\Windows\system32\c_10001.nls
\Windows\system32\c_10002.nls
\Windows\system32\c_10003.nls
\Windows\system32\c_10004.nls
\Windows\system32\c_10005.nls
\Windows\system32\c_10006.nls
\Windows\system32\c_10007.nls
\Windows\system32\c_10008.nls
\Windows\system32\c_10010.nls
\Windows\system32\c_10017.nls
\Windows\system32\c_10021.nls
\Windows\system32\c_10029.nls
\Windows\system32\c_10079.nls
\Windows\system32\c_10081.nls
\Windows\system32\c_10082.nls
\Windows\system32\c_1026.nls
\Windows\system32\c_1047.nls
\Windows\system32\c_1140.nls
\Windows\system32\c_1141.nls
\Windows\system32\c_1142.nls
\Windows\system32\c_1143.nls
\Windows\system32\c_1144.nls
\Windows\system32\c_1145.nls
\Windows\system32\c_1146.nls
\Windows\system32\c_1147.nls
\Windows\system32\c_1148.nls
\Windows\system32\c_1149.nls
\Windows\system32\c_1250.nls
\Windows\system32\c_1251.nls
\Windows\system32\c_1252.nls
\Windows\system32\c_1253.nls
\Windows\system32\c_1254.nls
\Windows\system32\c_1255.nls
\Windows\system32\c_1256.nls
\Windows\system32\c_1257.nls
\Windows\system32\c_1258.nls
\Windows\system32\c_1361.nls
\Windows\system32\c_20000.nls
\Windows\system32\c_20001.nls
\Windows\system32\c_20002.nls
\Windows\system32\c_20003.nls
\Windows\system32\c_20004.nls
\Windows\system32\c_20005.nls
\Windows\system32\c_20105.nls
\Windows\system32\c_20106.nls
\Windows\system32\c_20107.nls
\Windows\system32\c_20108.nls
\Windows\system32\c_20127.nls
\Windows\system32\c_20261.nls
\Windows\system32\c_20269.nls
\Windows\system32\c_20273.nls
\Windows\system32\c_20277.nls
\Windows\system32\c_20278.nls
\Windows\system32\c_20280.nls
\Windows\system32\c_20284.nls
\Windows\system32\c_20285.nls
\Windows\system32\c_20290.nls
\Windows\system32\c_20297.nls
\Windows\system32\c_20420.nls
\Windows\system32\c_20423.nls
\Windows\system32\c_20424.nls
\Windows\system32\c_20833.nls
\Windows\system32\c_20838.nls
\Windows\system32\c_20866.nls
\Windows\system32\c_20871.nls
\Windows\system32\c_20880.nls
\Windows\system32\c_20905.nls
\Windows\system32\c_20924.nls \Windows\system32\c_20932.nls
\Windows\system32\c_20936.nls
\Windows\system32\c_20949.nls
\Windows\system32\c_21025.nls
\Windows\system32\c_21027.nls
\Windows\system32\c_21866.nls
\Windows\system32\c_28591.nls
\Windows\system32\c_28592.nls
\Windows\system32\c_28593.nls
\Windows\system32\c_28594.nls
\Windows\system32\c_28595.nls
\Windows\system32\c_28596.nls
\Windows\system32\c_28597.nls
\Windows\system32\c_28598.nls
\Windows\system32\c_28599.nls
\Windows\system32\c_28603.nls
\Windows\system32\c_28605.nls
\Windows\system32\c_437.nls
\Windows\system32\c_500.nls
\Windows\system32\c_708.nls
\Windows\system32\c_720.nls
\Windows\system32\c_737.nls
\Windows\system32\c_775.nls
\Windows\system32\c_850.nls
\Windows\system32\c_852.nls
\Windows\system32\c_855.nls
\Windows\system32\c_857.nls
\Windows\system32\c_858.nls
\Windows\system32\c_860.nls
\Windows\system32\c_861.nls
\Windows\system32\c_862.nls
\Windows\system32\c_863.nls
\Windows\system32\c_864.nls
\Windows\system32\c_865.nls
\Windows\system32\c_866.nls
\Windows\system32\c_869.nls
\Windows\system32\c_870.nls
\Windows\system32\c_874.nls
\Windows\system32\c_875.nls
\Windows\system32\c_932.nls
\Windows\system32\c_936.nls
\Windows\system32\c_949.nls
\Windows\system32\c_950.nls
\Windows\system32\certcli.dll
\Windows\system32\cfgbkend.dll
\Windows\system32\cfgmgr32.dll
\Windows\system32\chajei.ime
\Windows\system32\change.exe
\Windows\system32\charmap.exe
\Windows\system32\chcp.com
\Windows\system32\chglogon.exe
\Windows\system32\chgport.exe
\Windows\system32\chgusr.exe
\Windows\system32\chkdsk.exe
\Windows\system32\chkntfs.exe
\Windows\system32\chkwudrv.dll
\Windows\system32\choice.exe
\Windows\system32\chsbrkr.dll
\Windows\system32\chtbrkr.dll
\Windows\system32\chxreadingstringime.dll
\Windows\system32\ci.dll
\Windows\system32\cic.dll
\Windows\system32\cintlgnt.ime
\Windows\system32\cipher.exe
\Windows\system32\circoinst.dll
\Windows\system32\clb.dll
\Windows\system32\clbcatq.dll
\Windows\system32\cleanmgr.exe
\Windows\system32\clfs.sys
\Windows\system32\clfsw32.dll
\Windows\system32\cliconfg.dll
\Windows\system32\cliconfg.exe
\Windows\system32\cliconfg.rll
\Windows\system32\clip.exe
\Windows\system32\clusapi.dll
\Windows\system32\cmd.exe
\Windows\system32\cmifw.dll
\Windows\system32\cmipnpinstall.dll
\Windows\system32\cmmon32.exe
\Windows\system32\cmnclim.dll
\Windows\system32\cmpbk32.dll
\Windows\system32\cmstp.exe
\Windows\system32\cmstplua.dll
\Windows\system32\cmutil.dll
\Windows\system32\cngaudit.dll
\Windows\system32\cngprovider.dll
\Windows\system32\cnvfat.dll
\Windows\system32\codeintegrity\bootcat.cache
\Windows\system32\codeintegrity\driver.stl
\Windows\system32\cofire.exe
\Windows\system32\cofiredm.dll
\Windows\system32\colbact.dll
\Windows\system32\collab.cpl
\Windows\system32\colorcnv.dll
\Windows\system32\colorcpl.exe
\Windows\system32\colorui.dll
\Windows\system32\com\comadmin.dll
\Windows\system32\com\comempty.dat
\Windows\system32\comcat.dll
\Windows\system32\comdlg32.dll
\Windows\system32\comres.dll
\Windows\system32\conhost.exe
\Windows\system32\console.dll
\Windows\system32\convert.exe
\Windows\system32\credssp.dll
\Windows\system32\credui.dll
\Windows\system32\credwiz.exe
\Windows\system32\crppresentation.dll
\Windows\system32\crtdll.dll
\Windows\system32\crypt32.dll
\Windows\system32\cryptbase.dll
\Windows\system32\cryptdlg.dll
\Windows\system32\cryptdll.dll
\Windows\system32\cryptext.dll
\Windows\system32\cryptnet.dll
\Windows\system32\cryptsp.dll
\Windows\system32\cryptsvc.dll
\Windows\system32\cryptui.dll
\Windows\system32\cryptxml.dll
\Windows\system32\cscript.exe
\Windows\system32\cs-cz\cdosys.dll.mui
\Windows\system32\cs-cz\comct132.dll.mui
\Windows\system32\cs-cz\comdlg32.dll.mui
\Windows\system32\cs-cz\fms.dll.mui
\Windows\system32\cs-cz\mlang.dll.mui
\Windows\system32\cs-cz\msimsg.dll.mui
\Windows\system32\cs-cz\msprivs.dll.mui
\Windows\system32\csrsrv.dll
\Windows\system32\csrss.exe
\Windows\system32\csrstub.exe
\Windows\system32\ctfmon.exe
\Windows\system32\ct13d32.dll
\Windows\system32\ct13dv2.dll
\Windows\system32\cttune.exe \Windows\system32\cttunesvr.exe
\Windows\system32\da-dk\comctl32.dll.mui
\Windows\system32\da-dk\comdlg32.dll.mui
\Windows\system32\da-dk\fms.dll.mui
\Windows\system32\da-dk\mlang.dll.mui
\Windows\system32\da-dk\msimsg.dll.mui
\Windows\system32\da-dk\msprivs.dll.mui
\Windows\system32\dataclen.dll
\Windows\system32\davclnt.dll
\Windows\system32\davhlpr.dll
\Windows\system32\dbgeng.dll
\Windows\system32\dbghelp.dll
\Windows\system32\dbnetlib.dll
\Windows\system32\dbnmpntw.dll
\Windows\system32\dccw.exe
\Windows\system32\dciman32.dll
\Windows\system32\dcomcnfg.exe
\Windows\system32\ddaclsys.dll
\Windows\system32\ddeml.dll
\Windows\system32\ddodiag.exe
\Windows\system32\ddoiproxy.dll
\Windows\system32\de-de\cdosys.dll.mui
\Windows\system32\de-de\comctl32.dll.mui
\Windows\system32\de-de\comdlg32.dll.mui
\Windows\system32\de-de\fms.dll.mui
\Windows\system32\de-de\mlang.dll.mui
\Windows\system32\de-de\msimsg.dll.mui
\Windows\system32\de-de\msprivs.dll.mui
\Windows\system32\de-de\winload.efi.mui
\Windows\system32\de-de\winload.exe.mui
\Windows\system32\de-de\winresume.efi.mui
\Windows\system32\de-de\winresume.exe.mui
\Windows\system32\defragproxy.dll
\Windows\system32\defragsvc.dll
\Windows\system32\devobj.dll
\Windows\system32\devrtl.dll
\Windows\system32\dfscli.dll
\Windows\system32\dhcpcmonitor.dll
\Windows\system32\dhcpcore.dll
\Windows\system32\dhcpcore6.dll
\Windows\system32\dnsapi.dll
\Windows\system32\dnscacheugc.exe
\Windows\system32\dnsrslvr.dll
\Windows\system32\doskey.exe
\Windows\system32\dpapimig.exe
\Windows\system32\dpx.dll
\Windows\system32\driverstore\drvindex.dat
\Windows\system32\driverstore\en-us\mdmbr004.inf_loc
\Windows\system32\driverstore\en-us\mdmbr005.inf_loc
\Windows\system32\driverstore\filerepository\averfx2hbh826d_noaverir_x64.inf_amd64_neutral_da2ba9e8a30dad14\averfx2hbtv64.sys
\Windows\system32\driverstore\filerepository\averfx2hbtv_x64.inf_amd64_neutral_7216b6fb23536c40\averfx2hbtv64.sys
\Windows\system32\driverstore\filerepository\averfx2hbtv_x64.inf_amd64_neutral_7216b6fb236c40\mvdetection64.ax
\Windows\system32\driverstore\filerepository\averfx2swtv_noavin_x64.inf_amd64_neutral_86943dd17860e449\averfx2hbtv64.sys
\Windows\system32\driverstore\filerepository\averfx2swtv_noavin_x64.inf_amd64_neutral_86943dd17860e449\mvdetection64.ax
\Windows\system32\driverstore\filerepository\averfx2swtv_x64.inf_amd64_neutral_24a71cdaabc7f783\averfx2hbtv64.sys
\Windows\system32\driverstore\filerepository\averfx2swtv_x64.inf_amd64_neutral_24a71cdaabc7f783\mvdetection64.ax
\Windows\system32\driverstore\filerepository\averhbh826_noaverir_x64.inf_amd64_neutral_2fe3b14136d6e46d\averfx2hbtv64.sys
\Windows\system32\driverstore\filerepository\averhbh826_noaverir_x64.inf_amd64_neutral_2fe3b14136d6e46d\mvdetection64.ax
\Windows\system32\driverstore\filerepository\brmfcmdm.inf_amd64_neutral_af49d2f3ffa12116\brcoinst.dll
\Windows\system32\driverstore\filerepository\brmfcmdm.inf_amd64_neutral_af49d2f3ffa12116\brserid.sys
\Windows\system32\driverstore\filerepository\brmfcmdm.inf_amd64_neutral_af49d2f3ffa12116\brusbser.sys
\Windows\system32\driverstore\filerepository\brmfcmf.inf_amd64_neutral_67b5984f8e8ff717\brbidiif.dll
\Windows\system32\driverstore\filerepository\brmfcmf.inf_amd64_neutral_67b5984f8e8ff717\brcoinst.dll
\Windows\system32\driverstore\filerepository\brmfcmf.inf_amd64_neutral_67b5984f8e8ff717\brevif.dll
\Windows\system32\driverstore\filerepository\brmfcmf.inf_amd64_neutral_67b5984f8e8ff717\brmfbidi.dll
\Windows\system32\driverstore\filerepository\brmfcmf.inf_amd64_neutral_67b5984f8e8ff717\brmflpt.dll
\Windows\system32\driverstore\filerepository\brmfcmf.inf_amd64_neutral_67b5984f8e8ff717\brmfrsmg.exe
\Windows\system32\driverstore\filerepository\brmfcmf.inf_amd64_neutral_67b5984f8e8ff717\brmfusb.dll
\Windows\system32\driverstore\filerepository\brmfcmf.inf_amd64_neutral_67b5984f8e8ff717\brscnrsm.dll
\Windows\system32\driverstore\filerepository\brmfcmf.inf_amd64_neutral_67b5984f8e8ff717\brserif.dll
\Windows\system32\driverstore\filerepository\brmfcmf.inf_amd64_neutral_67b5984f8e8ff717\brserwdm.sys
\Windows\system32\driverstore\filerepository\brmfcmf.inf_amd64_neutral_67b5984f8e8ff717\brusbmdm.sys
\Windows\system32\driverstore\filerepository\brmfcmf.inf_amd64_neutral_67b5984f8e8ff717\rsmgrstr.dll
\Windows\system32\driverstore\filerepository\brmfcumd.inf_amd64_neutral_db43b26810939b3e\brusbmdm.sys
\Windows\system32\driverstore\filerepository\brmfcwia.inf_amd64_neutral_817b8835aed3d6b7\brbidiif.dll
\Windows\system32\driverstore\filerepository\brmfcwia.inf_amd64_neutral_817b8835aed3d6b7\brcoinst.dll \Windows\system32\driverstore\filerepository\brmfcwia.inf_amd64_neutral_817b8835aed3d6b7\brevif.dll
\Windows\system32\driverstore\filerepository\brmfcwia.inf_amd64_neutral_817b8835aed3d6b7\brmfbidi.dll
\Windows\system32\driverstore\filerepository\brmfcwia.inf_amd64_neutral_817b8835aed3d6b7\brmflpt.dll
\Windows\system32\driverstore\filerepository\brmfcwia.inf_amd64_neutral_817b8835aed3d6b7\brmfrsmg.exe
\Windows\system32\driverstore\filerepository\brmfcwia.inf_amd64_neutral_817b8835aed3d6b7\brmfusb.dll
\Windows\system32\driverstore\filerepository\brmfcwia.inf_amd64_neutral_817b8835aed3d6b7\brscnrsm.dll
\Windows\system32\driverstore\filerepository\brmfcwia.inf_amd64_neutral_817b8835aed3d6b7\brserif.dll
\Windows\system32\driverstore\filerepository\brmfcwia.inf_amd64_neutral_817b8835aed3d6b7\rsmgrstr.dll
\Windows\system32\driverstore\filerepository\brmfport.inf_amd64_neutral_f41f35e5c21bc350\brcoinst.dll
\Windows\system32\driverstore\filerepository\brmfport.inf_amd64_neutral_f41f35e5c21bc350\brserid.sys
\Windows\system32\driverstore\filerepository\brmfport.inf_amd64_neutral_f41f35e5c21bc350\brserwdm.sys
\Windows\system32\driverstore\filerepository\brmfport.inf_amd64_neutral_f41f35e5c21bc350\brusbser.sys
\Windows\system32\driverstore\filerepository\cxfalcon_ibv64.inf_amd64_neutral_d065aec3fcf4ec4e\colorcvt_ibv64.ax
\Windows\system32\driverstore\filerepository\cxfalcon_ibv64.inf_amd64_neutral_d065aec3fcf4ec4e\cpnotifv_ibv64.ax
\Windows\system32\driverstore\filerepository\cxfalcon_ibv64.inf_amd64_neutral_d065aec3fcf4ec4e\cxfalcon.rom
\Windows\system32\driverstore\filerepository\cxfalcon_ibv64.inf_amd64_neutral_d065aec3fcf4ec4e\cxfalcon_ibv64.sys
\Windows\system32\driverstore\filerepository\cxfalcon_ibv64.inf_amd64_neutral_d065aec3fcf4ec4e\merlinb.rom
\Windows\system32\driverstore\filerepository\cxfalcon_ibv64.inf_amd64_neutral_d065aec3fcf4ec4e\merlinc.rom
\Windows\system32\driverstore\filerepository\cxfalpal_ibv64.inf_amd64_neutral_4c42ac5f00413365\colorcvt_ibv64.ax
\Windows\system32\driverstore\filerepository\cxfalpal_ibv64.inf_amd64_neutral_4c42ac5f00413365\cpnotify_ibv64.ax
\Windows\system32\driverstore\filerepository\cxfalpal_ibv64.inf_amd64_neutral_4c42ac5f00413365\cxfalcon.rom
\Windows\system32\driverstore\filerepository\cxfalpal_ibv64.inf_amd64_neutral_4c42ac5f00413365\cxfalcon_ibv64.sys
\Windows\system32\driverstore\filerepository\cxfalpal_ibv64.inf_amd64_neutral_4c42ac5f00413365\merlinb.rom
\Windows\system32\driverstore\filerepository\cxfalpal_ibv64.inf_amd64_neutral_4c42ac5f00413365\ merlin-c.rom
\Windows\system32\driverstore\filerepository\cxraptor_fm1216mk5_ibv64.inf_amd64_neutral3eaae75b591bd148\apu.rom
\Windows\system32\driverstore\filerepository\cxraptor_fm1216mk5_ibv64.inf_amd64_neutral3eaae75b591bd148\colorcvt_raptor_ibv64.ax
\Windows\system32\driverstore\filerepository\cxraptor_fm1216mk5_ibv64.inf_amd64_neutral3eaae75b591bd148\cpnotify_raptor_ibv64.ax
\Windows\system32\driverstore\filerepository\cxraptor_fm1216mk5_ibv64.inf_amd64_neutral3eaae75b591bd148\cxraptor.rom
\Windows\system32\driverstore\filerepository\cxraptor_fm1216mk5_ibv64.inf_amd64_neutral_3_eaae75b591bd148\cxraptor_ibv64.sys
\Windows\system32\driverstore\filerepository\cxraptor_fm1216mk5_ibv64.inf_amd64_neutral_3_eaae75b591bd148\cxraptor_merlinc.rom
\Windows\system32\driverstore\filerepository\cxraptor_fm1236mk5_ibv64.inf_amd64_neutral_b81bec917adfaea5\apu.rom
\Windows\system32\driverstore\filerepository\cxraptor_fm1236mk5_ibv64.inf_amd64_neutral_b81bec917adfaea5\colorcvt_raptor_ibv64.ax
\Windows\system32\driverstore\filerepository\cxraptor_fm1236mk5_ibv64.inf_amd64_neutral_b81bec917adfaea5\cpnotify_raptor_ibv64.ax
\Windows\system32\driverstore\filerepository\cxraptor_fm1236mk5_ibv64.inf_amd64_neutral_b81bec917adfaea5\cxraptor.rom
\Windows\system32\driverstore\filerepository\cxraptor_fm1236mk5_ibv64.inf_amd64_neutral_b81bec917adfaea5\cxraptor_ibv64.sys
\Windows\system32\driverstore\filerepository\cxraptor_fm1236mk5_ibv64.inf_amd64_neutral_b81bec917adfaea5\cxraptor_merlinc.rom
\Windows\system32\driverstore\filerepository\hpoa1so.inf_amd64_neutral_4f1a3f1015001339\hpowiav1.dll
\Windows\system32\driverstore\filerepository\hpoa1ss.inf_amd64_neutral_8cae09a2238d64e0\hpowiav1.dll
\Windows\system32\driverstore\filerepository\keyboard.inf_amd64_neutral_0684fdc43059f486\i8042prt.sys
\Windows\system32\driverstore\filerepository\mdmbr002.inf_amd64_neutral_ce2134188ab21f59\brserib.sys
\Windows\system32\driverstore\filerepository\mdmbr002.inf_amd64_neutral_ce2134188ab21f59\brusbsib.sys
\Windows\system32\driverstore\filerepository\mdmbr004.inf_amd64_neutral_ccf1bc353e588fe1\brserib.sys
\Windows\system32\driverstore\filerepository\mdmbr004.inf_amd64_neutral_ccf1bc353e588fe1\brusbsib.sys
\Windows\system32\driverstore\filerepository\mdmbr005.inf_amd64_neutral_d140721f97061bba\brserib.sys \Windows\system32\driverstore\filerepository\
mdmbr005.inf_amd64_neutral_
d140721f97061bba\brusbsib.sys
\Windows\system32\driverstore\filerepository\
mdmbr006.inf_amd64_neutral_
40c76453575b1208\brserib.sys
\Windows\system32\driverstore\filerepository\
mdmbr006.inf_amd64_neutral_
40c76453575b1208\brusbsib.sys
\Windows\system32\driverstore\filerepository\
mdmbr007.inf_amd64_neutral_
91d259640bad7d26\brserib.sys
\Windows\system32\driverstore\filerepository\
mdmbr007.inf_amd64_neutral_91d259640bad7d26\
brusbsib.sys
\Windows\system32\driverstore\filerepository\
mdmbr008.inf_amd64_neutral_
2cedaac353c381da\brserib.sys
\Windows\system32\driverstore\filerepository\
mdmbr008.inf_amd64_neutral_2cedaac353
c381da\brusbsib.sys
\Windows\system32\driverstore\filerepository\
mdmbr00a.inf_amd64_neutral_aa4f0850ff03674e\
brserib.sys
\Windows\system32\driverstore\filerepository\
mdmbr00a.inf_amd64_neutral_aa4f0850ff03674e\
brusbsib.sys
\Windows\system32\driverstore\filerepository\
mdmcxhv6.inf_amd64_neutral_81ba64c5b6150dd3\
vstbs26.sys
\Windows\system32\driverstore\filerepository\
mdmcxhv6.inf_amd64_neutral_81ba64c5b6150dd3\
vstcnxt6.sys
\Windows\system32\driverstore\filerepository\
mdmcxhv6.inf_amd64_neutral_81ba64c5b6150dd3\
vstdpv6.sys
\Windows\system32\driverstore\filerepository\
mdmcxhv6.inf_amd64_neutral_81ba64c5b6150dd3
Wstprof.cty
\Windows\system32\driverstore\filerepository\
mdmcxpv6.inf_amd64_neutral_f62ac4bd04e653
d0\vstbs26.sys
\Windows\system32\driverstore\filerepository\
mdmcxpv6.inf_amd64_neutral_f62ac4bd04e653
d0\vstcnxt6.sys
\Windows\system32\driverstore\filerepository\
mdmcxpv6.inf_amd64_neutral_f62ac4bd04e653
d0\vstdpv6.sys
\Windows\system32\driverstore\filerepository\
mdmcxpv6.inf_amd64_neutral_f62ac4bd04e653d0\
vstprof.cty
\Windows\system32\driverstore\filerepository\
mdmirmdm.inf_amd64_neutral_fadec14b0a37b637\
msircomm.sys
\Windows\system32\driverstore\filerepository\
mdmnokia.inf_amd64_neutral_a8e9a41983d33a0b\
msircomm.sys
\Windows\system32\driverstore\filerepository\
msmouse.inf_amd64_neutral_7
a5f47d3150cc0eb\i8042prt.sys
\Windows\system32\driverstore\filerepository\
netvwifibus.inf_amd64_neutral_9d0740f32ce81d24\
vwifibus.sys
\Windows\system32\driverstore\filerepository\
ph3xibc0.inf_amd64_neutral_c
24bcc939e6dfc23\ph3xib64.sys
\Windows\system32\driverstore\filerepository\
ph3xibc0.inf_amd64_neutral_c
24bcc939e6dfc23\ph3xib64mv.dll
\Windows\system32\driverstore\filerepository\
ph3xibc1.inf_amd64_neutral_6
62220c3016bb4d0\ph3xib64.sys
\Windows\system32\driverstore\filerepository\
ph3xibc1.inf_amd64_neutral_6
62220c3016bb4d0\ph3xib64mv.dll
\Windows\system32\driverstore\filerepository\
ph3xibc10.inf_amd64_neutral_2c5d0c618dbfaf2a\
ph3xib64.sys
\Windows\system32\driverstore\filerepository\
ph3xibc10.inf_amd64_neutral_2c5d0c618dbfaf2a\
ph3xib64mv.dll
\Windows\system32\driverstore\filerepository\
ph3xibc11.inf_amd64_neutral_bb
18e5f134c40c68\ph3xib64.sys
\Windows\system32\driverstore\filerepository\
ph3xibc11.inf_amd64_neutral_bb18e5f134c40c68\
ph3xib64mv.dll
\Windows\system32\driverstore\filerepository\
ph3xibc12.inf_amd64_neutral_ff7295ba5a46d63f\
ph3xib64.sys
\Windows\system32\driverstore\filerepository\
ph3xibc12.inf_amd64_neutral_ff7295ba5a46d63f\
ph3xib64mv.dll
\Windows\system32\driverstore\filerepository\
ph3xibc2.inf_amd64_neutral_7
621f5d62d77f42e\ph3xib64.sys
\Windows\system32\driverstore\filerepository\
ph3xibc2.inf_amd64_neutral_7
621f5d62d77f42e\ph3xib64mv.dll
\Windows\system32\driverstore\filerepository\
ph3xibc3.inf_amd64_neutral_1
da6abc36a79974f\ph3xib64.sys
\Windows\system32\driverstore\filerepository\
ph3xibc3.inf_amd64_neutral_1
da6abc36a79974f\ph3xib64mv.dll
\Windows\system32\driverstore\filerepository\
ph3xibc4.inf_amd64_neutral_3
10871d800afa82a\ph3xib64.sys
\Windows\system32\driverstore\filerepository\
ph3xibc4.inf_amd64_neutral_3
10871d800afa82a\ph3xib64mv.dll
\Windows\system32\driverstore\filerepository\
ph3xibc5.inf_amd64_neutral_2
270382453de2dbb\ph3xib64.sys
\Windows\system32\driverstore\filerepository\
ph3xibc5.inf_amd64_neutral_2
270382453de2dbb\ph3xib64mv.dll
\Windows\system32\driverstore\filerepository\
ph3xibc6.inf_amd64_neutral_2
818f7b3b62bdd39\ph3xib64.sys
\Windows\system32\driverstore\filerepository\
ph3xibc6.inf_amd64_neutral_2
818f7b3b62bdd39\ph3xib64mv.dll
\Windows\system32\driverstore\filerepository\
ph3xibc7.inf_amd64_neutral_3
48f512722c79525\ph3xib64.sys
\Windows\system32\driverstore\filerepository\
ph3xibc7.inf_amd64_neutral_3
48f512722c79525\ph3xib64mv.dll
\Windows\system32\driverstore\filerepository\
ph3xibc8.inf_amd64_neutral_c 93 e7023
ef90e637\ph3xib64.sys
\Windows\system32\driverstore\filerepository\
ph3xibc8.inf_amd64_neutral_c 93 e7023
ef90e637\ph3xib64mv.dll \Windows\system32\driverstore\filerepository\
ph3xibc9.inf_amd64_neutral_ff
a566e4b6ba035\ph3xib64.sys
\Windows\system32\driverstore\filerepository
\ph3xibc9.inf_amd64_neutral_ff
a566e4b6ba035\ph3xib64mv.dll
\Windows\system32\driverstore\filerepository\
ph6xib64c0.inf_amd64_neutral_a43df8f7441e1c61\
ph6xib64.sys
\Windows\system32\driverstore\filerepository\
ph6xib64c0.inf_amd64_neutral_a43
df8f7441e1c61\ph6xib64mv.dll
\Windows\system32\driverstore\filerepository\
ph6xib64c1.inf_amd64_neutral_
68c99681343e9b68\ph6xib64.sys
\Windows\system32\driverstore\filerepository\
ph6xib64c1.inf_amd64_neutral_68c99681343
e9b68\ph6xib64mv.dll
\Windows\system32\driverstore\filerepository\
prnbr004.inf_amd64_neutral_a
78e168d6944619a\amd64\brci08ui.dll
\Windows\system32\driverstore\filerepository\
prnbr005.inf_amd64_neutral
e4cc05e0d4bcb33\amd64\brci08ui.dll
\Windows\system32\driverstore\filerepository\
prnca00b.inf_amd64_neutral_4
412894f52d39895\amd64\cnbmr284.dll
\Windows\system32
driverstore\filerepository\prnca00c.inf_amd64_neutral
5 10c36849918ce92\amd64\cnbjop7i.dll
\Windows\system32
driverstore\filerepository\prnca00d.inf_amd64_ neutral_0 600b2ba575729f4\amd64\cnbjop7i.dll
\Windows\system32
driverstore\filerepository\prnca00d.inf_amd64_ neutral_0 600b2ba575729f4\amd64\cnbmr284.dll
\Windows\system32
driverstore\filerepository\prnhp003.inf_amd64_ neutral_4 480210763997eb4\amd64\hpadbrgb.icc
\Windows\system32
driverstore\filerepository\prnhp003.inf_amd64_ neutral_4 480210763997eb4\amd64\hpcdmc71.dll
\Windows\system32
driverstore\filerepository\prnhp003.inf_amd64 _ neutral_4 480210763997eb4\amd64\hpfiew71.dll
\Windows\system32
driverstore\filerepository\prnhp003.inf_amd64_ neutral_4 480210763997eb4\amd64\hpfigw71.dll
\Windows\system32
driverstore\filerepository\prnhp003.inf_amd64 _ neutral_4 480210763997eb4\amd64\hpfrsw71.dll
\Windows\system32
driverstore\filerepository\prnhp004.inf_amd64_ neutral_5 3f688945cfc24cc\amd64\hpadbrgb.icc
\Windows\system32
driverstore\filerepository\prnhp004.inf_amd64_ neutral_5 3f688945cfc24cc\amd64\hpfiew71.dll
\Windows\system32
driverstore\filerepository\prnhp004.inf_amd64_ neutral_5 3 f68 8945 cfc24cc\amd64\hpfigw71.dll
\Windows\system32
driverstore\filerepository\prnhp004.inf_amd64_ neutral_5 3f688945cfc24cc\amd64\hpfrsw71.dll
\Windows\system32
driverstore\filerepository\prnhp005.inf_amd64_ neutral_9 14d6c300207814fl amd64\hpadbrgb.icc
\Windows\system32
driverstore\filerepository\prnhp005.inf_amd64_ neutral_9 14d6c300207814fl amd64\hpcdmc71.dll
\Windows\system32\driverstore\filerepository\
prnky003.inf_amd64_neutral_f
e7ea176f20ab839\amd64\kyw7fres.dll
\Windows\system32\driverstore\filerepository\
prnky003.inf_amd64_neutral_f
e7ea176f20ab839\amd64\kyw7sres.dll
\Windows\system32\driverstore\filerepository\
prnky009.inf_amd64_neutral_8
e54c9ff272b72f1\amd64\kyw7fres.dll
\Windows\system32\driverstore\filerepository\
prnky009.inf_amd64_neutral_8
e54c9ff272b72f1\amd64\kyw7sres.dll
\Windows\system32\driverstore\filerepository\
prnod002.inf_amd64_neutral_a
10c656b6c7c053c\amd64\okdteres.dll
\Windows\system32\driverstore\filerepository\
prnod002.inf_amd64_neutral_a
10c656b6c7c053c\amd64\okmlivu.gpd
\Windows\system32\driverstore\filerepository\
prnok002.inf_amd64_neutral_6
16c1e967df7d5a9\amd64\okdteres.dll
\Windows\system32\driverstore\filerepository\
prnok002.inf_amd64_neutral_6
16c1e967df7d5a9\amd64\okmlivu.gpd
\Windows\system32\driverstore\filerepository\
prnrc00a.inf_amd64_neutral_5
65c5d04cc520c48\amd64\ricfg7.xml
\Windows\system32\driverstore\filerepository\
prnrc00c.inf_amd64_neutral_5
3a58f4fd7d88575\amd64\ricfg7.xml
\Windows\system32\driverstore\filerepository\
wiabr002.inf_amd64_neutral_b
4ea26a49ad66560\brmf3wia.dll
\Windows\system32\driverstore\filerepository\
wiabr002.inf_amd64_neutral_b
4ea26a49ad66560\brus2sti.dll
\Windows\system32\driverstore\filerepository\
wiabr004.inf_amd64_neutral_b
1d90b3749c5e6a6\brmf3wia.dll
\Windows\system32\driverstore\filerepository\
wiabr004.inf_amd64_neutral_b
1d90b3749c5e6a6\brus2sti.dll
\Windows\system32\driverstore\filerepository\
wiabr005.inf_amd64_neutral_e
14a0514f37611d8\brmf3wia.dll
\Windows\system32\driverstore\filerepository\
wiabr005.inf_amd64_neutral_e
14a0514f37611d8\brus2sti.dll
\Windows\system32\driverstore\filerepository\
wiabr006.inf_amd64_neutral_0
232ca4f23224d01\brmf3wia.dll
\Windows\system32\driverstore\filerepository\
wiabr006.inf_amd64_neutral_0
232ca4f23224d01\brus2sti.dll
\Windows\system32\driverstore\filerepository\
wiabr007.inf_amd64_neutral_4
42d902f3f3dd5b7\brmf3wia.dll
\Windows\system32\driverstore\filerepository\
wiabr007.inf_amd64_neutral_4
42d902f3f3dd5b7\brus2sti.dll
\Windows\system32\driverstore\filerepository\
wiabr008.inf_amd64_neutral_2
7d1c9a28eac4eed\brmf3wia.dll \Windows\system32\driverstore\filerepository\
wiabr008.inf_amd64_neutral_2
7d1c9a28eac4eed\brus2sti.dll
\Windows\system32\driverstore\filerepository\
wiabr009.inf_amd64_neutral_2
d7b3edfda95df40\brmf3wia.dll
\Windows\system32\driverstore\filerepository\
wiabr009.inf_amd64_neutral_2
d7b3edfda95df40\brus2sti.dll
\Windows\system32\driverstore\filerepository\
wiabr00a.inf_amd64_neutral_6
033065925bcc882\brmf3wia.dll
\Windows\system32\driverstore\filerepository\
wiabr00a.inf_amd64_neutral_6
033065925bcc882\brus2sti.dll
\Windows\system32\driverstore\filerepository\
wiaca00a.inf_amd64_neutral_1
63313056d8f34ab\cnhi07a.dll
\Windows\system32\driverstore\filerepository\
wiaca00a.inf_amd64_neutral_1
63313056d8f34ab\cnhw07a.dll
\Windows\system32\driverstore\filerepository\
wiaca00b.inf_amd64_neutral_1
aaa057d3d52ea43\cnhi07a.dll
\Windows\system32\driverstore\filerepository\
wiaca00b.inf_amd64_neutral_1
aaa057d3d52ea43\cnhi08a.dll
\Windows\system32\driverstore\filerepository\
wiaca00b.inf_amd64_neutral_1
aaa057d3d52ea43\cnh108a.dll
\Windows\system32\driverstore\filerepository\
wiaca00b.inf_amd64_neutral_1
aaa057d3d52ea43\cnhmca.dll
\Windows\system32\driverstore\filerepository\
wiaca00b.inf_amd64_neutral_1
aaa057d3d52ea43\cnhmca6.dll
\Windows\system32\driverstore\filerepository\
wiaca00b.inf_amd64_neutral_1
aaa057d3d52ea43\cnhw07a.dll
\Windows\system32\driverstore\filerepository\
wiaca00b.inf_amd64_neutral_1
aaa057d3d52ea43\cnhw08a.dll
\Windows\system32\driverstore\filerepository\
wiaca00c.inf_amd64_neutral_2
7f4ad26fea72eb1\cnhi06a.dll
\Windows\system32\driverstore\filerepository\
wiaca00c.inf_amd64_neutral_2
7f4ad26fea72eb1\cnhi07a.dll
\Windows\system32\driverstore\filerepository\
wiaca00c.inf_amd64_neutral_2
7f4ad26fea72eb1\cnhw06a.dll
\Windows\system32\driverstore\filerepository\
wiaca00c.inf_amd64_neutral_2
7f4ad26fea72eb1\cnhw07a.dll
\Windows\system32\driverstore\filerepository\
wiaca00d.inf_amd64_neutral_2
c3623fa97b0c28e\cnhi06a.dll
\Windows\system32\driverstore\filerepository\
wiaca00d.inf_amd64_neutral_2
c3623fa97b0c28e\cnhw06a.dll
\Windows\system32\driverstore\filerepository\
wiaca00e.inf_amd64_neutral_5
a376e6a7cb007d5\cnhi06a.dll
\Windows\system32\driverstore\filerepository\
wiaca00e.inf_amd64_neutral_5
a376e6a7cb007d5\cnhw06a.dll
\Windows\system32\driverstore\filerepository\
wiaca00finf_amd64_neutral_f
7f7e179d99acc58\cnhi06a.dll
\Windows\system32\driverstore\filerepository\
wiaca00finf_amd64_neutral_f
7f7e179d99acc58\cnhw06a.dll
\Windows\system32\driverstore\filerepository\
wiaca00i.inf_amd64_neutral_d
e104aaa48ee4b00\cnhi08a.dll
\Windows\system32\driverstore\filerepository\
wiaca00i.inf_amd64_neutral_d
e104aaa48ee4b00\cnh108a.dll
\Windows\system32\driverstore\filerepository\
wiaca00i.inf_amd64_neutral_d
e104aaa48ee4b00\cnhmca.dll
\Windows\system32\driverstore\filerepository\
wiaca00i.inf_amd64_neutral_d
e104aaa48ee4b00\cnhmca6.dll
\Windows\system32\driverstore\filerepository\
wiaca00i.inf_amd64_neutral_d
e104aaa48ee4b00\cnhw08a.dll
\Windows\system32\el-gr\comct132.dll.mui
\Windows\system32\en-us\comct132.dll.mui
\Windows\system32\es-es\comct132.dll.mui
\Windows\system32\et-ee\comct132.dll.mui
\Windows\system32\fi-fi\comct132.dll.mui
\Windows\system32\fr-fr\comct132.dll.mui
\Windows\system32\fvecpl.dll
\Windows\system32\fverecover.dll
\Windows\system32\fveui.dll
\Windows\system32\fvewiz.dll
\Windows\system32\fwpuclnt.dll
\Windows\system32\fwremotesvr.dll
\Windows\system32\gacinstall.dll
\Windows\system32\gameux.dll
\Windows\system32\gameuxlegacygdfs.dll
\Windows\system32\gathernetworkinfo.vbs
\Windows\system32\gb2312.uce
\Windows\system32\gcdef.dll
\Windows\system32\gdi.exe
\Windows\system32\gdi32.dll
\Windows\system32\getmac.exe
\Windows\system32\gpapi.dll
\Windows\system32\gpsvc.dll
\Windows\system32\grouppolicy\gpt.ini
\Windows\system32\grpconv.exe
\Windows\system32\hal.dll
\Windows\system32\halacpi.dll
\Windows\system32\halmacpi.dll
\Windows\system32\hbaapi.dll
\Windows\system32\hcproviders.dll
\Windows\system32\hdwwiz.cpl
\Windows\system32\hdwwiz.exe
\Windows\system32\cdosys.dll.mui
\Windows\system32\comct132.dll.mui
\Windows\system32\he-il\comdlg32.dll.mui
\Windows\system32\he-il\fms.dll.mui
\Windows\system32
\Windows\system32\he-il\msimsg.dll.mui
\Windows\system32\he-il\msprivs.dll.mui
\Windows\system32\hhctrl.ocx
\Windows\system32\hhsetup.dll
\Windows\system32\hid.dll
\Windows\system32\hidserv.dll
\Windows\system32\hostname.exe
\Windows\system32\hr-hr\comct132.dll.mui
\Windows\system32\hr-hr\comdlg32.dll.mui \Windows\system32\hr-hr\fms.dll.mui
\Windows\system32\hr-hr\mlang.dll.mui
\Windows\system32\hr-hr\msimsg.dll.mui
\Windows\system32\hu-hu\comct132.dll.mui
\Windows\system32\iasmigplugin.dll
\Windows\system32\icfupgd.dll
\Windows\system32\icmp.dll
\Windows\system32\idndl.dll
\Windows\system32\iertutil.dll
\Windows\system32\ifmon.dll
\Windows\system32\ifsutil.dll
\Windows\system32\ifsutilx.dll
\Windows\system32\ikeext.dll
\Windows\system32\imagehlp.dll
\Windows\system32\imageres.dll
\Windows\system32\imagesp1.dll
\Windows\system32\imapi.dll
\Windows\system32\imapi2.dll
\Windows\system32\imapi2fs.dll
\Windows\system32\imm32.dll
\Windows\system32\inetmibl.dll
\Windows\system32\input.dll
\Windows\system32\ipconfig.exe
\Windows\system32\iphlpapi.dll
\Windows\system32\ipsecsvc.dll
\Windows\system32\it-it\comct132.dll.mui
\Windows\system32\ja-jp\comct132.dll.mui
\Windows\system32\jnwmon.dll
\Windows\system32\kbd101.dll
\Windows\system32\kbd101a.dll
\Windows\system32\kbd101b.dll
\Windows\system32\kbd101c.dll
\Windows\system32\kbd103.dll
\Windows\system32\kbd106.dll
\Windows\system32\kbd106n.dll
\Windows\system32\kbdal.dll
\Windows\system32\kbda2.dll
\Windows\system32\kbda3.dll
\Windows\system32\kbdal.dll
\Windows\system32\kbdarme.dll
\Windows\system32\kbdarmw.dll
\Windows\system32\kbdax2.dll
\Windows\system32\kbdaze.dll
\Windows\system32\kbdazel.dll
\Windows\system32\kbdbash.dll
\Windows\system32\kbdbe.dll
\Windows\system32\kbdbene.dll
\Windows\system32\kbdbgph.dll
\Windows\system32\kbdbgph1.dll
\Windows\system32\kbdbhc.dll
\Windows\system32\kbdblr.dll
\Windows\system32\kbdbr.dll
\Windows\system32\kbdbu.dll
\Windows\system32\kbdbulg.dll
\Windows\system32\kbdca.dll
\Windows\system32\kbdcan.dll
\Windows\system32\kbdcr.dll
\Windows\system32\kbdcz.dll
\Windows\system32\kbdcz1.dll
\Windows\system32\kbdcz2.dll
\Windows\system32\kbdda.dll
\Windows\system32\kbddiv1.dll
\Windows\system32\kbddiv2.dll
\Windows\system32\kbddv.dll
\Windows\system32\kbdes.dll
\Windows\system32\kbdest.dll
\Windows\system32\kbdfa.dll
\Windows\system32\kbdfc.dll
\Windows\system32\kbdfi.dll
\Windows\system32\kbdfi1.dll
\Windows\system32\kbdfo.dll
\Windows\system32\kbdfr.dll
\Windows\system32\kbdgae.dll
\Windows\system32\kbdgeo.dll
\Windows\system32\kbdgeoer.dll
\Windows\system32\kbdgeoqw.dll
\Windows\system32\kbdgkl.dll
\Windows\system32\kbdgr.dll
\Windows\system32\kbdgr1.dll
\Windows\system32\kbdgrind.dll
\Windows\system32\kbdhau.dll
\Windows\system32\kbdhe.dll
\Windows\system32\kbdhe220.dll
\Windows\system32\kbdhe319.dll
\Windows\system32\kbdheb.dll
\Windows\system32\kbdhela2.dll
\Windows\system32\kbdhela3.dll
\Windows\system32\kbdhept.dll
\Windows\system32\kbdhu.dll
\Windows\system32\kbdhu1.dll
\Windows\system32\kbdibm02.dll
\Windows\system32\kbdibo.dll
\Windows\system32\kbdic.dll
\Windows\system32\kbdinasa.dll
\Windows\system32\kbdinbe1.dll
\Windows\system32\kbdinbe2.dll
\Windows\system32\kbdinben.dll
\Windows\system32\kbdindev.dll
\Windows\system32\kbdinguj.dll
\Windows\system32\kbdinhin.dll
\Windows\system32\kbdinkan.dll
\Windows\system32\kbdinmal.dll
\Windows\system32\kbdinman.dll
\Windows\system32\kbdinori.dll
\Windows\system32\kbdinpun.dll
\Windows\system32\kbdintam.dll
\Windows\system32\kbdintel.dll
\Windows\system32\kbdinuk2.dll
\Windows\system32\kbdir.dll
\Windows\system32\kbdit.dll
\Windows\system32\kbdit142.dll
\Windows\system32\kbdiulat.dll
\Windows\system32\kbdjpn.dll
\Windows\system32\kbdkaz.dll
\Windows\system32\kbdkhmr.dll
\Windows\system32\kbdkor.dll
\Windows\system32\kbdkyr.dll
\Windows\system32\kbdla.dll
\Windows\system32\kbdlao.dll
\Windows\system32\kbd1k41a.dll
\Windows\system32\kbdlt.dll
\Windows\system32\kbdlt1.dll
\Windows\system32\kbd1t2.dll
\Windows\system32\kbd1v.dll
\Windows\system32\kbd1v1.dll
\Windows\system32\kbdmac.dll
\Windows\system32\kbdmacst.dll
\Windows\system32\kbdmaori.dll
\Windows\system32\kbdm1t47.dll
\Windows\system32\kbdm1t48.dll
\Windows\system32\kbdmon.dll
\Windows\system32\kbdmonmo.dll
\Windows\system32\kbdne.dll
\Windows\system32\kbdnec.dll \Windows\system32\kbdnec95.dll
\Windows\system32\kbdnecat.dll
\Windows\system32\kbdnecnt.dll
\Windows\system32\kbdnepr.dll
\Windows\system32\kbdno.dll
\Windows\system32\kbdnol.dll
\Windows\system32\kbdnso.dll
\Windows\system32\kbdpash.dll
\Windows\system32\kbdpl.dll
\Windows\system32\kbdpl1.dll
\Windows\system32\kbdpo.dll
\Windows\system32\kbdro.dll
\Windows\system32\kbdropr.dll
\Windows\system32\kbdrost.dll
\Windows\system32\kbdru.dll
\Windows\system32\kbdru1.dll
\Windows\system32\kbdsf.dll
\Windows\system32\kbdsg.dll
\Windows\system32\kbdsl.dll
\Windows\system32\kbdsl1.dll
\Windows\system32\kbdsmsfi.dll
\Windows\system32\kbdsmsno.dll
\Windows\system32\kbdsn1.dll
\Windows\system32\kbdsorex.dll
\Windows\system32\kbdsors1.dll
\Windows\system32\kbdsorst.dll
\Windows\system32\kbdsp.dll
\Windows\system32\kbdsw.dll
\Windows\system32\kbdsw09.dll
\Windows\system32\kbdsyr1.dll
\Windows\system32\kbdsyr2.dll
\Windows\system32\kbdtajik.dll
\Windows\system32\kbdtat.dll
\Windows\system32\kbdth0.dll
\Windows\system32\kbdth1.dll
\Windows\system32\kbdth2.dll
\Windows\system32\kbdth3.dll
\Windows\system32\kbdtiprc.dll
\Windows\system32\kbdtuf.dll
\Windows\system32\kbdtuq.dll
\Windows\system32\kbdturme.dll
\Windows\system32\kbdughr.dll
\Windows\system32\kbdughr1.dll
\Windows\system32\kbduk.dll
\Windows\system32\kbdukx.dll
\Windows\system32\kbdur.dll
\Windows\system32\kbdur1.dll
\Windows\system32\kbdurdu.dll
\Windows\system32\kbdus.dll
\Windows\system32\kbdusa.dll
\Windows\system32\kbdusl.dll
\Windows\system32\kbdusr.dll
\Windows\system32\kbdusx.dll
\Windows\system32\kbduzb.dll
\Windows\system32\kbdvntc.dll
\Windows\system32\kbdwol.dll
\Windows\system32\kbdyak.dll
\Windows\system32\kbdyba.dll
\Windows\system32\kbdycc.dll
\Windows\system32\kbdycl.dll
\Windows\system32\kd1394.dll
\Windows\system32\kdcom.dll
\Windows\system32\kdusb.dll
\Windows\system32\kerberos.dll
\Windows\system32\kerne132.dll
\Windows\system32\kernelbase.dll
\Windows\system32\kernelceip.dll
\Windows\system32\key01.sys
\Windows\system32\keyboard.dry
\Windows\system32\keyboard.sys
\Windows\system32\keyiso.dll
\Windows\system32\keymgr.dll
\Windows\system32\klist.exe
\Windows\system32\kmddsp.tsp
\Windows\system32\ko-kr\comct132.dll.mui
\Windows\system32\l_intl.nls
\Windows\system32\lmhsvc.dll
\Windows\system32\loadperf.dll
\Windows\system32\locale.nls
\Windows\system32\localsec.dll
\Windows\system32\localspl.dll
\Windows\system32\localui.dll
\Windows\system32\locationapi.dll
\Windows\system32\locationnotifications.exe
\Windows\system32\locationnotificationsview.xml
\Windows\system32\locatonexe
\Windows\system32\lodctr.exe
\Windows\system32\logfiles\scm\044a6734-e90e-4f8f-b357-b2dc8ab3b5ec
\Windows\system32\logfiles\scm\0b5b654b-8ce2-4852-b8f4-12312c5641ff
\Windows\system32\logfiles\scm\2470470f-2634-478e-b181-571e98a789bb
\Windows\system32\logfiles\scm\2c59ecaf-3a27-4640-9f4b-519b05bdd70f
\Windows\system32\logfiles\scm\2edebld8-1155-4576-a5d4-c0b8cbc586ca
\Windows\system32\logfiles\scm\3579a7f5-949f-41ea-9960-2b622a567a5a
\Windows\system32\logfiles\scm\367f930a-a3db-4112-b1f1-50e92a171c88
\Windows\system32 Vogfiles\scm\4040e761-8758-4007-b2fe-142b24bf4b16
\Windows\system32\logfiles\scm\456362c8-eb0e-46d7-9fc0-68fc75b4cd23
\Windows\system32\logfiles\scm\47536d45-eeec-4bdc-8183-a4dc1f8da9e4
\Windows\system32\logfiles\scm\4c8b01a2-11ff-4c41-848f-508ef4f00cf7
\Windows\system32\logfiles\scm\50fb5a03-0e1e-48de-b8al-bee9d7d2cd0f
\Windows\system32\logfiles\scm\57639e54-4fcc-4816-8a6a-e37920b0adcf
\Windows\system32 Vogfiles\scm\5b184694-64c3-4633-94c5-945b3fa561d6
\Windows\system32\logfiles\scm\5c0aeeea-c154-45be-8499-bea5f1lbaff6
\Windows\system32\logfiles\scm\5c2c622f-70e9-4194-a7da-033e827365ad
\Windows\system32\logfiles\scm\5f5a18eb-dc73-4e45-a11c-b59043598412
\Windows\system32\logfiles\scm\7afcc0ca-7121-422a-ab45-b0e8d599ff08
\Windows\system32\logfiles\scm\7bccbdla-0e4f-4a67-94fd-d41f1b6307a1
\Windows\system32\logfiles\scm\994c86ad-a929-4b2c-88a0-4e25a107a029
\Windows\system32 Vogfiles\scm\a7c73732-9f11-4281-8d19-764d4ec9d94d
\Windows\system32\logfiles\scm\ac4e5acf-89f7-4220-ba21-81ee183975e2
\Windows\system32\logfiles\scm\be669c13-8165-4536-96d0-6d6c39292aae \Windows\system32\logfiles\scm\c016366b-7126-46ca-b36b-592a3d95a60b
\Windows\system32\logfiles\scm\ca4b8ff2-a4d2-4d88-a52e-3a5bdaf7f56e
\Windows\system32\logfiles\scm\d0250f3f-6480-484f-b719-42f659ac64d5
\Windows\system32\logfiles\scm\d7b6e81d-3cf4-432c-84d2-24213f4316e6
\Windows\system32\logfiles\scm\d9405ccd-ec08-485f-a710-962c18f3c104
\Windows\system32\logfiles\scm\da41de71-8431-42fb-9db0-eb64a961dead
\Windows\system32\logfiles\scm\eaca24ff-236c-401d-a1e7-b3d5267b8a50
\Windows\system32\logfiles\scm\eb02381f-d652-4b1c-894a-712498c62c51
\Windows\system32\logfiles\scm\fb3c354d-297a-4eb2-9b58-090f6361906b
\Windows\system32\logfiles\scm\fdd56c73-f0d5-41b6-b767-6effd7966428
\Windows\system32\logfiles\wmi\rtbackup\etwrtdiaglog.etl
\Windows\system32\logfiles\wmi\rtbackup\etwrteventlog-application.etl
\Windows\system32\logfiles\wmi\rtbackup\etwrteventlog-security.etl
\Windows\system32\logfiles\wmi\rtbackup\etwrteventlog-system.etl
\Windows\system32\logfiles\wmi\rtbackup\etwrtmsmppssession7.etl
\Windows\system32\logfiles\wmi\rtbackup\etwrtubpm.etl
\Windows\system32\logoncli.dll
\Windows\system32\logonui.exe
\Windows\system32\lpk.dll
\Windows\system32\lsasrv.dll
\Windows\system32\lsass.exe
\Windows\system32\lsm.exe
\Windows\system32\lt-lt\comct132.dll.mui
\Windows\system32\lv-lv\comct132.dll.mui
\Windows\system32\lv-lv\msimsg.dll.mui
\Windows\system32\lz32.dll
\Windows\system32\manage-bde.exe
\Windows\system32\manage-bde.wsf
\Windows\system32\mapi32.dll
\Windows\system32\mapistub.dll
\Windows\system32\mcbuilder.exe
\Windows\system32\mcupdate_authenticamd.dll
\Windows\system32\mcupdate_genuineintel.dll
\Windows\system32\Microsoft-Windows-hal-events.dll
\Windows\system32\migration\cntrtextmig.dll
\Windows\system32\migration\nlscoremig.dll
\Windows\system32\migration\stormigplugin.dll
\Windows\system32\migration\wmimigrationplugin.dll
\Windows\system32\migwiz\dlmanifests\Microsoft-Windows-iasserver-migplugin\iasmigplugin.dll
\Windows\system32\migwiz\dlmanifests\Microsoft-Windows-international-core-dl\nlscoremig.dll
\Windows\system32\migwiz\dlmanifests\Microsoft-Windows-msmq-messagingcoreservice\mqmigplugin.dll
\Windows\system32\migwiz\dlmanifests\Microsoft-Windows-performancecounterinfrastructure-dl\cntrtextmig.dll
\Windows\system32\migwiz\dlmanifests\Microsoft-Windows-storagemigration\stormigplugin.dll
\Windows\system32\migwiz\dlmanifests\Microsoft-Windows-wmi-core\wmimigrationplugin.dll
\Windows\system32\more.com
\Windows\system32\mountvol.exe
\Windows\system32\mpr.dll
\Windows\system32\mprapi.dll
\Windows\system32\mprmsg.dll
\Windows\system32\mpssvc.dll
\Windows\system32\mrinfo.exe
\Windows\system32\msafd.dll
\Windows\system32\msasn1.dll
\Windows\system32\mscat32.dll
\Windows\system32\mscpx132.dll
\Windows\system32\msctf.dll
\Windows\system32\msdelta.dll
\Windows\system32\msdtc\msdtc.log
\Windows\system32\msdtc\trace\dtctrace.log
\Windows\system32\msdtc\trace\dtctrace.log.2016-04-25-20-31-20-0434-00
\Windows\system32\msdtc\trace\dtctrace.log.2016-04-27-22-28-47-0678-00
\Windows\system32\msdtc\trace\dtctrace.log.2016-05-07-00-38-07-0886-00
\Windows\system32\msdtc\trace\dtctrace.log.2016-05-07-00-39-52-0089-00
\Windows\system32\msdtc\trace\dtctrace.log.2016-05-07-00-41-38-0307-00
\Windows\system32\msdtc\trace\dtctrace.log.2016-05-07-00-43-25-0777-00
\Windows\system32\msdtc\trace\dtctrace.log.2016-05-07-00-45-12-0097-00
\Windows\system32\msdtc\trace\dtctrace.log.2016-05-07-00-46-54-0280-00
\Windows\system32\msdtc\trace\dtctrace.log.2016-05-07-00-48-37-0854-00
\Windows\system32\msdtc\trace\dtctrace.log.2016-05-07-00-50-19-0875-00
\Windows\system32\msdtc\trace\dtctrace.log.2016-05-07-00-52-06-0425-00
\Windows\system32\msdtc\trace\dtctrace.log.2016-05-08-14-44-55-0571-00
\Windows\system32\msdtc\trace\dtctrace.log.2016-05-08-14-47-13-0072-00
\Windows\system32\msdtc\trace\dtctrace.log.2016-05-08-14-49-32-0947-00
\Windows\system32\msdtc\trace\dtctrace.log.2016-05-08-14-51-53-0103-00
\Windows\system32\msdtc\trace\dtctrace.log.2016-05-08-14-54-08-0242-00
\Windows\system32\msdtc\trace\dtctrace.log.2016-05-08-14-56-27-0606-00
\Windows\system32\msdtc\trace\dtctrace.log.2016-05-08-14-58-46-0357-00
\Windows\system32\msdtc\trace\dtctrace.log.2016-05-08-15-01-03-0908-00
\Windows\system32\msdtc\trace\dtctrace.log.2016-05-08-15-03-24-0108-00
\Windows\system32\msdtc\trace\dtctrace.log.2016-05-08-15-05-42-0123-00
\Windows\system32\msdtc\trace\dtctrace.log.2016-05-08-15-08-03-0143-00
\Windows\system32\msdtc\trace\dtctrace.log.2016-05-08-15-10-12-0406-00
\Windows\system32\msdtc\trace\dtctrace.log.2016-05-08-15-12-21-0082-00
\Windows\system32\msdtc\trace\dtctrace.log.2016-05-08-15-14-33-0047-00
\Windows\system32\msdtc\trace\dtctrace.log.2016-05-08-15-16-43-0240-00
\Windows\system32\msdtc\trace\dtctrace.log.2016-05-08-15-18-53-0406-00

\Windows\system32\msdtc\trace\dtctrace.log.2016-05-08-15-21-03-0998-00
\Windows\system32\msdtc\trace\dtctrace.log.2016-05-08-15-23-15-0811-00
\Windows\system32\msdtc\trace\dtctrace.log.2016-05-08-15-25-26-0074-00
\Windows\system32\msdtc\trace\dtctrace.log.2016-05-08-15-27-36-0706-00
\Windows\system32\msdtc\trace\dtctrace.log.2016-05-08-15-29-46-0357-00
\Windows\system32\msdtc\trace\dtctrace.log.2016-05-08-15-31-57-0281-00
\Windows\system32\msdtc\trace\dtctrace.log.2016-05-08-15-34-07-0212-00
\Windows\system32\msdtc\trace\dtctrace.log.2016-05-08-15-36-18-0452-00
\Windows\system32\msdtc\trace\dtctrace.log.2016-05-08-15-38-28-0421-00
\Windows\system32\msdtc\trace\dtctrace.log.2016-05-08-15-40-39-0165-00
\Windows\system32\msdtc\trace\dtctrace.log.2016-05-08-15-42-48-0296-00
\Windows\system32\msdtc\trace\dtctrace.log.2016-05-08-15-44-58-0156-00
\Windows\system32\msdtc\trace\dtctrace.log.2016-05-08-15-47-10-0343-00
\Windows\system32\msdtc\trace\dtctrace.log.2016-05-08-15-49-21-0312-00
\Windows\system32\msdtc\trace\dtctrace.log.2016-05-08-15-51-33-0437-00
\Windows\system32\msdtc\trace\dtctrace.log.2016-05-08-15-53-44-0296-00
\Windows\system32\msdtc\trace\dtctrace.log.2016-05-08-15-55-54-0296-00
\Windows\system32\msdtc\trace\dtctrace.log.2016-05-08-15-58-04-0689-00
\Windows\system32\msdtc\trace\dtctrace.log.2016-05-08-16-00-14-0406-00
\Windows\system32\msdtc\trace\dtctrace.log.2016-05-08-16-02-27-0296-00
\Windows\system32\msdtc\trace\dtctrace.log.2016-05-08-16-04-39-0183-00
\Windows\system32\msdtc\trace\dtctrace.log.2016-05-08-16-06-51-0232-00
\Windows\system32\msdtc\trace\dtctrace.log.2016-05-08-16-09-02-0969-00
\Windows\system32\msdtc\trace\dtctrace.log.2016-05-08-16-11-15-0298-00
\Windows\system32\msdtc\trace\dtctrace.log.2016-05-08-16-13-30-0166-00
\Windows\system32\msdtc\trace\dtctrace.log.2016-05-08-16-15-41-0328-00
\Windows\system32\msdtc\trace\dtctrace.log.2016-05-08-16-17-51-0437-00
\Windows\system32\msdtc\trace\dtctrace.log.2016-05-08-16-20-05-0328-00
\Windows\system32\msdtc\trace\dtctrace.log.2016-05-08-16-22-17-0281-00
\Windows\system32\msdtc\trace\dtctrace.log.2016-05-08-16-24-29-0328-00
\Windows\system32\msdtc\trace\dtctrace.log.2016-05-08-16-26-42-0324-00
\Windows\system32\msdtc\trace\dtctrace.log.2016-05-08-16-28-54-0343-00
\Windows\system32\msdtc\trace\dtctrace.log.2016-05-08-16-31-07-0328-00
\Windows\system32\msdtc\trace\dtctrace.log.2016-05-08-16-33-20-0484-00
\Windows\system32\msdtc\trace\dtctrace.log.2016-05-08-16-35-34-0791-00
\Windows\system32\msdtc\trace\dtctrace.log.2016-05-08-16-37-48-0919-00
\Windows\system32\msdtc\trace\dtctrace.log.2016-05-08-16-40-06-0398-00
\Windows\system32\msdtc\trace\dtctrace.log.2016-05-08-16-42-17-0468-00
\Windows\system32\msdtc\trace\dtctrace.log.2016-05-08-16-44-29-0234-00
\Windows\system32\msdtc\trace\dtctrace.log.2016-05-08-16-46-46-0375-00
\Windows\system32\msdtc\trace\dtctrace.log.2016-05-08-16-49-00-0283-00
\Windows\system32\msdtc\trace\dtctrace.log.2016-05-08-16-51-14-0281-00
\Windows\system32\msdtc\trace\dtctrace.log.2016-05-08-16-53-30-0186-00
\Windows\system32\msdtc\trace\dtctrace.log.2016-05-08-16-55-43-0840-00
\Windows\system32\msdtc\trace\dtctrace.log.2016-05-08-16-57-57-0864-00
\Windows\system32\msdtc\trace\dtctrace.log.2016-05-08-17-00-12-0096-00
\Windows\system32\msdtc\trace\dtctrace.log.2016-05-08-17-02-28-0452-00
\Windows\system32\msdtc\trace\dtctrace.log.2016-05-08-17-04-45-0281-00
\Windows\system32\msdtc\trace\dtctrace.log.2016-05-08-17-07-01-0437-00
\Windows\system32\msdtc\trace\dtctrace.log.2016-05-08-17-09-21-0343-00
\Windows\system32\msdtc\trace\dtctrace.log.2016-05-08-17-11-37-0374-00
\Windows\system32\msdtc\trace\dtctrace.log.2016-05-08-17-13-53-0452-00
\Windows\system32\msdtc\trace\dtctrace.log.2016-05-08-17-16-09-0250-00
\Windows\system32\msdtc\trace\dtctrace.log.2016-05-08-17-18-27-0172-00
\Windows\system32\msdtc\trace\dtctrace.log.2016-05-08-17-20-42-0499-00
\Windows\system32\msdtc\trace\dtctrace.log.2016-05-08-17-22-59-0250-00
\Windows\system32\msdtc\trace\dtctrace.log.2016-05-08-17-25-16-0312-00
\Windows\system32\msdtc\trace\dtctrace.log.2016-05-08-17-27-32-0624-00
\Windows\system32\msdtc\trace\dtctrace.log.2016-05-08-17-29-48-0766-00
\Windows\system32\msdtc\trace\dtctrace.log.2016-05-08-17-32-04-0008-00
\Windows\system32\msdtc\trace\dtctrace.log.2016-05-08-17-34-19-0938-00
\Windows\system32\msdtc\trace\dtctrace.log.2016-05-08-17-36-37-0020-00
\Windows\system32\msdtc\trace\dtctrace.log.2016-05-08-17-38-54-0911-00
\Windows\system32\msdtc\trace\dtctrace.log.2016-05-08-17-41-15-0354-00
\Windows\system32\msdtc\trace\dtctrace.log.2016-05-08-17-43-32-0374-00
\Windows\system32\msdtc\trace\dtctrace.log.2016-05-08-17-45-49-0359-00

\Windows\system32\msdtc\trace\dtctrace.log.2016-05-08-17-48-05-0187-00
\Windows\system32\msdtc\trace\dtctrace.log.2016-05-08-17-50-25-0046-00
\Windows\system32\msdtc\trace\dtctrace.log.2016-05-08-17-52-42-0125-00
\Windows\system32\msdtc\trace\dtctrace.log.2016-05-08-17-54-59-0328-00
\Windows\system32\msdtc\trace\dtctrace.log.2016-05-08-17-57-17-0234-00
\Windows\system32\msdtc\trace\dtctrace.log.2016-05-08-17-59-35-0261-00
\Windows\system32\msdtc\trace\dtctrace.log.2016-05-08-18-01-54-0919-00
\Windows\system32\msdtc\trace\dtctrace.log.2016-05-08-18-04-13-0968-00
\Windows\system32\msdtc\trace\dtctrace.log.2016-05-08-18-06-34-0188-00
\Windows\system32\msdtc\trace\dtctrace.log.2016-05-08-18-08-52-0961-00
\Windows\system32\msdtc\trace\dtctrace.log.2016-05-08-18-11-13-0198-00
\Windows\system32\msdtc\trace\dtctrace.log.2016-05-08-18-13-31-0583-00
\Windows\system32\msdtc\trace\dtctrace.log.2016-05-08-18-15-51-0234-00
\Windows\system32\msdtc\trace\dtctrace.log.2016-05-08-18-18-11-0604-00
\Windows\system32\msdtc\trace\dtctrace.log.2016-05-08-18-20-31-0945-00
\Windows\system32\msdtc\trace\dtctrace.log.2016-05-08-18-22-51-0358-00
\Windows\system32\msdtc\trace\dtctrace.log.2016-05-08-18-25-11-0421-00
\Windows\system32\msdtc\trace\dtctrace.log.2016-05-08-18-27-30-0975-00
\Windows\system32\msdtc\trace\dtctrace.log.2016-05-08-18-29-53-0962-00
\Windows\system32\msdtc\trace\dtctrace.log.2016-05-08-18-32-14-0076-00
\Windows\system32\msdtc\trace\dtctrace.log.2016-05-08-18-34-35-0260-00
\Windows\system32\msdtc\trace\dtctrace.log.2016-05-08-18-36-55-0374-00
\Windows\system32\msdtc\trace\dtctrace.log.2016-05-08-18-39-15-0761-00
\Windows\system32\msdtc\trace\dtctrace.log.2016-05-08-18-41-37-0054-00
\Windows\system32\msdtc\trace\dtctrace.log.2016-05-08-18-43-57-0047-00
\Windows\system32\msdtc\trace\dtctrace.log.2016-05-08-18-46-20-0257-00
\Windows\system32\msdtc\trace\dtctrace.log.2016-05-08-18-48-40-0002-00
\Windows\system32\msdtc\trace\dtctrace.log.2016-05-08-18-51-05-0103-00
\Windows\system32\msdtc\trace\dtctrace.log.2016-05-08-18-53-27-0512-00
\Windows\system32\msdtc\trace\dtctrace.log.2016-05-08-18-55-48-0437-00
\Windows\system32\msdtc\trace\dtctrace.log.2016-05-08-18-58-12-0778-00
\Windows\system32\msdtc\trace\dtctrace.log.2016-05-08-19-00-33-0375-00
\Windows\system32\msdtc\trace\dtctrace.log.2016-05-08-19-02-56-0655-00
\Windows\system32\msdtc\trace\dtctrace.log.2016-05-08-19-05-18-0296-00
\Windows\system32\msdtc\trace\dtctrace.log.2016-05-08-19-07-39-0203-00
\Windows\system32\msdtc\trace\dtctrace.log.2016-05-08-19-10-01-0842-00
\Windows\system32\msdtc\trace\dtctrace.log.2016-05-08-19-12-24-0191-00
\Windows\system32\msdtc\trace\dtctrace.log.2016-05-08-19-14-47-0909-00
\Windows\system32\msdtc\trace\dtctrace.log.2016-05-08-19-17-11-0090-00
\Windows\system32\msdtc\trace\dtctrace.log.2016-05-08-19-19-33-0229-00
\Windows\system32\msdtc\trace\dtctrace.log.2016-05-08-19-21-56-0305-00
\Windows\system32\msdtc\trace\dtctrace.log.2016-05-08-19-24-21-0918-00
\Windows\system32\msdtc\trace\dtctrace.log.2016-05-08-19-26-46-0332-00
\Windows\system32\msdtc\trace\dtctrace.log.2016-05-08-19-29-07-0359-00
\Windows\system32\msdtc\trace\dtctrace.log.2016-05-08-19-31-29-0203-00
\Windows\system32\msdtc\trace\dtctrace.log.2016-05-08-19-33-53-0686-00
\Windows\system32\msdtc\trace\dtctrace.log.2016-05-08-19-36-17-0468-00
\Windows\system32\msdtc\trace\dtctrace.log.2016-05-08-19-38-41-0959-00
\Windows\system32\msdtc\trace\dtctrace.log.2016-05-08-19-41-05-0154-00
\Windows\system32\msdtc\trace\dtctrace.log.2016-05-08-19-43-30-0328-00
\Windows\system32\msdtc\trace\dtctrace.log.2016-05-08-19-45-55-0359-00
\Windows\system32\msdtc\trace\dtctrace.log.2016-05-08-19-48-18-0484-00
\Windows\system32\msdtc\trace\dtctrace.log.2016-05-08-19-50-43-0452-00
\Windows\system32\msdtc\trace\dtctrace.log.2016-05-08-19-53-09-0160-00
\Windows\system32\msdtc\trace\dtctrace.log.2016-05-08-19-55-36-0186-00
\Windows\system32\msdtc\trace\dtctrace.log.2016-05-08-19-58-00-0213-00
\Windows\system32\msdtc\trace\dtctrace.log.2016-05-08-20-00-24-0328-00
\Windows\system32\msdtc\trace\dtctrace.log.2016-05-08-20-02-49-0156-00
\Windows\system32\msdtc\trace\dtctrace.log.2016-05-08-20-05-14-0202-00
\Windows\system32\msdtc\trace\dtctrace.log.2016-05-08-20-07-38-0406-00
\Windows\system32\msdtc\trace\dtctrace.log.2016-05-08-20-10-05-0234-00
\Windows\system32\msdtc\trace\dtctrace.log.2016-05-08-20-12-30-0374-00
\Windows\system32\msdtc\trace\dtctrace.log.2016-05-08-20-14-58-0550-00
\Windows\system32\msdtc\trace\dtctrace.log.2016-05-08-20-17-24-0452-00
\Windows\system32\msdtc\trace\dtctrace.log.2016-05-08-20-19-49-0858-00
\Windows\system32\msdtc\trace\dtctrace.log.2016-05-08-20-22-17-0296-00

\Windows\system32\msdtc\trace\dtctrace.log.2016-05-08-20-24-43-0296-00
\Windows\system32\msdtc\trace\dtctrace.log.2016-05-08-20-27-10-0406-00
\Windows\system32\msdtc\trace\dtctrace.log.2016-05-08-20-29-38-0261-00
\Windows\system32\msdtc\trace\dtctrace.log.2016-05-08-20-32-05-0234-00
\Windows\system32\msdtc\trace\dtctrace.log.2016-05-08-20-34-34-0484-00
\Windows\system32\msdtc\trace\dtctrace.log.2016-05-08-20-37-00-0792-00
\Windows\system32\msdtc\trace\dtctrace.log.2016-05-08-20-39-27-0615-00
\Windows\system32\msdtc\trace\dtctrace.log.2016-05-08-20-41-55-0332-00
\Windows\system32\msdtc\trace\dtctrace.log.2016-05-08-20-44-22-0608-00
\Windows\system32\msdtc\trace\dtctrace.log.2016-05-08-20-46-49-0001-00
\Windows\system32\msdtc\trace\dtctrace.log.2016-05-08-20-49-15-0352-00
\Windows\system32\msdtc\trace\dtctrace.log.2016-05-08-20-51-45-0172-00
\Windows\system32\msdtc\trace\dtctrace.log.2016-05-08-20-54-13-0374-00
\Windows\system32\msdtc\trace\dtctrace.log.2016-05-08-20-56-39-0781-00
\Windows\system32\msdtc\trace\dtctrace.log.2016-05-08-20-59-08-0042-00
\Windows\system32\msdtc\trace\dtctrace.log.2016-05-08-21-01-38-0328-00
\Windows\system32\msdtc\trace\dtctrace.log.2016-05-08-21-04-05-0203-00
\Windows\system32\msdtc\trace\dtctrace.log.2016-05-08-21-06-33-0965-00
\Windows\system32\msdtc\trace\dtctrace.log.2016-05-08-21-09-02-0350-00
\Windows\system32\msdtc\trace\dtctrace.log.2016-05-08-21-11-31-0905-00
\Windows\system32\msdtc\trace\dtctrace.log.2016-05-08-21-14-00-0930-00
\Windows\system32\msdtc\trace\dtctrace.log.2016-05-08-21-16-30-0194-00
\Windows\system32\msdtc\trace\dtctrace.log.2016-05-08-21-18-59-0562-00
\Windows\system32\msdtc\trace\dtctrace.log.2016-05-08-21-21-28-0421-00
\Windows\system32\msdtc\trace\dtctrace.log.2016-05-08-21-23-59-0452-00
\Windows\system32\msdtc\trace\dtctrace.log.2016-05-08-21-26-30-0234-00
\Windows\system32\msdtc\trace\dtctrace.log.2016-05-08-21-29-00-0100-00
\Windows\system32\msdtc\trace\dtctrace.log.2016-05-08-21-31-30-0831-00
\Windows\system32\msdtc\trace\dtctrace.log.2016-05-08-21-34-02-0767-00
\Windows\system32\msdtc\trace\dtctrace.log.2016-05-08-21-36-31-0951-00
\Windows\system32\msdtc\trace\dtctrace.log.2016-05-08-21-39-04-0302-00
\Windows\system32\msdtc\trace\dtctrace.log.2016-05-08-21-41-33-0843-00
\Windows\system32\msdtc\trace\dtctrace.log.2016-05-08-21-44-04-0406-00
\Windows\system32\msdtc\trace\dtctrace.log.2016-05-08-21-46-34-0390-00
\Windows\system32\msdtc\trace\dtctrace.log.2016-05-08-21-49-05-0028-00
\Windows\system32\msdtc\trace\dtctrace.log.2016-05-08-21-51-37-0015-00
\Windows\system32\msdtc\trace\dtctrace.log.2016-05-08-21-54-07-0293-00
\Windows\system32\msdtc\trace\dtctrace.log.2016-05-08-21-56-40-0203-00
\Windows\system32\msdtc\trace\dtctrace.log.2016-05-08-21-59-11-0248-00
\Windows\system32\msdtc\trace\dtctrace.log.2016-05-08-22-01-43-0328-00
\Windows\system32\msdtc\trace\dtctrace.log.2016-05-08-22-04-19-0428-00
\Windows\system32\msdtc\trace\dtctrace.log.2016-05-08-22-06-50-0203-00
\Windows\system32\msdtc\trace\dtctrace.log.2016-05-08-22-09-26-0359-00
\Windows\system32\msdtc\trace\dtctrace.log.2016-05-08-22-11-59-0421-00
\Windows\system32\msdtc\trace\dtctrace.log.2016-05-08-22-14-32-0468-00
\Windows\system32\msdtc\trace\dtctrace.log.2016-05-08-22-17-06-0811-00
\Windows\system32\msdtc\trace\dtctrace.log.2016-05-08-22-19-43-0546-00
\Windows\system32\msdtc\trace\dtctrace.log.2016-05-08-22-22-15-0515-00
\Windows\system32\msdtc\trace\dtctrace.log.2016-05-08-22-24-47-0773-00
\Windows\system32\msftedit.dll
\Windows\system32\msiltcfg.dll
\Windows\system32\msimg32.dll
\Windows\system32\ms1s31.dll
\Windows\system32\msmmsp.dll
\Windows\system32\mspatcha.dll
\Windows\system32\msports.dll
\Windows\system32\msprivs.dll
\Windows\system32\msscript.ocx
\Windows\system32\mssign32.dll
\Windows\system32\mssip32.dll
\Windows\system32\msv1_0.dll
\Windows\system32\msvcirt.dll
\Windows\system32\msvcp60.dll
\Windows\system32\msvcrt.dll
\Windows\system32\msvcrt40.dll
\Windows\system32\mswsock.dll
\Windows\system32\nb-no\comct132.dll.mui
\Windows\system32\nb-no\fms.dll.mui
\Windows\system32\nb-no\mlang.dll.mui
\Windows\system32\nb-no\msimsg.dll.mui
\Windows\system32\nb-no\msprivs.dll.mui
\Windows\system32\nbtstat.exe
\Windows\system32\nci.dll
\Windows\system32\ncobjapi.dll
\Windows\system32\ncpa.cpl
\Windows\system32\ncrypt.dll
\Windows\system32\ncryptui.dll
\Windows\system32\ncsi.dll
\Windows\system32\ndadmin.exe
\Windows\system32\ndptsp.tsp
\Windows\system32\net.exe
\Windows\system32\netl.exe
\Windows\system32\netapi32.dll
\Windows\system32\netbios.dll \Windows\system32\netbtugc.exe
\Windows\system32\netcfg.exe
\Windows\system32\netcfgx.dll
\Windows\system32\netutils.dll
\Windows\system32\networklist\icons\stockicons\bench_16.bin
\Windows\system32\networklist\icons\stockicons\bench_24.bin
\Windows\system32\networklist\icons\stockicons\bench_32.bin
\Windows\system32\networklist\icons\stockicons\bench_48.bin
\Windows\system32\networklist\icons\stockicons\house_16.bin
\Windows\system32\networklist\icons\stockicons\house_24.bin
\Windows\system32\networklist\icons\stockicons\house_32.bin
\Windows\system32\networklist\icons\stockicons\house_48.bin
\Windows\system32\networklist\icons\stockicons\office_16.bin
\Windows\system32\nl-nl\comct132.dll.mui
\Windows\system32\normidna.nls
\Windows\system32\normnfc.nls
\Windows\system32\normnfd.nls
\Windows\system32\normnfkc.nls
\Windows\system32\normnfkd.nls
\Windows\system32\notepad.exe
\Windows\system32\nrpsrv.dll
\Windows\system32\nshwfp.dll
\Windows\system32\nsi.dll
\Windows\system32\nsisvc.dll
\Windows\system32\ntdll.dll
\Windows\system32\ntdsapi.dll
\Windows\system32\ntkrnlpa.exe
\Windows\system32\ntlanman.dll
\Windows\system32\ntmarta.dll
\Windows\system32\ntoskrnl.exe
\Windows\system32\ntprint.dll
\Windows\system32\ntprint.exe
\Windows\system32\ntshrui.dll
\Windows\system32\odbc32.dll
\Windows\system32\odbccp32.dll
\Windows\system32\odbcint.dll
\Windows\system32\odbctrac.dll
\Windows\system32\ole32.dll
\Windows\system32\oleacc.dll
\Windows\system32\oleacchooks.dll
\Windows\system32\oleaccrc.dll
\Windows\system32\oleaut32.dll
\Windows\system32\olepro32.dll
\Windows\system32\oleres.dll
\Windows\system32\onlinedeploy.cmd
\Windows\system32\oobe\cmisetup.dll
\Windows\system32\osuninst.dll
\Windows\system32\pathping.exe
\Windows\system32\perfc007.dat
\Windows\system32\perfc009.dat
\Windows\system32\perfh007.dat
\Windows\system32\perfh009.dat
\Windows\system32\perfstringbackup.ini
\Windows\system32\pl-pl\comct132.dll.mui
\Windows\system32\pnpsetup.dll
\Windows\system32\pnpui.dll
\Windows\system32\polstore.dll
\Windows\system32\poqexec.exe
\Windows\system32\powrprof.dll
\Windows\system32\prflbmsg.dll
\Windows\system32\print.exe
\Windows\system32\printui.dll
\Windows\system32\procinst.dll
\Windows\system32\profapi.dll
\Windows\system32\propsys.dll
\Windows\system32\provthrd.dll
\Windows\system32\psapi.dll
\Windows\system32\pshed.dll
\Windows\system32\pt-br\cdosys.dll.mui
\Windows\system32\pt-br\comct132.dll.mui
\Windows\system32\pt-br\comdlg32.dll.mui
\Windows\system32\pt-br\fms.dll.mui
\Windows\system32\pt-br\mlang.dll.mui
\Windows\system32\pt-br\msimsg.dll.mui
\Windows\system32\pt-pt\comct132.dll.mui
\Windows\system32\ras\pad.inf
\Windows\system32\ras\pppmenu.scp
\Windows\system32\ras\switch.inf
\Windows\system32\rasadhlp.dll
\Windows\system32\rasapi32.dll
\Windows\system32\rasauto.dll
\Windows\system32\rasautou.exe
\Windows\system32\rascfg.dll
\Windows\system32\raschap.dll
\Windows\system32\rasctrnm.h
\Windows\system32\rasctrs.dll
\Windows\system32\rasdiag.dll
\Windows\system32\rasdlg.dll
\Windows\system32\rasman.dll
\Windows\system32\rasmans.dll
\Windows\system32\rasmbmgr.dll
\Windows\system32\rasmontr.dll
\Windows\system32\rasmxs.dll
\Windows\system32\rasppp.dll
\Windows\system32\rasser.dll
\Windows\system32\robocopy.exe
\Windows\system32\ro-ro\comct132.dll.mui
\Windows\system32\ro-ro\msimsg.dll.mui
\Windows\system32\route.exe
\Windows\system32\rpcepmap.dll
\Windows\system32\rpcrt4.dll
\Windows\system32\rpertremote.dll
\Windows\system32\rpcss.dll
\Windows\system32\rsaenh.dll
\Windows\system32\rstrui.exe
\Windows\system32\rtutils.dll
\Windows\system32\ru-ru\comct132.dll.mui
\Windows\system32\samcli.dll
\Windows\system32\samlib.dll
\Windows\system32\samsrv.dll
\Windows\system32\scecli.dll
\Windows\system32\scesrv.dll
\Windows\system32\scext.dll
\Windows\system32\schannel.dll
\Windows\system32\schedcli.dll
\Windows\system32\schema.dat
\Windows\system32\scrobj.dll
\Windows\system32\sk-sk\comct132.dll.mui
\Windows\system32\sl-si\comct132.dll.mui
\Windows\system32\smi\store\machine\schema.dat
\Windows\system32\smi\store\machine\schema.dat.log
\Windows\system32\smi\store\machine\schema.dat.log 1
\Windows\system32\smi\store\machine\schema.dat.log 2

\Windows\system32\smi\store\machine\schema.dat{846ee3d3-7039-11de-9d20-001d09fa5a1c}.tm.blf
\Windows\system32\smi\store\machine\schema.dat{846ee3d3-7039-11de-9d20-001d09fa5a1c}.tmcontainer00000000000000000001.regtrans-ms
\Windows\system32\smi\store\machine\schema.dat{846ee3d3-7039-11de-9d20-001d09fa5a1c}.tmcontainer00000000000000000002.regtrans-ms
\Windows\system32\smi\store\machine\schema.dat{e4eaaf92-155a-11e6-8316-985fd334c424tm.blf
\Windows\system32\smi\store\machine\schema.dat{e4eaaf92-155a-11e6-8316-985fd334c42d}.tmcontainer00000000000000000001.regtrans-ms
\Windows\system32\smi\store\machine\schema.dat{e4eaaf92-155a-11e6-8316-985fd334c42d}.tmcontainer00000000000000000002.regtrans-ms
\Windows\system32\smss.exe
\Windows\system32\softkbd.dll
\Windows\system32\spool\drivers\x64\3\jnwdrv.dll
\Windows\system32\spool\drivers\x64\3\jnwdui.dll
\Windows\system32\spool\prtprocs\x64\jnwppr.dll
\Windows\system32\sr-latn-cs\comct132.dll.mui
\Windows\system32\sv-se\comct132.dll.mui
\Windows\system32\sysprep\panther\ie\diagerr.xml
\Windows\system32\sysprep\panther\ie\diagwrn.xml
\Windows\system32\sysprep\panther\ie\setupact.log
\Windows\system32\sysprep\panther\ie\setuperr.log
\Windows\system32\tasks\Microsoft\Windows defender\mp scheduled scan
\Windows\system32\tasks\Microsoft\Windows\diskdiagnostic\Microsoft-Windows-diskdiagnostic-datacollector
\Windows\system32\th-th\comct132.dll.mui
\Windows\system32\tracert.exe
\Windows\system32\tree.corn
\Windows\system324-tr\comct132.dll.mui
\Windows\system324-tr\mlang.dll.mui
\Windows\system324-tr\msimsg.dll.mui
\Windows\system324-tr\msprivs.dll.mui
\Windows\system32\tsddd.dll
\Windows\system32\tzres.dll
\Windows\system32\ubpm.dll
\Windows\system32\ucsvc.exe
\Windows\system32\uexfat.dll
\Windows\system32\uk-ua\comct132.dll.mui
\Windows\system32\unattend.dll
\Windows\system32\unlodctr.exe
\Windows\system32\untfs.dll
\Windows\system32\ureg.dll
\Windows\system32\urlmon.dll
\Windows\system32\user32.dll
\Windows\system32\userenv.dll
\Windows\system32\userinit.exe
\Windows\system32\usp10.dll
\Windows\system32\utildll.dll
\Windows\system32\uudf.dll
\Windows\system32\uxinit.dll
\Windows\system32\uxtheme.dll
\Windows\system32\vbscript.dll
\Windows\system32\vdmdbg.dll
\Windows\system32\vds.exe
\Windows\system32\vdsps.dll
\Windows\system32\vdsbas.dll
\Windows\system32\vdsdyn.dll
\Windows\system32\vdsldr.exe
\Windows\system32\vdsutil.dll
\Windows\system32\vdsvd.dll
\Windows\system32\verifier.dll
\Windows\system32\verifier.exe
\Windows\system32\version.dll
\Windows\system32\vga.dll
\Windows\system32\vga256.dll
\Windows\system32\vga64k.dll
\Windows\system32\virtdisk.dll
\Windows\system32\vmbuscoinstaller.dll
\Windows\system32\wbem\offlinefileswmiprovider.mof
\Windows\system32\wbem\offlinefileswmiprovider_uninstall.mof
\Windows\system32\wbem\performance\wmiaprpl.h
\Windows\system32\wbem\performance\wmiaprpl.ini
\Windows\system32\wbem\repository\index.btr
\Windows\system32\wbem\repository\mapping1.map
\Windows\system32\wbem\repository\mapping2.map
\Windows\system32\wbem\repository\mapping3.map
\Windows\system32\wbem\repository\objects.data
\Windows\system32\wdi\{86432a0b-3c7d-4ddf-a89c-172faa90485d}\{0ca8b22f-7b7b-4fce-a0e7-c907e93a1752}\snapshot.etl
\Windows\system32\wdi\{86432a0b-3c7d-4ddf-a89c-172faa90485d}\{34534afb-dbc1-430e-96b7-60d4004682cf}\snapshot.etl
\Windows\system32\wdi\{86432a0b-3c7d-4ddf-a89c-172faa90485d}\{3f1c2f0f-119c-4f62-a482-da4171688e50}\snapshot.etl
\Windows\system32\wdi\{86432a0b-3c7d-4ddf-a89c-172faa90485d}\{691e7158-b9c7-4001-9a0f-5974ea2f6f46}\snapshot.etl
\Windows\system32\wdi\{86432a0b-3c7d-4ddf-a89c-172faa90485d}\s-1-5-21-3802865718-2425493424-3987546756-1000 userdata.bin
\Windows\system32\wdi\bootperformancediagnostics_systemdata.bin
\Windows\system32\wdi\logfiles\bootckcl.etl
\Windows\system32\wdi\logfiles\wdicontextlog.et1.001
\Windows\system32\wdi\logfiles\wdicontextlog.et1.003
\Windows\system32\wdi\shutdownperformance-diagnostics_systemdata.bin
\Windows\system32\webservices.dll
\Windows\system32\wer.dll
\Windows\system32\werdiagcontroller.dll
\Windows\system32\wermgr.exe
\Windows\system32\werui.dll
\Windows\system32\wevtapi.dll
\Windows\system32\wevtsvc.dll
\Windows\system32\wevtutil.exe
\Windows\system32\wfapigp.dll
\Windows\system32\wfp\wfpdiag.etl
\Windows\system32\wimgapi.dll
\Windows\system32\wimserv.exe
\Windows\system32\win32k.sys
\Windows\system32\winbio.dll
\Windows\system32\winbioplugins\en-us\winbiosensoradapter.dll.mui
\Windows\system32\winbioplugins\ winbiosensoradapter.dll
\Windows\system32\winbrand.dll
\Windows\system32\Windowscodecs.dll
\Windows\system32\winevt\logs\application.evtx
\Windows\system32\winevt\logs\hardwareevents.evtx \Windows\system32\winevt\logs\internet explorer.evtx
\Windows\system32\winevt\logs\key management service.evtx
\Windows\system32\winevt\logs\media center.evtx
\Windows\system32\winevt\logs\Microsoft-Windows-application-experience%4problem-steps-recorder.evtx
\Windows\system32\winevt\logs\Microsoft-Windows-application-experience%4program-compatibility-assistant.evtx
\Windows\system32\winevt\logs\Microsoft-Windows-application-experience%4program-compatibility-troubleshooter.evtx
\Windows\system32\winevt\logs\Microsoft-Windows-application-experience%4program-inventory. evtx
\Windows\system32\winevt\logs\Microsoft-Windows-application-experience%4program-telemetry.evtx
\Windows\system32\winevt\logs\Microsoft-Windows-bits-client%4operational.evtx
\Windows\system32\winevt\logs\Microsoft-Windows-branchcachesmb%4operational.evtx
\Windows\system32\winevt\logs\Microsoft-Windows-codeintegrity%4operational.evtx
\Windows\system32\winevt\logs\Microsoft-Windows-dhcp-client%4admin.evtx
\Windows\system32\winevt\logs\Microsoft-Windows-dhcpv6-client%4admin.evtx
\Windows\system32\winevt\logs\Microsoft-Windows-diagnosis-dps%4operational.evtx
\Windows\system32\winevt\logs\Microsoft-Windows-diagnosis-scheduled%4operational.evtx
\Windows\system32\winevt\logs\Microsoft-Windows-diagnosis-scripted%4admin.evtx
\Windows\system32\winevt\logs\Microsoft-Windows-diagnosis-scripted%4operational.evtx
\Windows\system32\winevt\logs\Microsoft-Windows-diagnostics-performance%4operational.evtx
\Windows\system32\winevt\logs\Microsoft-Windows-diskdiagnosticdatacollector%4operational.evtx
\Windows\system32\winevt\logs\Microsoft-Windows-fault-tolerant-heap%4operational.evtx
\Windows\system32\winevt\logs\Microsoft-Windows-grouppolicy%4operational. evtx
\Windows\system32\winevt\logs\Microsoft-Windows-kernel-power%4thermal-operational.evtx
\Windows\system32\winevt\logs\Microsoft-Windows-kernel-storemgr%4operational.evtx
\Windows\system32\winevt\logs\Microsoft-Windows-kernel-whea%4errors.evtx
\Windows\system32\winevt\logs\Microsoft-Windows-kernel-whea%4operational.evtx
\Windows\system32\winevt\logs\Microsoft-Windows-known folders api service.evtx
\Windows\system32\winevt\logs\Microsoft-Windows-languagepacksetup%4operational.evtx
\Windows\system32\winevt\logs\Microsoft-Windows-mui%4admin.evtx
\Windows\system32\winevt\logs\Microsoft-Windows-mui%4operational.evtx
\Windows\system32\winevt\logs\Microsoft-Windows-ncsi%4operational.evtx
\Windows\system32\winevt\logs\Microsoft-Windows-networkaccessprotection%4operational.evtx
\Windows\system32\winevt\logs\Microsoft-Windows-networkaccessprotection%4whc.evtx
\Windows\system32\winevt\logs\Microsoft-Windows-networklocationwizard%4operational.evtx
\Windows\system32\winevt\logs\Microsoft-Windows-networkprofile%4operational.evtx
\Windows\system32\winevt\logs\Microsoft-Windows-offlinefiles%4operational.evtx
\Windows\system32\winevt\logs\Microsoft-Windows-printservice%4admin.evtx
\Windows\system32\winevt\logs\Microsoft-Windows-readyboost%4operational.evtx
\Windows\system32\winevt\logs\Microsoft-Windows-reliabilityanalysiscomponent%4operational.evtx
\Windows\system32\winevt\logs\Microsoft-Windows-resource-exhaustion-detecto%4operational.evtx
\Windows\system32\winevt\logs\Microsoft-Windows-restartmanager%4operational.evtx
\Windows\system32\winevt\logs\Microsoft-Windows-terminalservices-localsessionmanager%4admin.evtx
\Windows\system32\winevt\logs\Microsoft-Windows-terminalservices-localsessionmanager%4operational.evtx
\Windows\system32\winevt\logs\Microsoft-Windows-user profile service%4operational.evtx
\Windows\system32\winevt\logs\Microsoft-Windows-wer-diag%4operational.evtx
\Windows\system32\winevt\logs\Microsoft-Windows-Windows defender%4operational. evtx
\Windows\system32\winevt\logs\Microsoft-Windows-Windows defender%4whc.evtx
\Windows\system32\winevt\logs\Microsoft-Windows-Windows firewall with advanced security%4connectionsecurity.evtx
\Windows\system32\winevt\logs\Microsoft-Windows-Windows firewall with advanced security%4firewall.evtx
\Windows\system32\winevt\logs\Microsoft-Windows-Windowsbackup%4actioncenter.evtx
\Windows\system32\winevt\logs\Microsoft-Windows-Windowssystemassessmenttool%4operational.evtx
\Windows\system32\winevt\logs\Microsoft-Windows-Windowsupdateclient%4operational.evtx
\Windows\system32\winevt\logs\Microsoft-Windows-winlogon%4operational.evtx
\Windows\system32\winevt\logs\security.evtx
\Windows\system32\winevt\logs\setup.evtx
\Windows\system32\winevt\logs\system.evtx
\Windows\system32\winevt\logs\thinprint diagnostics.evtx
\Windows\system32\winevt\logs\Windows powershell.evtx
\Windows\system32\winhttp.dll
\Windows\system32\wininet.dll
\Windows\system32\wininit.exe
\Windows\system32\winipsec.dll
\Windows\system32\winload.efi
\Windows\system32\winload.exe
\Windows\system32\winlogon.exe
\Windows\system32\winmm.dll
\Windows\system32\winnsi.dll
\Windows\system32\winpe.bmp
\Windows\system32\winpeshl.exe
\Windows\system32\winpeshl.ini
\Windows\system32\winresume.efi
\Windows\system32\winresume.exe
\Windows\system32\winscard.dll
\Windows\system32\winsockhc.dll
\Windows\system32\winspool.dry
\Windows\system32\winsrv.dll
\Windows\system32\winsta.dll \Windows\system32\wintrust.dll
\Windows\system32\wkscli.dll
\Windows\system32\wkssvc.dll
\Windows\system32\wlanutil.dll
\Windows\system32\wldap32.dll
\Windows\system32\wmi.dll
\Windows\system32\wmicmiplugin.dll
\Windows\system32\wmimgmt.msc
\Windows\system32\wmiprop.dll
\Windows\system32\wmsgapi.dll
\Windows\system32\wpeinit.exe
\Windows\system32\wpeutil.dll
\Windows\system32\wpeutil.exe
\Windows\system32\write.exe
\Windows\system32\ws2_32.dll
\Windows\system32\ws2help.dll
\Windows\system32\wscript.exe
\Windows\system32\wshcon.dll
\Windows\system32\wshelper.dll
\Windows\system32\wship6.dll
\Windows\system32\wshnetbs.dll
\Windows\system32\wshom.ocx
\Windows\system32\wshtcpip.dll
\Windows\system32\wsock32.dll
\Windows\system32\wtsapi32.dll
\Windows\system32\xcopy.exe
\Windows\system32\xmllite.dll
\Windows\system32\zh-cn\comct132.dll.mui
\Windows\system32\zh-hk\comct132.dll.mui
\Windows\system32\zh-tw\comct132.dll.mui
\Windows\winsxs\amd64 averfx2hbh826d_noaverir_x64.inf_31bf3856ad364e35_6.1.7600.16385_none_3cfa3158fd5ab28e\averfx2hbtv64.sys
\Windows\winsxs\amd64_averfx2hbtv_x64.inf_31bf3856ad364e35_6.1.7600.16385_none_2973b7e011e9c731\averfx2hbtv64.sys
\Windows\winsxs\amd64_averfx2hbtv_x64.inf_31bf3856ad364e35 6.1.7600.16385_none_2973b7e011e9c731\mvdetection64.ax
\Windows\winsxs\amd64_averfx2swtv_noavin_x64.inf_31bf3856ad364e35_60.1.7600.16385_none_d09f0e4b6533fbd-flaverfx2hbtv64.sys
\Windows\winsxs\amd64_averfx2swtv_noavin_x64.inf_31bf3856ad364e35_60.1.7600.16385_none_d09f0e4b6533fbdflm-vdetection64.ax
\Windows\winsxs\amd64_averfx2swtv_x64.inf_31bf3856ad364e35_6.1.7600.16385_none_fedee0b0e2af1d43\averfx2hbtv64.sys
\Windows\winsxs\amd64_averfx2swtv_x64.inf_31bf3856ad364e35_6.1.7600.16385_none_fedee0b0e2af1d43\mvdetection64.ax
\Windows\winsxs\amd64_averhbh826 noaverir_x64.inf_31bf3856ad364e35 6.1.7600.16385_none_627d53d0cd5664c2\averfx2hbtv64.sys
\Windows\winsxs\amd64_averhbh826 noaverir_x64.inf_31bf3856ad364e35 6.1.7600.16385_none_627d53d0cd5664c2\mvdetection64.ax
\Windows\winsxs\amd64_brmfcmdm.inf_31bf3856ad364e35_6.1.7600.16385_none_d5714398a0c68fde\brcoinst.dll
\Windows\winsxs\amd64_brmfcmdm.inf_31bf3856ad364e35_6.1.7600.16385_none_d5714398a0c68fde\brserid.sys
\Windows\winsxs\amd64_brmfcmdm.inf_31bf3856ad364e35_6.1.7600.16385_none_d5714398a0c68fde\brusbser.sys
\Windows\winsxs\amd64_brmfcmfinf_31bf3856ad364e35_6.1.7600.16385_none_6f8740b92fea8e01\brbidiif.dll
\Windows\winsxs\amd64_brmfcmfinf_31bf3856ad364e35_6.1.7600.16385_none_6f8740b92fea8e01\brcoinst.dll
\Windows\winsxs\amd64_brmfcmfinf_31bf3856ad364e35_6.1.7600.16385_none_6f8740b92fea8e01\brevif.dll
\Windows\winsxs\amd64_brmfcmfinf_31bf3856ad364e35_6.1.7600.16385_none_6f8740b92fea8e01\brmfbidi.dll
\Windows\winsxs\amd64_brmfcmfinf_31bf3856ad364e35_6.1.7600.16385_none_6f8740b92fea8e01\brmflpt.dll
\Windows\winsxs\amd64_brmfcmfinf_31bf3856ad364e35_6.1.7600.16385_none_6f8740b92fea8e01\brmfrsmg.exe
\Windows\winsxs\amd64_brmfcmfinf_31bf3856ad364e35_6.1.7600.16385_none_6f8740b92fea8e01\brmfusb.dll
\Windows\winsxs\amd64_brmfcmfinf_31bf3856ad364e35_6.1.7600.16385_none_6f8740b92fea8e01\brscnrsm.dll
\Windows\winsxs\amd64_brmfcmfinf_31bf3856ad364e35_6.1.7600.16385_none_6f8740b92fea8e01\brserif.dll
\Windows\winsxs\amd64_brmfcmfinf_31bf3856ad364e35_6.1.7600.16385_none_6f8740b92fea8e01\brserwdm.sys
\Windows\winsxs\amd64_brmfcmfinf_31bf3856ad364e35_6.1.7600.16385_none_6f8740b92fea8e01\brusbmdm.sys
\Windows\winsxs\amd64_brmfcmfinf_31bf3856ad364e35_6.1.7600.16385_none_6f8740b92fea8e01\rsmgrstr.dll
\Windows\winsxs\amd64_brmfcumd.inf_31bf3856ad364e35_6.1.7600.16385_none_82533c9760ae3cbc\brusbmdm.sys
\Windows\winsxs\amd64_brmfcwia.inf_31bf3856ad364e35_6.1.7600.16385_none_11493a3982b640b7\brbidlif.dll
\Windows\winsxs\amd64_brmfcwia.inf_31bf3856ad364e35_6.1.7600.16385_none_11493a3982b640b7\brcoinst.dll
\Windows\winsxs\amd64_brmfcwia.inf_31bf3856ad364e35_6.1.7600.16385_none_11493a3982b640b7\brevif.dll
\Windows\winsxs\amd64_brmfcwia.inf_31bf3856ad364e35_6.1.7600.16385_none_11493a3982b640b7\brmfbidi.dll
\Windows\winsxs\amd64_brmfcwia.inf_31bf3856ad364e35_6.1.7600.16385_none_11493a3982b640b7\brmflpt.dll
\Windows\winsxs\amd64_brmfcwia.inf_31bf3856ad364e35_6.1.7600.16385_none_11493a3982b640b7\brmfrsmg
\Windows\winsxs\amd64_brmfcwia.inf_31bf3856ad364e35_6.1.7600.16385_none_11493a3982b640b7\brmfusb.dll \Windows\winsxs\amd64_brmfcwia.inf_
31bf3856ad364e35_6.1.7600.16385_none_
11493a3982b640b7\brscnrsm.dll
\Windows\winsxs\amd64_brmfcwia.inf_
31bf3856ad364e35_6.1.7600.16385_none_
11493a3982b640b7\brserif.dll
\Windows\winsxs\amd64_brmfcwia.inf_
31bf3856ad364e35_6.1.7600.16385_none_
11493a3982b640b7\rsmgrstr.dll
\Windows\winsxs\amd64_brmfport.inf_
31bf3856ad364e35_6.1.7600.16385_none_
b12cd02afc885a74\brcoinst.dll
\Windows\winsxs\amd64_brmfport.inf_
31bf3856ad364e35_6.1.7600.16385_none_
b12cd02afc885a74\brserid.sys
\Windows\winsxs\amd64_brmfport.inf_
31bf3856ad364e35_6.1.7600.16385_none_
b12cd02afc885a74\brserwdm.sys
\Windows\winsxs\amd64_brmfport.inf_
31bf3856ad364e35_6.1.7600.16385_none_
b12cd02afc885a74\brusbser.sys
\Windows\winsxs\amd64_cxfalcon_ibv64.inf_
31bf3856ad364e35_6.1.7600.1
6385_none_a242cda757046042\colorcvt_ibv64.ax
\Windows\winsxs\amd64_cxfalcon_ibv64.inf_
31bf3856ad364e35_6.1.7600.1
6385_none_a242cda757046042\cpnotify_ibv64.ax
\Windows\winsxs\amd64_cxfalcon_ibv64.inf_
31bf3856ad364e35_6.1.7600.1
6385_none_a242cda757046042\cxfalcon.rom
\Windows\winsxs\amd64_cxfalcon_ibv64.inf_
31bf3856ad364e35_6.1.7600.1
6385_none_a242cda757046042\cxfalcon_ibv64.sys
\Windows\winsxs\amd64_cxfalcon_ibv64.inf_
31bf3856ad364e35_6.1.7600.1
6385_none_a242cda757046042\merlinb.rom
\Windows\winsxs\amd64_cxfalcon_ibv64.inf_
31bf3856ad364e35_6.1.7600.1
6385_none_a242cda757046042\merlinc.rom
\Windows\winsxs\amd64_cxfalpal_ibv64.inf_
31bf3856ad364e35_6.1.7600.16
385_none_db4796019d20adcb\colorcvt_ibv64.ax
\Windows\winsxs\amd64_cxfalpal_ibv64.inf_
31bf3856ad364e35_6.1.7600.16
385_none_db4796019d20adcb\cpnotify_ibv64.ax
\Windows\winsxs\amd64_cxfalpal_ibv64.inf_
31bf3856ad364e35_6.1.7600.16
385_none_db4796019d20adcb\cxfalcon.rom
\Windows\winsxs\amd64_cxfalpal_ibv64.inf_
31bf3856ad364e35_6.1.7600.16
385_none_db4796019d20adcb\cxfalcon_ibv64.sys
\Windows\winsxs\amd64_cxfalpal_ibv64.inf_
31bf3856ad364e35_6.1.7600.16
385_none_db4796019d20adcb\merlinb.rom
\Windows\winsxs\amd64_cxfalpal_ibv64.inf_
31bf3856ad364e35_6.1.7600.16
385_none_db4796019d20adcb\merlinc.rom
\Windows\winsxs\amd64_cxraptor_fm1216mk5_
ibv64.inf_31bf3856ad364e3
5_6.1.7600.16385_none_6fc613b717a25720\apu.rom
\Windows\winsxs\amd64_cxraptor_fm1216mk5_
ibv64.inf_31bf3856ad364e3
5_6.1.7600.16385_none_6fc613b717a25720\
colorcvt_raptor_ibv64.ax
\Windows\winsxs\amd64_cxraptor_fm1216mk5_
ibv64.inf_31bf3856ad364e3
5_6.1.7600.16385_none_6fc613b717a25720\
cpnotify_raptor_ibv64.ax
\Windows\winsxs\amd64_cxraptor_fm1216mk5_
ibv64.inf_31bf3856ad364e3
5_6.1.7600.16385_none_6fc613b717a25720\ cxraptor.rom
\Windows\winsxs\amd64_cxraptor_fm1216mk5_
ibv64.inf_31bf3856ad364e3
5_6.1.7600.16385_none_6fc613b717a25720\
cxraptor_ibv64.sys
\Windows\winsxs\amd64_cxraptor_fm1216mk5_
ibv64.inf_31bf3856ad364e3
5_6.1.7600.16385_none_6fc613b717a25720\ cxraptor_merlinc.rom
\Windows\winsxs\amd64_cxraptor_fm1236mk5_
ibv64.inf_31bf3856ad364e3
5_6.1.7600.16385_none_a0e6031d536a7892\apu.rom
\Windows\winsxs\amd64_cxraptor_fm1236mk5_
ibv64.inf_31bf3856ad364e3
5_6.1.7600.16385_none_a0e6031d536a7892\
colorcvt_raptor_ibv64.ax
\Windows\winsxs\amd64_cxraptor_fm1236mk5_
ibv64.inf_31bf3856ad364e3
5_6.1.7600.16385_none_a0e6031d536a7892\
cpnotify_raptor_ibv64.ax
\Windows\winsxs\amd64_cxraptor_fm1236mk5_
ibv64.inf_31bf3856ad364e3
5_6.1.7600.16385_none_a0e6031d536a7892\ cxraptor.rom
\Windows\winsxs\amd64_cxraptor_fm1236mk5_
ibv64.inf_31bf3856ad364e3
5_6.1.7600.16385_none_a0e6031d536a7892\
cxraptor_ibv64.sys
\Windows\winsxs\amd64_cxraptor_fm1236mk5_
ibv64.inf_31bf3856ad364e3
5_6.1.7600.16385_none_a0e6031d536a7892\ cxraptor_merlinc.rom
\Windows\winsxs\amd64_hpoa1so.inf_
31bf3856ad364e35_6.1.7600.16385_n
one_9f729ae40a99fd9d\hpowiav1.dll
\Windows\winsxs\amd64_hpoa1
ss.inf_31bf3856ad364e35_6.1.7600.16385_n
one_551deeb482597ed9\hpowiav1.dll
\Windows\winsxs\amd64_keyboard.inf_
31bf3856ad364e35_6.1.7601.17514
none_f5747347ef9876bf\i8042prt.sys
\Windows\winsxs\amd64_mdmbr002.inf_
31bf3856ad364e35_6.1.7600.16385_none_
bff4698a07fe9888\brserib.sys
\Windows\winsxs\amd64_mdmbr002.inf_
31bf3856ad364e35_6.1.7600.16385_none_
bff4698a07fe9888\brusbsib.sys
\Windows\winsxs\amd64_mdmbr004.inf_
31bf3856ad364e35_6.1.7600.16385_none_
c1068df43a3b115a\brserib.sys
\Windows\winsxs\amd64_mdmbr004.inf_
31bf3856ad364e35_6.1.7600.16385_none_
c1068df43a3b115a\brusbsib.sys
\Windows\winsxs\amd64_mdmbr005.inf_
31bf3856ad364e35_6.1.7600.16385_none_
c18fa02953594dc3\brserib.sys
\Windows\winsxs\amd64_mdmbr005.inf_
31bf3856ad364e35_6.1.7600.16385_none_c_
18fa02953594dc3\brusbsib.sys
\Windows\winsxs\amd64_mdmbr006.inf_
31bf3856ad364e35_6.1.7600.16385_none_
c218b25e6c778a2c\brserib.sys \Windows\winsxs\amd64_mdmbr006.inf_
31bf3856ad364e35_6.1.7600.16385_none_
c218b25e6c778a2c\brusbsib.sys
\Windows\winsxs\amd64_mdmbr007.inf_
31bf3856ad364e35_6.1.7600.16385_none_
c2a1c4938595c695\brserib.sys
\Windows\winsxs\amd64_mdmbr007.inf_
31bf3856ad364e35_6.1.7600.16385_none_
c2a1c4938595c695\brusbsib.sys
\Windows\winsxs\amd64_mdmbr008.inf_
31bf3856ad364e35_6.1.7600.16385_none_
c32ad6c89eb402fe\brserib.sys
\Windows\winsxs\amd64_mdmbr008.inf_
31bf3856ad364e35_6.1.7600.16385_none_
c32ad6c89eb402fe\brusbsib.sys
\Windows\winsxs\amd64_mdmbr00a.inf_
31bf3856ad364e35_6.1.7600.16385_none_
d9lec149a48bafcf\brserib.sys
\Windows\winsxs\amd64_mdmbr00a.inf_
31bf3856ad364e35_6.1.7600.16385_none_
d9lec149a48bafcf\brusbsib.sys
\Windows\winsxs\amd64_mdmcxhv6.inf_
31bf3856ad364e35_6.1.7600.16385_none
064a4eb4ec0af80f\vstbs26.sys
\Windows\winsxs\amd64_mdmcxhv6.inf_
31bf3856ad364e35_6.1.7600.16385_none
064a4eb4ec0af80f\vstcnxt6.sys
\Windows\winsxs\amd64_mdmcxhv6.inf_
31bf3856ad364e35_6.1.7600.16385_none
064a4eb4ec0af80f\vstdpv6.sys
\Windows\winsxs\amd64_mdmcxhv6.inf_
31bf3856ad364e35_6.1.7600.16385_none
064a4eb4ec0af80f\vstprof.cty
\Windows\winsxs\amd64_mdmcxpv6.inf_
31bf3856ad364e35_6.1.7600.16385_none_
1f3c6efc8093e1d7\vstbs26.sys
\Windows\winsxs\amd64_mdmcxpv6.inf_
31bf3856ad364e35_6.1.7600.16385_none_
1f3c6efc8093e1d7\vstcnxt6.sys
\Windows\winsxs\amd64_mdmcxpv6.inf_
31bf3856ad364e35_6.1.7600.16385_none_
1f3c6efc8093e1d7\vstdpv6.sys
\Windows\winsxs\amd64_mdmcxpv6.inf_
31bf3856ad364e35_6.1.7600.16385_none_
1f3c6efc8093e1d7\vstprof.cty
\Windows\winsxs\amd64_mdmirmdm.inf_
31bf3856ad364e35_6.1.7600.1638
5_none_630f6f699f391c3d\msircomm.sys
\Windows\winsxs\amd64_mdmnokia.inf_
31bf3856ad364e35_6.1.7600.16385_none_
81fe1974cdead8a0\msircomm.sys
\Windows\winsxs\amd64_Microsoft.Windows.c..-
controls.resources_6595b64144ccf1df_5.82.7600.
16385_ar-sa_25b69e51bf9d09dc\comct132.dll.mui
\Windows\winsxs\amd64_Microsoft.Windows.c..-
controls.resources_6595b64144ccf1df_5.82.7600.
16385_bg-bg_cbf67fdab01d5b33\comct132.dll.mui
\Windows\winsxs\amd64_Microsoft.Windows.c..-
controls.resources_6595b64144ccf1df_5.82.7600.
16385_cs-cz_76fff6759da5375e\comct132.dll.mui
\Windows\winsxs\amd64_Microsoft.Windows.c..-
controls.resources_6595b64144ccf1df_5.82.7600.
16385_da-dk_1439d69c93eb335d\comct132.dll.mui
\Windows\winsxs\amd64_Microsoft.Windows.c..-
controls.resources_6595b64144ccf1df_5.82.7600.
16385_de-de 11656bd895c187f7\comct132.dll.mui
\Windows\winsxs\amd64_Microsoft.Windows.c..-
controls.resources_6595b64144ccf1df_5.82.
7600.16385_el-
gr_b9fb996b84d6f085\comct132.dll.mui
\Windows\winsxs\amd64_Microsoft.Windows.c..-
controls.resources_6595b64144ccf1df_
5.82.7600.16385_en-us
ba5641d1849f93bc\comct132.dll.mui
\Windows\winsxs\amd64_Microsoft.Windows.c..-
controls.resources_6595b64144ccf1df_
5.82.7600.16385_es-
es_ba219eb584c68561\comct132.dll.mui
\Windows\winsxs\amd64_Microsoft.Windows.c..-
controls.resources_6595b64144ccf1df_
5.82.7600.16385_et-
ee_b3e16a4588cc61f0\comct132.dll.mui
\Windows\winsxs\amd64_Microsoft.Windows.c..-
controls.resources_6595b64144ccf1df_
5.82.7600.16385_fi-
fi_593ca36279e0778b\comct132.dll.mui
\Windows\winsxs\amd64_Microsoft.Windows.c..-
controls.resources_6595b64144ccf1df_
5.82.7600.16385_fr-
fr_5cd914b477989bc3\comct132.dll.mui
\Windows\winsxs\amd64_Microsoft.Windows.c..-
controls.resources_6595b64144ccf1df_
5.82.7600.16385_he-
il_a0f8bc565e079cb1\comct132.dll.mui
\Windows\winsxs\amd64_Microsoft.Windows.c..-
controls.resources_6595b64144ccf1df_
5.82.7600.16385_hr-
hr_a3156f365cbb0977\comct132.dll.mui
\Windows\winsxs\amd64_Microsoft.Windows.c..-
controls.resources_6595b64144ccf1df_
5.82.7600.16385_hu-
hu_a44994fc5bf86adf\comct132.dll.mui
\Windows\winsxs\amd64_Microsoft.Windows.c..-
controls.resources_6595b64144ccf1df_
5.82.7600.16385_it-
it_47010afb4eca8141\comct132.dll.mui
\Windows\winsxs\amd64_Microsoft.Windows.c..-
controls.resources_6595b64144ccf1df_
5.82.7600.16385_ja-
jp_e9268a0841e5931c\comct132.dll.mui
\Windows\winsxs\amd64_Microsoft.Windows.c..-
controls.resources_6595b64144ccf1df_
5.82.7600.16385_ko-
kr_8c9066bd34565a32\comct132.dll.mui
\Windows\winsxs\amd64_Microsoft.Windows.c..-
controls.resources_6595b64144ccf1
df_5.82.7600.16385_lt-
lt_305b92be267e25cf\comct132.dll.mui
\Windows\winsxs\amd64_Microsoft.Windows.c..-
controls.resources_6595b64144ccf1df_
5.82.7600.16385_lv-
lv_3129014225fc66bf\comct132.dll.mui
\Windows\winsxs\amd64_Microsoft.Windows.c..-
controls.resources_6595b64144ccf1
df_5.82.7600.16385_nb-
no_7522e7f20c7b85ee\comct132.dll.mui
\Windows\winsxs\amd64_Microsoft.Windows.c..-
controls.resources_6595b64144ccf1df_
5.82.7600.16385_nl-
nl_736233300da78fc3\comct132.dll.mui
\Windows\winsxs\amd64_Microsoft.Windows.c..-
controls.resources_6595b64144ccf1df_5
0.82.7600.16385_pl-
pl_b99e8db1f2c9fd77\comct132.dll.mui \Windows\winsxs\amd64_Microsoft.Windows.c..-controls.resources_6595b64144ccf1df_5 0.82.7600.16385_pt-br_bbf27855f153915b\comct132.dll.mui
\Windows\winsxs\amd64_Microsoft.Windows.c..-controls.resources_6595b64144ccf1df_5 0.82.7600.16385_pt-pt_bcd447c1f0c30137\comct132.dll.mui
\Windows\winsxs\amd64_Microsoft.Windows.c..-controls.resources_6595b64144ccf1df_ 5.82.7600.16385_ro-ro_010f0df9d729cc93\comct132.dll.mui
\Windows\winsxs\amd64_Microsoft.Windows.c..-controls.resources_6595b64144ccf1df_ 5.82.7600.16385_ru-ru_03775985d5a48f63\comct132.dll.mui
\Windows\winsxs\amd64_Microsoft.Windows.c..-controls.resources_6595b64144ccf1df_ 5.82.7600.16385_sk-sk_a2925e32cabe818d\comct132.dll.mui
\Windows\winsxs\amd64_Microsoft.Windows.c..-controls.resources_6595b64144ccf1df_ 5.82.7600.16385_sl-si_a1a47feacb589470\comct132.dll.mui
\Windows\winsxs\amd64_Microsoft.Windows.c..-controls.resources_6595b64144ccf1df_ 5.82.7600.16385_sr-..-cs_412dfc7d44b0f7b8\comct132.dll.mui
\Windows\winsxs\amd64_Microsoft.Windows.c..-controls.resources_6595b64144ccf1df_ 5.82.7600.16385_sv-se_9f7243facccd99be\comct132.dll.mui
\Windows\winsxs\amd64_Microsoft.Windows.c..-controls.resources_6595b64144ccf1df_ 5.82.7600.16385_th-th_447c65adbe1256ff\comct132.dll.mui
\Windows\winsxs\amd64_Microsoft.Windows.c..-controls.resources_6595b64144ccf1df_ 5.82.7600.16385_tr-tr_487f3e41bb899baf\comct132.dll.mui
\Windows\winsxs\amd64_Microsoft.Windows.c..-controls.resources_6595b64144ccf1df_ 5.82.7600.16385_uk-ua_e45f70e8b2bac1fb\comct132.dll.mui
\Windows\winsxs\amd64_Microsoft.Windows.c..-controls.resources_6595b64144ccf1df_ 5.82.7600.16385_zh-cn_19dcac3f6bc16dce\comct132.dll.mui
\Windows\winsxs\amd64_Microsoft.Windows.c..-controls.resources_6595b64144ccf1 df_5.82.7600.16385_zh-hk_1887a4cd6c9ce05e\comct132.dll.mui
\Windows\winsxs\amd64_Microsoft.Windows.c..-controls.resources_6595b64144ccf1df_ 5.82.7600.16385_zh-tw_1dd8e99569324a3e\comct132.dll.mui
\Windows\winsxs\amd64_Microsoft-Windows-b..environment-dvd-efi_31bf3856ad364e35_6.1.7600.16385_none 313c88fc9e3423aa\boot.sdi
\Windows\winsxs\amd64_Microsoft-Windows-b..environment-Windows_31bf3856ad364e35_6.1.7601.17514_ none_c75e9c99a36a285a\winload.efi
\Windows\winsxs\amd64_Microsoft-Windows-b..environment-Windows_31bf3856ad364e35_6.1.7601.17514_ none_c75e9c99a36a285a\winload.exe
\Windows\winsxs\amd64_Microsoft-Windows-b..environment-Windows_31bf3856ad364e35_6.1.7601.17514_ none_c75e9c99a36a285a\winresume.efi
\Windows\winsxs\amd64_Microsoft-Windows-b..environment-Windows_31bf3856ad364e35_6.1.7601.17514_ none_c75e9c99a36a285a\winresume.exe
\Windows\winsxs\amd64_Microsoft-Windows-b..nvironment-dvd-pcat_31bf3856ad364e35_6.1.7600.16385_none_ f60cc30a4a2fb068\boot.sdi
\Windows\winsxs\amd64_Microsoft-Windows-b..os-loader.resources 31bf3856ad364e35_6.1.7600.16385_de-de_299cd5b40ed6d155\winload.efi.mui
\Windows\winsxs\amd64_Microsoft-Windows-b..os-loader.resources 31bf3856ad364e35_6.1.7600.16385_de-de_299cd5b40ed6d155\winload.exe.mui
\Windows\winsxs\amd64_Microsoft-Windows-b..os-loader.resources 31bf3856ad364e35_6.1.7600.16385_de-de_299cd5b40ed6d155\winresume.efi.mui
\Windows\winsxs\amd64_Microsoft-Windows-b..os-loader.resources 31bf3856ad364e35_6.1.7600.16385_de-de_299cd5b40ed6d155\winresume.exe.mui
\Windows\winsxs\amd64_Microsoft-Windows-b..t-Windows.resources 31bf3856ad364e35_6.1.7600.16385_de-de_cf8114625afc4538\winload.efi.mui
\Windows\winsxs\amd64_Microsoft-Windows-b..t-Windows.resources 31bf3856ad364e35_6.1.7600.16385_de-de_cf8114625afc4538\winload.exe.mui
\Windows\winsxs\amd64_Microsoft-Windows-b..t-Windows.resources 31bf3856ad364e35_6.1.7600.16385_de-de_cf8114625afc4538\winresume.efi.mui
\Windows\winsxs\amd64_Microsoft-Windows-b..t-Windows.resources 31bf3856ad364e35_6.1.7600.16385_de-de_cf8114625afc4538\winresume.exe.mui
\Windows\winsxs\amd64_Microsoft-Windows-b..vironment-os-loader 31bf3856ad364e35_6.1.7601.17514_none_ b94cbfa183466a89\winload.efi
\Windows\winsxs\amd64_Microsoft-Windows-b..vironment-os-loader 31bf3856ad364e35_6.1.7601.17514_none_ b94cbfa183466a89\winload.exe
\Windows\winsxs\amd64_Microsoft-Windows-b..vironment-os-loader 31bf3856ad364e35_6.1.7601.17514_none_ b94cbfa183466a89\winresume.efi
\Windows\winsxs\amd64_Microsoft-Windows-b..vironment-os-loader 31bf3856ad364e35_6.1.7601.17514_none_ b94cbfa183466a89\winresume.exe
\Windows\winsxs\amd64_Microsoft-Windows-comct132-v5.resources 31bf3856ad364e35_6.1.7600.16385_ar-sa_2a1f11f2ea9181ed\comct132.dll.mui \Windows\winsxs\amd64_Microsoft-Windows-comctl32-v5.resources_31bf3856ad364e35_6.1.7600.16385_bg-bg_d05ef37bdb11d344\comctl32.dll.mui
\Windows\winsxs\amd64_Microsoft-Windows-comctl32-v5.resources 31bf3856ad364e35_6.1.7600.16385_cs-cz_7b686a16c899af6f\comctl32.dll.mui
\Windows\winsxs\amd64_Microsoft-Windows-comctl32-v5.resources 31bf3856ad364e35_6.1.7600.16385_da-dk_18a24a3dbedfab6e\comctl32.dll.mui
\Windows\winsxs\amd64_Microsoft-Windows-comctl32-v5.resources_31bf3856ad364e35_6.1.7600.16385_de-de 15cddf79c0b60008\comctl32.dll.mui
\Windows\winsxs\amd64_Microsoft-Windows-comctl32-v5.resources_31bf3856ad364e35_6.1.7600.16385_el-gr_be640d0cafcb6896\comctl32.dll.mui
\Windows\winsxs\amd64_Microsoft-Windows-comctl32-v5.resources_31bf3856ad364e35_6.1.7600.16385_en-us_bebeb572af940bcd\comctl32.dll.mui
\Windows\winsxs\amd64_Microsoft-Windows-comctl32-v5.resources_31bf3856ad364e35_6.1.7600.16385_es-es_be8a1256afbafd72\comctl32.dll.mui
\Windows\winsxs\amd64_Microsoft-Windows-comctl32-v5.resources_31bf3856ad364e35_6.1.7600.16385_et-ee_b849dde6b3c0da01\comctl32.dll.mui
\Windows\winsxs\amd64_Microsoft-Windows-comctl32-v5.resources_31bf3856ad364e35_6.1.7600.16385_fi-fi_5da51703a4d4ef9c\comctl32.dll.mui
\Windows\winsxs\amd64_Microsoft-Windows-comctl32-v5.resources_31bf3856ad364e35_6.1.7600.16385_fr-fr_61418855a28d13d4\comctl32.dll.mui
\Windows\winsxs\amd64_Microsoft-Windows-comctl32-v5.resources_31bf3856ad364e35_6.1.7600.16385_he-il_a5612ff788fc14c2\comctl32.dll.mui
\Windows\winsxs\amd64_Microsoft-Windows-comctl32-v5.resources_31bf3856ad364e35_6.1.7600.16385_hr-hr_a77de2d787af8188\comctl32.dll.mui
\Windows\winsxs\amd64_Microsoft-Windows-comctl32-v5.resources_31bf3856ad364e35_6.1.7600.16385_hu-hu_a8b2089d86ece2f0\comctl32.dll.mui
\Windows\winsxs\amd64_Microsoft-Windows-comctl32-v5.resources_31bf3856ad364e35_6.1.7600.16385_it-it_4b697e9c79bef952\comctl32.dll.mui
\Windows\winsxs\amd64_Microsoft-Windows-comctl32-v5.resources_31bf3856ad364e35 617600.16385_ja-jp_ed8efda96cda0b2d\comctl32.dll.mui
\Windows\winsxs\amd64_Microsoft-Windows-comctl32-v5.resources_31bf3856ad364e35_6.1.7600.16385_ko-kr_90f8da5e5f4ad243\comctl32.dll.mui
\Windows\winsxs\amd64_Microsoft-Windows-comctl32-v5.resources_31bf3856ad364e35_6.1.7600.16385_lt-lt_34c4065f51729de0\comctl32.dll.mui
\Windows\winsxs\amd64_Microsoft-Windows-comctl32-v5.resources_31bf3856ad364e35_6.1.7600.16385_lv-lv_359174e350f0ded0\comctl32.dll.mui
\Windows\winsxs\amd64_Microsoft-Windows-comctl32-v5.resources_31bf3856ad364e35_6.1.7600.16385_nb-no_798b5b93376ffdff\comctl32.dll.mui
\Windows\winsxs\amd64_Microsoft-Windows-comctl32-v5.resources_31bf3856ad364e35_6.1.7600.16385_nl-nl_77caa6d1389c07d4\comctl32.dll.mui
\Windows\winsxs\amd64_Microsoft-Windows-comctl32-v5.resources_31bf3856ad364e35_6.1.7600.16385_pl-pl_be070153 1 dbe7588\comctl32.dll.mui
\Windows\winsxs\amd64_Microsoft-Windows-comctl32-v5.resources_31bf3856ad364e35_6.1.7600.16385_pt-br_c05aebf71c48096c\comctl32.dll.mui
\Windows\winsxs\amd64_Microsoft-Windows-comctl32-v5.resources_31bf3856ad364e35_6.1.7600.16385_pt-pt_c13cbb631bb77948\comctl32.dll.mui
\Windows\winsxs\amd64_Microsoft-Windows-comctl32-v5.resources_31bf3856ad364e35_6.1.7600.16385_ro-ro_0577819b021e44a4\comctl32.dll.mui
\Windows\winsxs\amd64_Microsoft-Windows-comctl32-v5.resources_31bf3856ad364e35_6.1.7600.16385_ru-ru_07dfcd2700990774\comctl32.dll.mui
\Windows\winsxs\amd64_Microsoft-Windows-comctl32-v5.resources_31bf3856ad364e35_6.1.7600.16385_sk-sk_a6fad1d3f5b2f99e\comctl32.dll.mui
\Windows\winsxs\amd64_Microsoft-Windows-comctl32-v5.resources_31bf3856ad364e35_6.1.7600.16385_sl-si_a60cf38bf64d0c81\comctl32.dll.mui
\Windows\winsxs\amd64_Microsoft-Windows-comctl32-v5.resources_31bf3856ad364e35_6.1.7600.16385_sr-..-cs_4596701e6fa56fc9\comctl32.dll.mui
\Windows\winsxs\amd64_Microsoft-Windows-comctl32-v5.resources_31bf3856ad364e35_6.1.7600.16385_sv-se_a3dab79bf7c211cf\comctl32.dll.mui
\Windows\winsxs\amd64_Microsoft-Windows-comctl32-v5.resources_31bf3856ad364e35_6.1.7600.16385_th-th_48e4d94ee906cf10\comctl32.dll.mui
\Windows\winsxs\amd64_Microsoft-Windows-comctl32-v5.resources_31bf3856ad364e35_6.1.7600.16385_tr-tr_4ce801e2e67e13c0\comctl32.dll.mui
\Windows\winsxs\amd64_Microsoft-Windows-comctl32-v5.resources_31bf3856ad364e35_6.1.7600.16385_uk-ua_e8c7e489ddaf3a0c\comctl32.dll.mui
\Windows\winsxs\amd64_Microsoft-Windows-comctl32-v5.resources_31bf3856ad364e35_6.1.7600.16385_zh-cn_1e451fe096b5e5df\comctl32.dll.mui \Windows\winsxs\amd64_Microsoft-Windows-comctl32-v5.resources_31bf3856ad364e35_6.1.7600.16385_zh-hk_1cf0186e9791586f\comctl32.dll.mui
\Windows\winsxs\amd64_Microsoft-Windows-comctl32-v5.resources_31bf3856ad364e35_6.1.7600.16385_zh-tw_22415d369426c24f\comctl32.dll.mui
\Windows\winsxs\amd64_Microsoft-Windows-international-core_31bf3856ad364e35_6.1.7600.16385_none_459f562ff37206dd\nlscoremig.dll
\Windows\winsxs\amd64_Microsoft-Windows-m..-downlevelmanifests_31bf3856ad364e35_6.1.7601.17514_none_609ebaed9a394a1c\cntrtextmig.dll
\Windows\winsxs\amd64_Microsoft-Windows-m..-downlevelmanifests_31bf3856ad364e35_6.1.7601.17514_none_609ebaed9a394a1c\iasmigplugin.dll
\Windows\winsxs\amd64_Microsoft-Windows-m..-downlevelmanifests_31bf3856ad364e35_6.1.7601.17514_none_609ebaed9a394a1c\mqmigplugin.dll
\Windows\winsxs\amd64_Microsoft-Windows-m..-downlevelmanifests_31bf3856ad364e35_6.1.7601.17514_none_609ebaed9a394a1c\nlscoremig.dll
\Windows\winsxs\amd64_Microsoft-Windows-m..-downlevelmanifests_31bf3856ad364e35_6.1.7601.17514_none_609ebaed9a394a1c\stormigplugin.dll
\Windows\winsxs\amd64_Microsoft-Windows-m..-downlevelmanifests_31bf3856ad364e35_6.1.7601.17514_none_609ebaed9a394a1c\wmimigrationplugin.dll
\Windows\winsxs\amd64_Microsoft-Windows-msmq-installer_31bf3856ad364e35_6.1.7601.17514_none_d937aaa216d4 1 df2\mqmigplugin.dll
\Windows\winsxs\amd64_Microsoft-Windows-n..n_service_migplugin_31bf3856ad364e35_6.1.7600.16385_none_ba4380f063fe255f\iasmigplugin.dll
\Windows\winsxs\amd64_Microsoft-Windows-notepad_31bf3856ad364e35_6.1.7600.16385_none_cb0f7f2289b0c21a\notepad.exe
\Windows\winsxs\amd64_Microsoft-Windows-notepadwin_31bf3856ad364e35_6.1.7600.16385_none_9ebebe8614be1470\notepad.exe
\Windows\winsxs\amd64_Microsoft-Windows-o..n-efiles-extend-apis_31bf3856ad364e35_6.1.7601.17514_none_eb18c2a64aeb3fb2\offlinefileswmiprovider.mof
\Windows\winsxs\amd64_Microsoft-Windows-o..n-efiles-extend-apis_31bf3856ad364e35_6.1.7601.17514_none_eb18c2a64aeb3fb2\offlinefileswmiprovider_uninstall.mof
\Windows\winsxs\amd64_Microsoft-Windows-p..unterinfrastructure_31bf3856ad364e35_6.1.7600.16385_none_cd7aeeff1897d018\cntrtextmig.dll
\Windows\winsxs\amd64_Microsoft-Windows-rasbase_31bf3856ad364e35_6.1.7601.17514_none_6c066d50910ecf5a\rasctrnm.h
\Windows\winsxs\amd64_Microsoft-Windows-rasctrs_31bf3856ad364e35_6.1.7600.16385_none_70130a6690196ee7\rasctrnm.h
\Windows\winsxs\amd64_Microsoft-Windows-s..dthemes-calligraphy_31bf3856ad364e35_6.1.7600.16385_one_c1407bc73caf8dfc\desktop.ini
\Windows\winsxs\amd64_Microsoft-Windows-s..1-soundthemes-delta_31bf3856ad364e35_6.1.7600.16385_none_fbf7e0678b64a4b8\desktop.ini
\Windows\winsxs\amd64_Microsoft-Windows-s..ndthemes-characters_31bf3856ad364e35_6.1.7600.16385_none_08da32b0fdad9220\desktop.ini
\Windows\winsxs\amd64_Microsoft-Windows-s..oundthemes-festival_31bf3856ad364e35_6.1.7600.16385_none_121f20b55f0bde68\desktop.ini
\Windows\winsxs\amd64_Microsoft-Windows-s..oundthemes-heritage_31bf3856ad364e35_6.1.7600.16385_none_5872c0830d0c4747\desktop.ini
\Windows\winsxs\amd64_Microsoft-Windows-s..-soundthemes-garden_31bf3856ad364e35_6.1.7600.16385_none_f7a4bf1e15863e21\desktop.ini
\Windows\winsxs\amd64_Microsoft-Windows-s..-soundthemes-quirky_31bf3856ad364e35_6.1.7600.16385_none_e55404efe49bb9cb\desktop.ini
\Windows\winsxs\amd64_Microsoft-Windows-s..-soundthemes-savanna_31bf3856ad364e35_6.1.7600.16385_none_8501e89d0b011992\desktop.ini
\Windows\winsxs\amd64_Microsoft-Windows-s..-soundthemes-sonata_31bf3856ad364e35_6.1.7600.16385_none_201752c112c5078c\desktop.ini
\Windows\winsxs\amd64_Microsoft-Windows-s..undthemes-afternoon_31bf3856ad364e35_6.1.7600.16385_none_2a05e57d5ab3659e\desktop.ini
\Windows\winsxs\amd64_Microsoft-Windows-s..undthemes-cityscape_31bf3856ad364e35_6.1.7600.16385_none_5b48f43248490503\desktop.ini
\Windows\winsxs\amd64_Microsoft-Windows-s..undthemes-landscape_31bf3856ad364e35_6.1.7600.16385_none_7a83a914edc3de49\desktop.ini
\Windows\winsxs\amd64_Microsoft-Windows-shell-soundthemes-raga_31bf3856ad364e35_6.1.7600.16385_none_2fe300bf8e73cdbd\desktop.ini
\Windows\winsxs\amd64_Microsoft-Windows-storagemigration_31bf3856ad364e35_6.1.7600.16385_none_3a0ea38757a0534e\stormigplugin.dll
\Windows\winsxs\amd64_Microsoft-Windows-t..c-journalnotewriter_31bf3856ad364e35_6.1.7600.16385_none_9e59e11166b68 3d3\jnwdrv.dll
\Windows\winsxs\amd64_Microsoft-Windows-t..c-journalnotewriter_31bf3856ad364e35_6.1.7600.16385_none_9e59e11166b68 3d3\jnwdui.dll
\Windows\winsxs\amd64_Microsoft-Windows-t..c-journalnotewriter_31bf3856ad364e35_6.1.7600.16385_none_9e59e11166b68 3d3\jnwmon.dll
\Windows\winsxs\amd64_Microsoft-Windows-t..c-journalnotewriter_31bf3856ad364e35_6.1.7600.16385_none_9e59e11166b68 3d3\jnwppr.dll \Windows\winsxs\amd64_Microsoft-Windows-t..ournalnotewriterqfe_31bf3856ad364e35_6.1.7600.16385_none_a98d2bb89 855d54d\jnwdrv.dll
\Windows\winsxs\amd64_Microsoft-Windows-t..ournalnotewriterqfe_31bf3856ad364e35_6.1.7600.16385_none_a98d2bb89 855d54d\jnwdui.dll
\Windows\winsxs\amd64_Microsoft-Windows-t..ournalnotewriterqfe_31bf3856ad364e35_6.1.7600.16385_none_a98d2bb89 855d54d\jnwmon.dll
\Windows\winsxs\amd64_Microsoft-Windows-t..ournalnotewriterqfe_31bf3856ad364e35_6.1.7600.16385_none_a98d2bb89 855d54d\jnwppr.dll
\Windows\winsxs\amd64_Microsoft-Windows-vwifi_31bf3856ad364e35_6.1.7600.16385_none_bb899fc9dd3605e0\vwifibus.sys
\Windows\winsxs\amd64_Microsoft-Windows-wmi-core_31bf3856ad364e35_6.1.7601.17514_none_177a088436382a34\wmimigrationplugin.dll
\Windows\winsxs\amd64_Microsoft-Windows-write_31bf3856ad364e35_6.1.7600.16385_none_bb77c3d6f6c8e3f6\write.exe
\Windows\winsxs\amd64_Microsoft-Windows-writewin_31bf3856ad364e35_6.1.7600.16385_none_378836c309ee380e\write.exe
\Windows\winsxs\amd64_msmouse.inf_31bf3856ad364e35_6.1.7600.16385_none_aa28fd23ec0c39f9V8042prt.sys
\Windows\winsxs\amd64 netvwifibus.inf_31bf3856ad364e35_6.1.7600.16385_none_9c38dbd6bea6f0fc\vwifibus.sys
\Windows\winsxs\amd64ph3xibc0.inf_31bf3856ad364e35_6.1.7600.16385_none_9bcfa7676447c4d4h3xib64.sys
\Windows\winsxs\amd64ph3xibc0.inf_31bf3856ad364e35_6.1.7600.16385_none_9bcfa7676447c4dd\ph3xib64mv.dll
\Windows\winsxs\amd64ph3xibc1.inf_31bf3856ad364e35_6.1.7600.16385_none_9c58b99c7d660146\ph3xib64.sys
\Windows\winsxs\amd64ph3xibc1.inf_31bf3856ad364e35_6.1.7600.16385_none_9c58b99c7d660146\ph3xib64mv.dll
\Windows\winsxs\amd64ph3xibc10.inf_31bf3856ad364e35_6.1.7600.16385_none_12b403556d5e12e6\ph3xib64.sys
\Windows\winsxs\amd64ph3xibc10.inf_31bf3856ad364e35_6.1.7600.16385_none_12b403556d5e12e6\ph3xib64mv.dll
\Windows\winsxs\amd64ph3xibc11.inf_31bf3856ad364e35_6.1.7600.16385_none_3bc5d976e6440be5\ph3xib64.sys
\Windows\winsxs\amd64ph3xibc11.inf_31bf3856ad364e35_6.1.7600.16385_none_3bc5d976e6440be5\ph3xib64mv.dll
\Windows\winsxs\amd64ph3xibc12.inf_31bf3856ad364e35_6.1.7600.16385_none_64d7af985f2a04e4\ph3xib64.sys
\Windows\winsxs\amd64ph3xibc12.inf_31bf3856ad364e35_6.1.7600.16385_none_64d7af985f2a04e4\ph3xib64mv.dll
\Windows\winsxs\amd64ph3xibc2.inf_31bf3856ad364e35_6.1.7600.16385_none_9ce1cbd196843daf\ph3xib64.sys
\Windows\winsxs\amd64ph3xibc2.inf_31bf3856ad364e35_6.1.7600.16385_none_9ce1cbd196843daf\ph3xib64mv.dll
\Windows\winsxs\amd64ph3xibc3.inf_31bf3856ad364e35_6.1.7600.16385_none_9d6ade06afa27a18\ph3xib64.sys
\Windows\winsxs\amd64ph3xibc3.inf_31bf3856ad364e35_6.1.7600.16385_none_9d6ade06afa27a18\ph3xib64mv.dll
\Windows\winsxs\amd64ph3xibc4.inf_31bf3856ad364e35_6.1.7600.16385_none_9df3f03bc8c0b681\ph3xib64.sys
\Windows\winsxs\amd64ph3xibc4.inf_31bf3856ad364e35_6.1.7600.16385_none_9df3f03bc8c0b681\ph3xib64mv.dll
\Windows\winsxs\amd64ph3xibc5.inf_31bf3856ad364e35_6.1.7600.16385_none_9e7d0270e1def2ea\ph3xib64.sys
\Windows\winsxs\amd64ph3xibc5.inf_31bf3856ad364e35_6.1.7600.16385_none_9e7d0270e1def2ea\ph3xib64mv.dll
\Windows\winsxs\amd64ph3xibc6.inf_31bf3856ad364e35_6.1.7600.16385_none_9f0614a5fafd2f53\ph3xib64.sys
\Windows\winsxs\amd64ph3xibc6.inf_31bf3856ad364e35_6.1.7600.16385_none_9f0614a5fafd2f53\ph3xib64mv.dll
\Windows\winsxs\amd64ph3xibc7.inf_31bf3856ad364e35_6.1.7600.16385_none_9f8f26db141b6bbc\ph3xib64.sys
\Windows\winsxs\amd64ph3xibc7.inf_31bf3856ad364e35_6.1.7600.16385_none_9f8f26db141b6bbc\ph3xib64mv.dll
\Windows\winsxs\amd64ph3xibc8.inf_31bf3856ad364e35_6.1.7600.16385_none_a01839102d39a825\ph3xib64.sys
\Windows\winsxs\amd64ph3xibc8.inf_31bf3856ad364e35_6.1.7600.16385_none_a01839102d39a825\ph3xib64mv.dll
\Windows\winsxs\amd64ph3xibc9.inf_31bf3856ad364e35_6.1.7600.16385_none_a0a14b454657e48e\ph3xib64.sys
\Windows\winsxs\amd64ph3xibc9.inf_31bf3856ad364e35_6.1.7600.16385_none_a0a14b454657e48e\ph3xib64mv.dll
\Windows\winsxs\amd64ph6xib64c0.inf_31bf3856ad364e35_6.1.7600.16385_none_f3eb68fc33ce478c\ph6xib64.sys
\Windows\winsxs\amd64ph6xib64c0.inf_31bf3856ad364e35_6.1.7600.16385_none_f3eb68fc33ce478c\ph6xib64mv.dll
\Windows\winsxs\amd64ph6xib64c1.inf_31bf3856ad364e35_6.1.7600.16385_none_9709ad05265f64c5\ph6xib64.sys
\Windows\winsxs\amd64ph6xib64c1.inf_31bf3856ad364e35_6.1.7600.16385_none_9709ad05265f64c5\ph6xib64mv.dll
\Windows\winsxs\amd64prnbr004.inf_31bf3856ad364e35_6.1.7600.16385_none_4adb5f0cf66cc770\amd64\brci08ui.dll
\Windows\winsxs\amd64prnbr005.inf_31bf3856ad364e35_6.1.7600.16385_none_4b6471420f8b03d9\amd64\brci08ui.dll
\Windows\winsxs\amd64prnca00b.inf_31bf3856ad364e35_6.1.7600.16385_none_dd3ee736dd6ff736\amd64\cnbmr284.dll
\Windows\winsxs\amd64prnca00c.inf_31bf3856ad364e35_6.1.7600.16385_none_ddc7f96bf68e339flamd64\cnbjop7i.dll
\Windows\winsxs\amd64prnca00d.inf_31bf3856ad364e35_6.1.7600.16385_none_de510ba10fac7008\amd64\cnbjop7i.dll \Windows\winsxs\amd64prnca00d.inf_
31bf3856ad364e35_6.1.7600.16385_none_
de510ba10fac7008\amd64\cnbmr284.dll
\Windows\winsxs\amd64prnhp003.inf_
31bf3856ad364e35_6.1.7600.16385_none_
2fd781a76c9dcc13\amd64\hpadbrgb.icc
\Windows\winsxs\amd64prnhp003.inf_
31bf3856ad364e35_6.1.7600.16385_none_
2fd781a76c9dcc13\amd64\hpcdmc71.dll
\Windows\winsxs\amd64prnhp003.inf_
31bf3856ad364e35_6.1.7600.16385_none_
2fd781a76c9dcc13\amd64\hpfiew71.dll
\Windows\winsxs\amd64prnhp003.inf_
31bf3856ad364e35_6.1.7600.16385_none_
2fd781a76c9dcc13\amd64\hpfigw71.dll
\Windows\winsxs\amd64prnhp003.inf_
31bf3856ad364e35_6.1.7600.16385_none_
2fd781a76c9dcc13\amd64\hpfrsw71.dll
\Windows\winsxs\amd64prnhp004.inf_
31bf3856ad364e35_6.1.7600.16385_none_306093
dc85bc087c\amd64\hpadbrgb.icc
\Windows\winsxs\amd64prnhp004.inf_
31bf3856ad364e35_6.1.7600.16385_none_306093
dc85bc087c\amd64\hpfiew71.dll
\Windows\winsxs\amd64prnhp004.inf_
31bf3856ad364e35_6.1.7600.16385_none_
306093dc85bc087c\amd64\hpfigw71.dll
\Windows\winsxs\amd64prnhp004.inf_
31bf3856ad364e35_6.1.7600.16385_none_306093
dc85bc087c\amd64\hpfrsw71.dll
\Windows\winsxs\amd64prnhp005.inf_
31bf3856ad364e35_6.1.7600.16385_none_
30e9a6119eda44e5\amd64\hpadbrgb.icc
\Windows\winsxs\amd64prnhp005.inf_
31bf3856ad364e35_6.1.7600.16385_none_
30e9a6119eda44e5\amd64\hpcdmc71.dll
\Windows\winsxs\amd64prnky003.inf_
31bf3856ad364e35_6.1.7600.16385_none_
3d4c795ded41268f\amd64\kyw7fres.dll
\Windows\winsxs\amd64prnky003.inf_
31bf3856ad364e35_6.1.7600.16385_none_
3d4c795ded41268f\amd64\kyw7sres.dll
\Windows\winsxs\amd64prnky009.inf_
31bf3856ad364e35_6.1.7600.16385_none_
4082e69c83f69105\amd64\kyw7fres.dll
\Windows\winsxs\amd64prnky009.inf_
31bf3856ad364e35_6.1.7600.16385_none_
4082e69c83f69105\amd64\kyw7sres.dll
\Windows\winsxs\amd64prnod002.inf_
31bf3856ad364e35_6.1.7600.16385_none_
ae12c1cb94acf497\amd64\okdteres.dll
\Windows\winsxs\amd64prnod002.inf_
31bf3856ad364e35_6.1.7600.16385_none_
ae12c1cb94acf497\amd64\okmlivu.gpd
\Windows\winsxs\amd64prnok002.inf_
31bf3856ad364e35_6.1.7600.16385_none_
cd8f9cb5e2f6c390\amd64\okdteres.dll
\Windows\winsxs\amd64prnok002.inf_
31bf3856ad364e35_6.1.7600.16385_none_
cd8f9cb5e2f6c390\amd64\okmlivu.gpd
\Windows\winsxs\amd64prnrc00a.inf_
31bf3856ad364e35_6.1.7600.16385_none_
39ffb3f2f8e1ac64\amd64\ricfg7.xml
\Windows\winsxs\amd64prnrc00c.inf_
31bf3856ad364e35_6.1.7600.16385_none_
3b11d85d2b1e2536\amd64\ricfg7.xml
\Windows\winsxs\amd64
wiabr002.inf_31bf3856ad364e35_6.1.7600.16385_
none_06ca14b5667ce7e9\brmf3wia.dll
\Windows\winsxs\amd64
wiabr002.inf_31bf3856ad364e35_6.1.7600.16385_
none_06ca14b5667ce7e9\brus2sti.dll
\Windows\winsxs\amd64
wiabr004.inf_31bf3856ad364e35_6.1.7600.16385_
none_07dc391f98b960bb\brmf3wia.dll
\Windows\winsxs\amd64
wiabr004.inf_31bf3856ad364e35_6.1.7600.16385
none_07dc391f98b960bb\brus2sti.dll
\Windows\winsxs\amd64
wiabr005.inf_31bf3856ad364e35_6.1.7600.16385_
none_08654b54b1d79d24\brmf3wia.dll
\Windows\winsxs\amd64
wiabr005.inf_31bf3856ad364e35_6.1.7600.16385_
one_08654b54b1d79d24\brus2sti.dll
\Windows\winsxs\amd64
wiabr006.inf_31bf3856ad364e35_6.1.7600.16385_
none_08ee5d89caf5d98d\brmf3wia.dll
\Windows\winsxs\amd64
wiabr006.inf_31bf3856ad364e35_6.1.7600.16385_
none_08ee5d89caf5d98d\brus2sti.dll
\Windows\winsxs\amd64
wiabr007.inf_31bf3856ad364e35_6.1.7600.16385_
none_09776fbee41415f6\brmf3wia.dll
\Windows\winsxs\amd64
wiabr007.inf_31bf3856ad364e35_6.1.7600.16385_
none_09776fbee41415f6\brus2sti.dll
\Windows\winsxs\amd64
wiabr008.inf_31bf3856ad364e35_6.1.7600.16385_
none_0a0081f3fd32525f\brmf3wia.dll
\Windows\winsxs\amd64
wiabr008.inf_31bf3856ad364e35_6.1.7600.16385_
none_0a0081f3fd32525f\brus2sti.dll
\Windows\winsxs\amd64
wiabr009.inf_31bf3856ad364e35_6.1.7600.16385_
none_0a89942916508ec8\brmf3wia.dll
\Windows\winsxs\amd64
wiabr009.inf_31bf3856ad364e35_6.1.7600.16385_
none_0a89942916508ec8\brus2sti.dll
\Windows\winsxs\amd64
wiabr00a.inf_31bf3856ad364e35_6.1.7600.16385_
none_1ff46c750309ff30\brmf3wia.dll
\Windows\winsxs\amd64
wiabr00a.inf_31bf3856ad364e35_6.1.7600.16385_
none_1ff46c750309ff30\brus2sti.dll
\Windows\winsxs\amd64
wiaca00a.inf_31bf3856ad364e35_6.1.7600.16385_
none_99b6af14669e5418\cnhi07a.dll
\Windows\winsxs\amd64
wiaca00a.inf_31bf3856ad364e35_6.1.7600.16385_
none_99b6af14669e5418\cnhw07a.dll
\Windows\winsxs\amd64
wiaca00b.inf_31bf3856ad364e35_6.1.7600.16385_
none_9a3fc1497fbc9081\cnhi07a.dll
\Windows\winsxs\amd64
wiaca00b.inf_31bf3856ad364e35_6.1.7600.16385_
none_9a3fc1497fbc9081\cnhi08a.dll
\Windows\winsxs\amd64
wiaca00b.inf_31bf3856ad364e35_6.1.7600.16385_
none_9a3fc1497fbc9081\cnh108a.dll
\Windows\winsxs\amd64
wiaca00b.inf_31bf3856ad364e35_6.1.7600.16385_
none_9a3fc1497fbc9081\cnhmca.dll \Windows\winsxs\amd64
  wiaca00b.inf_31bf3856ad364e35_6.1.7600.16385_
  none_9a3fc1497fbc9081\cnhmca6.dll
\Windows\winsxs\amd64
  wiaca00b.inf_31bf3856ad364e35_6.1.7600.16385_
  none_9a3fc1497fbc9081\cnhw07a.dll
\Windows\winsxs\amd64
  wiaca00b.inf_31bf3856ad364e35_6.1.7600.16385_
  none_9a3fc1497fbc9081\cnhw08a.dll
\Windows\winsxs\amd64
  wiaca00c.inf_31bf3856ad364e35_6.1.7600.16385_
  none_9ac8d37e98daccea\cnhi06a.dll
\Windows\winsxs\amd64
  wiaca00c.inf_31bf3856ad364e35_6.1.7600.16385_
  none_9ac8d37e98daccea\cnhi07a.dll
\Windows\winsxs\amd64
  wiaca00c.inf_31bf3856ad364e35_6.1.7600.16385_
  none_9ac8d37e98daccea\cnhw06a.dll
\Windows\winsxs\amd64
  wiaca00c.inf_31bf3856ad364e35_6.1.7600.16385_
  none_9ac8d37e98daccea\cnhw07a.dll
\Windows\winsxs\amd64
  wiaca00d.inf_31bf3856ad364e35_6.1.7600.16385_
  none_9b51e5b3b1P90953\cnhi06a.dll
\Windows\winsxs\amd64
  wiaca00d.inf_31bf3856ad364e35_6.1.7600.16385_
  none_9b51e5b3b1f90953\cnhw06a.dll
\Windows\winsxs\amd64
  wiaca00e.inf_31bf3856ad364e35_6.1.7600.16385_
  none_9bdaf7e8cb1745bc\cnhi06a.dll
\Windows\winsxs\amd64
  wiaca00e.inf_31bf3856ad364e35_6.1.7600.16385_
  none_9bdaf7e8cb1745bc\cnhw06a.dll
\Windows\winsxs\amd64
  wiaca00f.inf_31bf3856ad364e35_6.1.7600.16385_
  none_9c640a1de4358225\cnhi06a.dll
\Windows\winsxs\amd64
  wiaca00f.inf_31bf3856ad364e35_6.1.7600.16385_
  none_9c640a1de4358225\cnhw06a.dll
\Windows\winsxs\amd64
  wiaca00i.inf_31bf3856ad364e35_6.1.7600.16385_
  none_9dff40bd2f903760\cnhi08a.dll
\Windows\winsxs\amd64
  wiaca00i.inf_31bf3856ad364e35_6.1.7600.16385_
  none_9dff40bd2f903760\cnh108a.dll
\Windows\winsxs\amd64
  wiaca00i.inf_31bf3856ad364e35_6.1.7600.16385_
  none_9dff40bd2f903760\cnhmca.dll
\Windows\winsxs\amd64
  wiaca00i.inf_31bf3856ad364e35_6.1.7600.16385_
  none_9dff40bd2f903760\cnhmca6.dll
\Windows\winsxs\amd64
  wiaca00i.inf_31bf3856ad364e35_6.1.7600.16385_
  none_9dff40bd2f903760\cnhw08a.dll
\Windows\winsxs\backup\amd64_Microsoft-Windows-
  b..environment-
  Windows_31bf3856ad364e35_6.1.7601.17514_
  none_c75e9c99a36a285a winload.efi_75834aa0
\Windows\winsxs\backup\amd64_Microsoft-Windows-
  b..environment-
  Windows_31bf3856ad364e35_6.1.7601.17514_
  none_c75e9c99a36a285a winload.exe_75835076
\Windows\winsxs\backup\amd64_Microsoft-Windows-
  b..environment-
  Windows_31bf3856ad364e35_6.1.7601.17514_
  none_c75e9c99a36a285a winresume.efi_85cd069f
\Windows\winsxs\backup\amd64_Microsoft-Windows-
  b..environment-
  Windows_31bf3856ad364e35_6.1.7601.17514_
  none_c75e9c99a36a285a winresume.exe_85cd1215
\Windows\winsxs\backup\amd64_Microsoft-Windows-b
  os-loader.resources_31bf3856ad364e35_
  6.1.7600.16385_de-de_299cd5b40ed6d155
  winload.efi.mui 35ee487d
\Windows\winsxs\backup\amd64_Microsoft-Windows-
  b..os-loader.resources_31bf3856ad364e35_
  6.1.7600.16385_de-de_299cd5b40ed6d155   winload.
  exe.mui 3bc5b827
\Windows\winsxs\backup\amd64_Microsoft-Windows-
  b..os-loader.resources_31bf3856ad364e35_
  6.1.7600.16385_de-de_299cd5b40ed6d155   winre-
  sume.efi.mui f412814e
\Windows\winsxs\backup\amd64_Microsoft-Windows-
  b..os-loader.resources_31bf3856ad364e35_
  6.1.7600.16385_de-de_299cd5b40ed6d155
  winresume.exe.mui_ff8b5358
\Windows\winsxs\backup\amd64_Microsoft-Windows-
  b..t-Windows.resources_31bf3856ad364e35_
  6.1.7600.16385_de-de_cf8114625afc4538   winload.
  efi.mui 35ee487d
\Windows\winsxs\backup\amd64_Microsoft-Windows-
  b..t-Windows.resources_31bf3856ad364e35_
  6.1.7600.16385_de-de_cf8114625afc4538 winload.ex-
  e.mui 3bc5b827
\Windows\winsxs\backup\amd64_Microsoft-Windows-
  b..t-Windows.resources_31bf3856ad364e35_
  6.1.7600.16385_de-de_cf8114625afc4538   winre-
  sume.efi.mui f412814e
\Windows\winsxs\backup\amd64_Microsoft-Windows-
  b..t-Windows.resources_31bf3856ad364e35_
  6.1.7600.16385_de-de_cf8114625afc4538
  winresume.exe.mui_ff8b5358
\Windows\winsxs\backup\amd64_Microsoft-Windows-
  b..vironment-os-loader_31bf3856ad364e35_
  6.1.7601.17514_none_b94cbfa183466a89
  winload.efi_75834aa0
\Windows\winsxs\backup\amd64_Microsoft-Windows-
  b..vironment-os-loader_31bf3856ad364e35_
  6.1.7601.17514_none_b94cbfa183466a89   winload.
  exe_75835076
\Windows\winsxs\backup\amd64_Microsoft-Windows-
  b..vironment-os-loader_31bf3856ad364e35_
  6.1.7601.17514_none_b94cbfa183466a89
  winresume.efi_85cd069f
\Windows\winsxs\backup\amd64_Microsoft-Windows-
  b..vironment-os-loader_31bf3856ad364e35_
  6.1.7601.17514_none_b94cbfa183466a89
  winresume.exe_85cd1215
\Windows\winsxs\manifestcache\ee9f676b8aa4122b_
  blobs.bin
\Windows\winsxs\poqexec.log iv. The LZS100 Algorithm and how it Extends Data Deduplication LZS100 runs on Windows® Server 2012, Windows® Server 2012 R2, and Windows® Server 2016.

Figure 7:
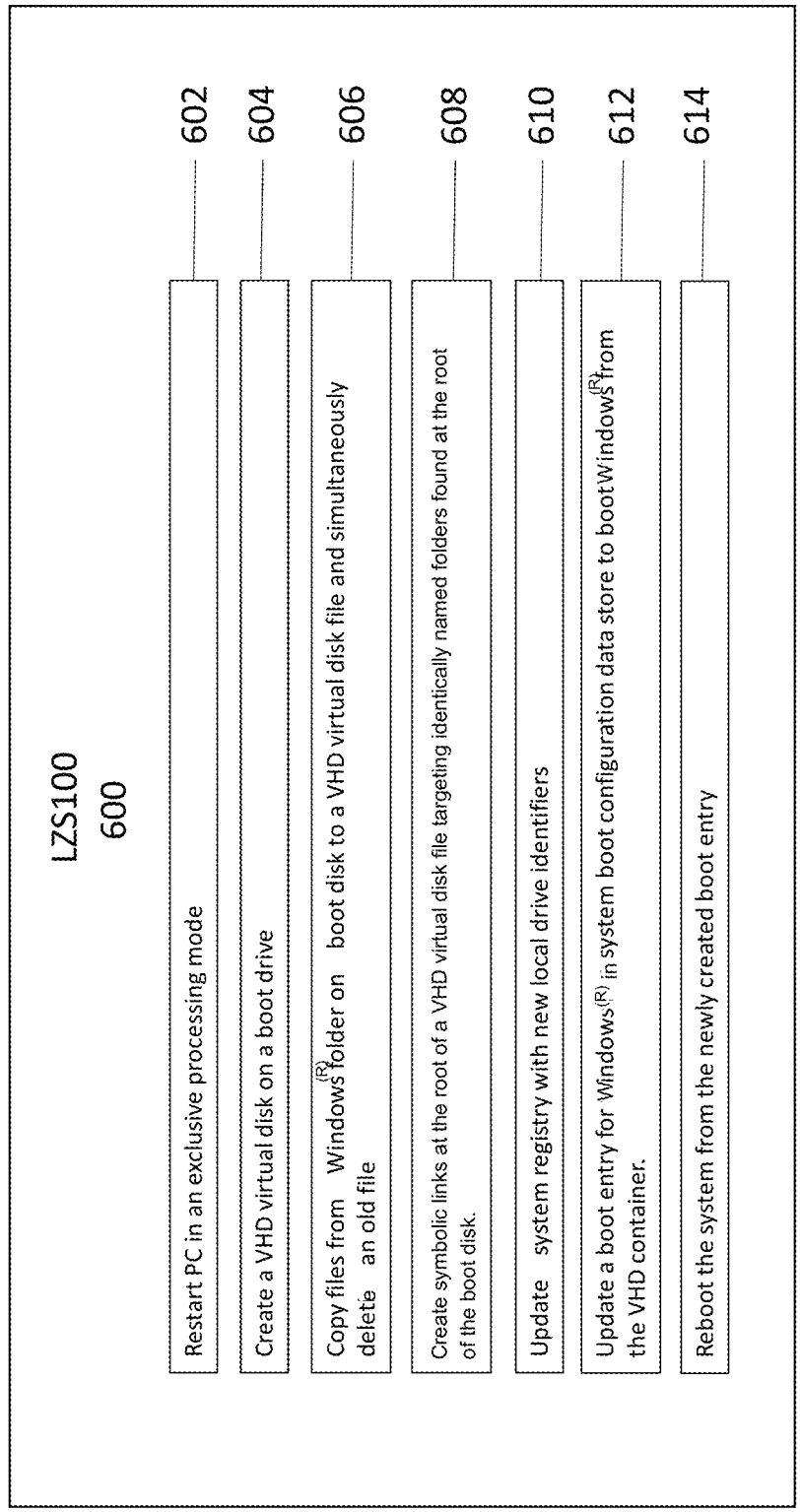
FIG. 7 illustrates a flow diagram of another embodiment of data compression performed by the system disclosed herein when utilizing an operating system from LZS100 runs on Windows® Server 2012, Windows® Server 2012 R2, and Windows® Server 2016.

FIG. 7 illustrates a flow diagram of another embodiment of the data compression method (LZS100 600) performed by the computer system 100 when utilizing an operating system from LZS100 runs on Windows® Server 2012, Windows® Server 2012 R2, and Windows® Server 2016. The LZS100 600 embodiment compresses boot disks through the following method. In step 602, LZS100 600 restarts a PC in exclusive processing mode. In step 604, LZS100 600 creates a virtual hard drive (VHD) or virtual disk on a boot drive and in step 606, files are copied from a Windows® folder on a boot disk to a VHD virtual disk file. As each file is successfully copied, the old file is deleted, which ensures that the disk never runs out of space during processing. In step 608, LZS100 600 creates symbolic links at the root of the VHD virtual disk file targeting identically named folders at the root of the boot disk. In step 610, LZS100 600 updates a system registry with new local drive identifiers. In step 612, LZS100 updates a boot entry for windows in a system boot configuration data store to boot windows from the VHD container. In step 614, LZS100 reboots the system from the newly created boot entry.

LZS100 offers a stand-alone GUI interface to visually manage data deduplication operations.

LZS100 is able to monitor a data deduplicated disk in the background for remaining free disk space. Any time remaining free disk space approaches 1 GB, LZS100 automatically starts a disk cleanup operation and/or a disk recompression operation to ensure free disk space remains above 1 GB. The threshold of disk recompression and or disk cleanup is user customizable.

LZS100 is able to compress boot disks using the following approach:

1. The PC is restarted in exclusive processing mode, similar to how LZS90 compression restarts the PC in exclusive processing mode.
2. Once in exclusive mode, a VHD virtual disk file is created on the boot drive.
3. Files are copied from the "Windows®" folder on the boot disk to the VHD virtual disk file one by one. As each file is successfully copied, the old file is deleted; ensuring the disk never runs out of space during processing.
4. After the "Windows®" folder has been relocated from the boot disk in this manner to the VHD container, for each remaining folder on the boot disk, a symbolic link is created at the root of the VHD container volume, with a name identical to the folder that the link targets on the boot disk. This process ensures that while the VHD container physically contains only the "Windows®" folder, all references to remaining folders on the source boot disk work normally, even when they are being based off of the VHD container.
5. The system registry is updated with new drive identifiers at the location HKEY_LOCAL_MACHINE\SYSTEM\MountedDevices. The values for the \DosDevices\C: and a\DosDevices\Y: entries are swapped, where Y: refers to the old boot drive (host drive for the VHD container), and C: refers to the new VHD virtual disk container. This ensures Windows® boots properly from the new VHD container disk instead of the actual boot disk.
6. The boot entry for Windows® in the system boot configuration data store is updated to boot Windows® from the VHD container as well.
7. Exclusive processing is complete and the system reboots from the newly created boot entry.
8. Once Windows® has finished starting up (this time from the new VHD container), the boot drive is now normally compressed using Windows®'s existing data deduplication application programming interface (API)[[s]]. Since Windows® is now resident in a VHD container, the physical boot drive is no longer recognized as a boot disk by Windows® for purposes of data deduplication and the data deduplication process is not blocked.
9. LZS100 is undoable by reversing the process employed above.
10. As long as LZS100 is active, a file system driver monitors all incoming requests to file move APIs. Where a file move operation would cross the VHD container and the boot disk through the symbolic directory links created above in step #4, the file move operation is aborted and implemented instead as a file copy operation to ensure the logically intended operation succeeds. Without this process, file moves across volumes that are made through file move APIs will fail; causing a substantial number of Windows® Updates and other applications to fail.

III. Disk Capacity and Available Space Projection

Each of the LZSXX algorithms above support disk capacity projection.

These drivers are exposed in a Windows® Service which initiates increased total and available disk capacity projection when started and stops it when the service is stopped.

For example, a compression ratio of 2.4:1 is possible with Windows® 10 64-bit with a clean installation. With increased disk capacity projection, a 60 GB SSD grows to a 144 GB SSD.

The ratio presented is operator customizable in any amount from 1.0:1 (the default uncompressed state of disk) to double the actual compression ratio present on disk. This facilitates the storage of extra data on disk which would otherwise be blocked from storage despite availability of sufficient compressed space.

IV. Disk Acceleration

Judicious application of the proper compression algorithms results in net disk read performance gains, even on very fast solid state (flash memory) based disks, as well as traditional mechanical (spinning platter) hard disk drives.

The listing below describes the proper application of compression algorithms which accelerates disk read speeds by type of the target disk being compressed:

Mechanical (spinning platter) hard disk drives, as well as disk drives in any RAID configuration: The strongest compression grade in LZS90 and LZS85.

SATA 1 connected solid state (flash memory) disks: The second strongest compression grade in LZS90 and LZS85.

SATA 2 connected solid state (flash memory) disks: The medium compression grade in LZS90 and LZS85.

SATA 3 connected solid state (flash memory) disks: The second fastest compression grade in LZS90 and LZS85.

Non-Volatile Memory Express (NVMe) connected solid state (flash memory) disks: The fastest compression grade in LZS90 and LZS85.

Additionally, the automatic folder recompression option in the LZS compression algorithms, as well as the LZS90 background compression agent, may be disabled to ensure that disk write speeds do not suffer a performance penalty. With these measures applied, disk read performance acceleration is observed with the operating system and applications.

LZS80, layered use of LZS80 with LZS85, and LZS100 are not applicable for disk read speed acceleration on any medium as they effectively degrade this read performance. These algorithms are therefore intended for use in disk capacity increase scenarios only.

While the invention has been described in its preferred embodiments, it is to be understood that the words which have been used are words of description rather than of limitation and that changes may be made within the purview of the appended claims without departing from the true scope and spirit of the invention in its broader aspects. Rather, various modifications may be made in the details within the scope and range of equivalents of the claims and without departing from the spirit of the invention. The inventor further requires that the scope accorded the claims be in accordance with the broadest possible construction available under the law as it exists on the date of filing hereof (and of the application from which this application obtains priority, if any) and that no narrowing of the scope of the appended claims be allowed due to subsequent changes in the law, as such a narrowing would constitute an ex post facto adjudication, and a taking without due process or just compensation.

I claim as my invention:

1. A method for compressing computer readable files in a computer system comprising a central processing unit (CPU), a random-access memory (RAM), and a non-transitory storage medium, the method comprising:
   selecting a predefined set of files and directories stored on the storage medium and designating such files and directories as uncompressible;
   performing selected compression on all files and directories on the storage medium that were not designated as uncompressible;
   determining a number of CPU cores present on the system;
   using up to double the number of CPU cores from an equivalent number of threads to perform as many parallel LZNT1 grade compression operations simultaneously as can be accommodated by the storage medium;
   compressing each file at the same grade as LZNT1 compression;
   temporarily taking ownership of and processing files that cannot be opened successfully due to missing privileges; and
   restoring ownership of files that were not opened due to missing privileges.

2. The method of claim 1, wherein the storage medium is a solid state disk, and the method further comprises using double the number of CPU cores from an equivalent number of threads to perform the compression operations.

3. The method of claim 1, further comprising representing the amount of available free space on the storage medium by estimating the effects of the compression method on space available for further storage of data on the storage medium.

4. The method of claim 1, wherein files without an archive attribute are not compressed.

5. The method of claim 1, wherein archive attributes of files that do not create any free space when compressed are cleared.

6. The method of claim 1, wherein files that are already in a compressed state are not recompressed.

7. The method of claim 1, wherein the following files and folders on BIOS/UEFI based installations are not compressed:
   \BOOTNXT;
   \NTDETECT.COM;
   \NTLDR;
   \BOOT.INI;
   \BOOTMGR;
   \BOOT\*;
   \RECOVERY\*;
   \PROGRAMDATA\MICROSO FT\SEARCH\*; and
   \WINLOAD.EXE.

8. A non-transitory computer readable storage medium containing executable computer program instructions which when executed cause a system to perform the method of claim 1.

9. A method for compressing computer readable files in a computer system comprising a central processing unit (CPU), a random access memory (RAM), and a non-transitory storage medium, the method comprising:
   selecting a predefined set of files and directories stored on the storage medium and designating such files and directories as uncompressible;
   performing selected compression on all files and directories on the storage medium that were not designated as uncompressible;
   determining a number of CPU cores present on the system;
   using one or more CPU cores during the compression process;
   adjusting a compression grade to one of five possible compression grades for any particular file;
   compressing each file at the same grade as the one of the five possible compression grades to which compression was adjusted;
   not compressing files which do not have an archive attribute;
   clearing an archive attribute on incompressible files;
   not compressing BIOS/UEFI based installation folders and files;
   temporarily taking ownership of and processing files that cannot be opened successfully due to missing privileges; and
   restoring ownership of files that were not opened due to missing privileges.

10. The method of claim 9, wherein the storage medium is a solid state disk, and the method further comprises using double the number of CPU cores from an equivalent number of threads to perform the compression operations.

11. The method of claim 9, further comprising not compressing WIMBoot compressed files.

12. The method of claim 9, further comprising not compressing files already in a compressed state and that have an existing compression grade identical to a newly requested compression grade.

13. The method of claim 9, wherein the BIOS/UEFI based installation folders and files that are not compressed, comprise:
   \BOOTNXT
   \NTDETECT.COM
   \NTLDR
   \BOOT.INI
   \BOOTMGR
   \BOOT\*
   \RECOVERY\*
   \PROGRAMDATA\MICROSO FT\SEARCH\*
   \WINLOAD.EXE.

14. The method of claim 9, further comprising automatically compressing new files created in folders or in new subfolders.

15. A non-transitory computer readable storage medium containing executable computer program instructions which when executed cause a system to perform the method of claim 9.

16. A method for compressing computer readable files in a computer system comprising a central processing unit (CPU), a random-access memory (RAM), and a non-transitory storage medium, the method comprising:

selecting a predefined set of files and directories stored on the non-transitory storage medium and designating such files and directories as uncompressible;
performing compression, using a selected compression grade, on the files and directories on the non-transitory storage medium that were not designated as uncompressible;
accessing a default WINDOWS RE instance;
creating a copy of the default WINDOWS RE instance;
injecting new program files and libraries into the default WINDOWS RE instance;
injecting computer code for the method into a personal computer boot menu;
taking full control over a host operating system;
executing a pattern, the pattern comprising:
obtaining a parameter of an existing RAMDisk for a built-in personal computer boot entry to enter a WINDOWS Recovery environment;
filtering out any temporary entries pointing to partitions that no longer exist on the RAMDisk;
duplicating a main boot entry for a live operating system;
adjusting a RAMDisk parameter of the duplicated main boot entry to point to a detected RAMDisk;
adjusting a boot image parameter of the duplicated main boot entry to point to a custom modified WINDOWS RE instance with the injected program files and libraries; and
building a WIM archive.

17. The method of claim 16, further comprising:
determining whether the default WINDOWS RE instance contains a set of necessary system drivers and injecting the set of necessary system drivers and a set of necessary registry keys into the default WINDOWS RE instances that do not contain the set of necessary system drivers; and
injecting an additional driver file onto WINDOWS 7 computers, the additional driver file further comprising: \Windows\system32\drivers\wofadk.sys.

18. The method of claim 16, wherein necessary drivers comprise:
\Windows\system32\wimbootcompress.ini;
\Windows\system32\wimgapi.dll;
\Windows\system32\wimserv.exe;
\Windows\system32\drivers\wimmount.sys;
\Windows\system32\drivers\wof.sys;
\Windows\system32\woftasks.dll;
\Windows\system32\wofutil.dll.

19. The method of claim 16, further comprising injecting multiple copies of a set of driver files comprising:
\Windows\system32\wof.sys.mui
\Windows\system32\woftasks.dll.mui
\Windows\system32\wow.sys.mui
\Windows\system32\wimgapi.dll.mui; and
not injecting a set of injections for Windows 10 systems, the set of injections not being injected comprising:
\Windows\system32\fmifs.dll
\Windows\system32\untsfs.dll\Windows\system32\ufat.dll
\Windows\system32\uexfat.dll\Windows\system32\urefs.dll; and
\Windows\system32\ulib.dll\Windows\system32\ ifsutil.dll.

20. The method of claim 16, further comprising:
applying a built or rebuilt WIM file to the files on the storage medium;
removing a temporary boot menu entry created by computer code of the method;
restarting the computer system;
detecting OEM-preinstalled WIMBoot partitions;
deleting OEM-preinstalled WIMBoot partitions by:
relocating a WINDOWS Recovery environment contained inside the OEM-preinstalled WIMBoot partitions back to a main operating system partition;
de-registering an unneeded WIMBoot partition as a WINDOWS recovery environment provider;
registering a new copy of the WINDOWS Recovery environment as a default WINDOWS Recovery environment provider;
deleting the de-registered WIMBoot partition; and
extending the main operating system partition to contain space from the deleted de-registered WIMBoot partition.

21. The method of claim 16, further comprising:
providing an undo disk to permit recovery of data;
building a WIM archive on the undo disk; and
leaving original applications and data intact on the storage medium until a WIM archive has been successfully created on the undo disk.

22. A non-transitory computer readable storage medium containing executable computer program instructions which when executed cause a system to perform the method of claim 16.

23. A method for compressing computer readable files in a computer system comprising a central processing unit (CPU), a random-access memory (RAM), and a non-transitory storage medium, the method comprising:
selecting a predefined set of files and directories stored on the non-transitory storage medium and designating such files and directories as uncompressible;
performing selected compression on all files and directories on the non-transitory storage medium that were not designated as uncompressible;
restarting the computer system in an exclusive processing mode;
creating a virtual hard disk virtual disk file on a boot drive;
copying files from a WINDOWS folder on a boot disk to the VHD virtual disk file;
creating symbolic links at a root of the VHD virtual disk file targeting identically named folders at a root of the boot disk;
updating a registry of the computer system with new local drive identifiers;
updating a boot entry for WINDOWS in a system boot configuration data store to boot WINDOWS from the VHD virtual disk file; and
rebooting the computer system from the updated boot entry.

24. The method of claim 23, further comprising simultaneously deleting an old file while copying files from the WINDOWS folder on a boot disk to the VHD virtual disk file.

25. The method of claim 23, wherein WINDOWS is resident in a VHD container, a physical boot drive is not recognized as a boot disk by WINDOWS for purposes of data deduplication, and a data deduplication process is not blocked.

26. A non-transitory computer readable storage medium containing executable computer program instructions which when executed cause a system to perform the method of claim 23.

* * * * *